United States Patent
Kim et al.

(10) Patent No.: US 8,884,340 B2
(45) Date of Patent: Nov. 11, 2014

(54) SEMICONDUCTOR DEVICES INCLUDING DUAL GATE ELECTRODE STRUCTURES AND RELATED METHODS

(75) Inventors: Ji-Young Kim, Yongin-si (KR);
Gyo-Young Jin, Seoul (KR);
Hyeong-Sun Hong, Seongnam-si (KR);
Yong-Chul Oh, Suwon-si (KR);
Yoo-Sang Hwang, Suwon-si (KR);
Sung-Kwan Choi, Hwaseong-si (KR);
Dong-Soo Woo, Seoul (KR); Hyun-Woo Chung, Seoul (KR)

(73) Assignee: Samsung Electronics Co., Ltd. (KR)

( * ) Notice: Subject to any disclaimer, the term of this patent is extended or adjusted under 35 U.S.C. 154(b) by 421 days.

(21) Appl. No.: 13/298,644

(22) Filed: Nov. 17, 2011

(65) Prior Publication Data

US 2012/0299090 A1    Nov. 29, 2012

Related U.S. Application Data

(60) Provisional application No. 61/489,852, filed on May 25, 2011.

(30) Foreign Application Priority Data

Jun. 21, 2011  (KR) .................. 10-2011-0060290

(51) Int. Cl.
*H01L 21/336* (2006.01)
*H01L 29/772* (2006.01)
(Continued)

(52) U.S. Cl.
CPC ........ *H01L 27/10891* (2013.01); *G11C 11/404* (2013.01); *H01L 27/10876* (2013.01); *H01L 29/66666* (2013.01); *H01L 27/10873* (2013.01); *H01L 29/7827* (2013.01); *H01L 27/10894* (2013.01); *H01L 29/66484* (2013.01); *H01L 29/7831* (2013.01); *G11C 11/4085* (2013.01); *H01L 29/41741* (2013.01); *H01L 21/823437* (2013.01); *H01L 29/4236* (2013.01)

USPC .......................................... 257/270

(58) Field of Classification Search
USPC .......................................... 257/270
See application file for complete search history.

(56) References Cited

U.S. PATENT DOCUMENTS 3,621,342 A * 11/1971 Susumu Yoshimura
et al. ............................. 361/525
5,005,107 A * 4/1991 Kobashi et al. ............... 361/540
(Continued)

FOREIGN PATENT DOCUMENTS

JP  2006-202931  8/2006
JP  2006-210535  8/2006
(Continued)

OTHER PUBLICATIONS

S. M. Sze, "VLSI Techonology", Chapter 8, Second Edition, McGraw-Hill Book Company, pp. 327-341, 1988.

*Primary Examiner* — Evan Pert
(74) *Attorney, Agent, or Firm* — Myers Bigel Sibley & Sajovec, P.A.

(57) ABSTRACT

A semiconductor device may include a semiconductor substrate with first and second spaced apart source/drain regions defining a channel region therebetween and a control gate structure on the channel region between the first and second spaced apart source/drain regions. More particularly, the control gate structure may include a first gate electrode on the channel region adjacent the first source/drain region, and a second gate electrode on the channel region adjacent the second source/drain region. Moreover, the first and second gate electrodes may be electrically isolated. Related devices, structures, methods of operation, and methods of fabrication are also discussed.

19 Claims, 77 Drawing Sheets

(51) Int. Cl.
*G11C 11/404* (2006.01)
*H01L 27/108* (2006.01)
*H01L 29/66* (2006.01)
*H01L 29/78* (2006.01)
*G11C 11/408* (2006.01)
*H01L 29/417* (2006.01)
*H01L 29/423* (2006.01)
*H01L 21/8234* (2006.01)

(56) References Cited

U.S. PATENT DOCUMENTS

| | | | | |
|---|---|---|---|---|
| 5,257,095 A | * | 10/1993 | Liu et al. | 257/315 |
| 5,586,000 A | * | 12/1996 | Sakata et al. | 361/525 |
| 6,011,014 A | * | 1/2000 | Andersen et al. | 514/17.9 |
| 6,265,374 B1 | * | 7/2001 | Andersen et al. | 514/1.3 |
| 6,473,293 B2 | * | 10/2002 | Shimada et al. | 361/523 |
| 6,894,890 B2 | * | 5/2005 | Takatani et al. | 361/532 |
| 7,560,359 B2 | | 7/2009 | Park | |
| 7,679,136 B2 | | 3/2010 | Kachi et al. | |
| 7,760,489 B2 | * | 7/2010 | Fujita et al. | 361/528 |
| 7,773,366 B2 | * | 8/2010 | Nemoto et al. | 361/523 |
| 7,800,887 B2 | * | 9/2010 | Iida et al. | 361/525 |
| 7,821,772 B2 | * | 10/2010 | Kobayashi et al. | 361/525 |
| 7,855,869 B2 | * | 12/2010 | Nishimura et al. | 361/523 |
| 8,035,953 B2 | * | 10/2011 | Nemoto et al. | 361/532 |
| 2008/0138953 A1 | * | 6/2008 | Challa et al. | 438/270 |
| 2009/0072289 A1 | | 3/2009 | Kim et al. | |
| 2010/0327337 A1 | | 12/2010 | Yang | |

FOREIGN PATENT DOCUMENTS

| | | |
|---|---|---|
| KR | 1020070014428 | 2/2007 |
| KR | 1020110001261 | 1/2011 |

* cited by examiner

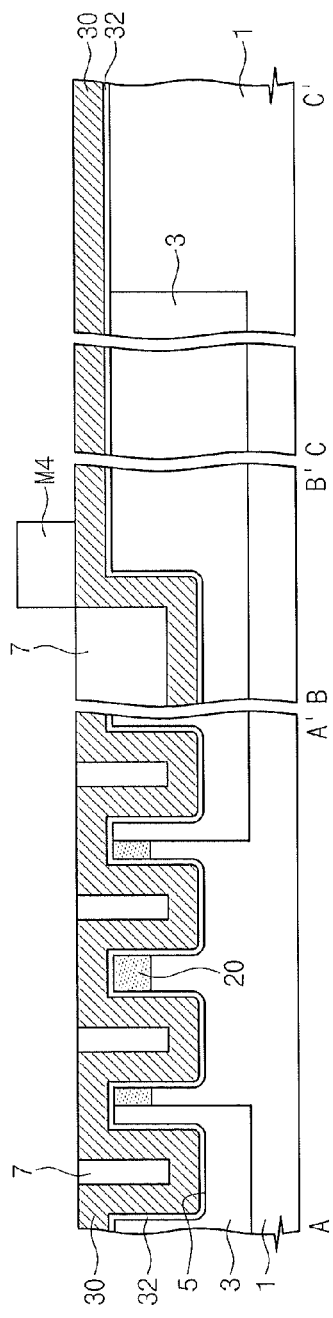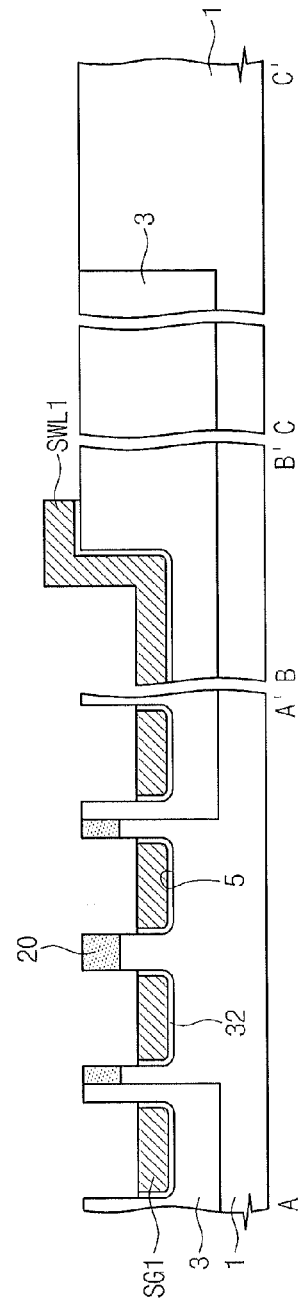

SEMICONDUCTOR DEVICES INCLUDING DUAL GATE ELECTRODE STRUCTURES AND RELATED METHODS

RELATED APPLICATIONS

This application claims the benefit of priority to U.S. Provisional Application No. 61/489,852 filed May 25, 2011, and the benefit of priority to Korean Application No. 10-2011-0060290 filed Jun. 21, 2011. The disclosures of both of the above referenced applications are hereby incorporated herein in their entireties by reference.

BACKGROUND

Inventive concepts described herein are directed to semiconductor devices and methods of forming the same.

Semiconductor devices are attractive in the electronic industry because of their characteristics allowing miniaturization, multi-functionality and/or cost reduction. The integration of semiconductor devices tends to increase with advances in the electronic industry. Pattern widths of semiconductor devices continue to decrease to provide higher integration of semiconductor devices. However, since reduced pattern widths may require novel and/or high-cost exposure technologies, it may be difficult to achieve higher integrations of semiconductor devices.

SUMMARY

In some aspects of present inventive concepts, a semiconductor device may include a gate electrode disposed on a substrate and first and second impurity-implanted regions of the substrate adjacent opposite sides of the gate electrode. A channel region may be provided between the first and second impurity-implanted regions. The gate electrode may include a first sub-gate electrode adjacent the first impurity-implanted region and a second sub-gate electrode adjacent the second impurity-implanted region. The first sub-gate electrode and the second sub-gate electrode may be provided on the channel region.

According to an example embodiment, the first sub-gate electrode and the second sub-gate electrode may be provided in parallel on a surface of the substrate. The first sub-gate electrode and the second sub-gate electrode may extend and cross over the substrate to provide a first sub-wordline and a second sub-wordline, respectively. Widths of the ends of the first and second sub-wordlines may be greater than widths of the first and second sub-gate electrodes.

According to another example embodiment, the first sub-gate electrode may be disposed in the substrate, and the second sub-gate electrode may be disposed on the first sub-gate electrode in the substrate.

The first and second impurity-implanted regions may extend into the substrate from a surface of the substrate. In this case, a bottom surface of the second impurity-implanted region may be higher than that of the second sub-gate electrode, and a bottom surface of the first impurity-implanted region may be lower than a top surface of the first sub-gate electrode.

At least one of the first and/or second impurity-implanted regions may have a width in the range of about 5 nanometers to 20 nanometers.

The semiconductor device may further include first and second conductive pads which are respectively in contact with the first and second impurity-implanted regions on the substrate. Each of the first and second conductive pads may have a greater width than at least one of the first and second impurity-implanted regions.

Alternatively, the second impurity-implanted region may be disposed adjacent to a surface of the substrate, and the first impurity-implanted region may be disposed at a position lower than a top surface of the first sub-gate electrode.

The semiconductor device may further include a bitline disposed on the substrate and electrically connected to the first impurity-implanted region. A bitline contact may be provided in contact with the bitline and the impurity-implanted region through the substrate and may be insulated from the gate electrode.

The substrate may include a cell array region and a peripheral circuit region. In this case, the semiconductor device may further include a peripheral circuit gate electrode disposed in the peripheral circuit region. The peripheral circuit gate electrode may include the same material as the bitline.

The semiconductor device may further include a bitline that is in contact with the first impurity-implanted region in the substrate.

The first sub-gate electrode and the second sub-gate electrode may extend and cross the inside of the substrate to provide a first sub-wordline and a second sub-wordline, respectively. A sidewall of the end of the first sub-wordline may not vertically overlap a sidewall of the end of the second sub-wordline.

The ends of the first and second sub-wordlines may each have an L-shape, and a top surface of the end of the first sub-wordline may be coplanar with a top surface the second sub-wordline.

Alternatively, the ends of the first and second sub-wordlines may extend onto the substrate to reciprocally form a step shape.

The first and second sub-gate electrodes may each have a semicircular section.

The semiconductor device may further include a data storage element disposed on the second impurity-implanted region and electrically connected to the second impurity-implanted region. The semiconductor device may be a dynamic random access memory (DRAM), and the data storage element may be a capacitor. Different voltages may be applied to the first and second sub-gates while retaining data stored in the capacitor (in a standby mode). The voltage applied to the first sub-gate may be lower than that applied to the second sub-gate. More specifically, the voltage applied to the first sub-gate may be less than 0 volt, and the voltage applied to the second sub-gate may be greater than 0 volt.

According to some embodiments, the semiconductor device may further include a first gate insulator between the first sub-gate electrode and the substrate and a second gate insulator between the second sub-gate electrode and the substrate. In this case, the second gate insulator and/or the first gate insulator may extend between the first and second sub-gate electrodes.

According to other embodiments, the semiconductor device may further include a first gate insulator between the first sub-gate electrode and the substrate. The first gate insulator may extend between the second sub-gate electrode and the substrate and between the first and second sub-gate electrodes.

In other aspects of present inventive concepts, the method may include forming first and second sub-gates on a substrate and electrically isolated from each other. A first impurity-implanted region may be formed on the substrate adjacent to the first sub-gate and a second impurity-implanted region may be formed on the substrate adjacent to the second sub-gate.

According to some embodiments, a semiconductor device may include a semiconductor substrate with first and second spaced apart source/drain regions defining a channel region therebetween and a control gate structure on the channel region between the first and second spaced apart source/drain regions. More particularly, the control gate structure may include a first gate electrode on the channel region adjacent the first source/drain region, and a second gate electrode on the channel region adjacent the second source/drain region. Moreover, the first and second gate electrodes may be electrically isolated.

According to some other embodiments, a semiconductor memory device may include a semiconductor substrate including first and second spaced apart source/drain regions defining a channel region therebetween, a control gate structure on the channel region, and a memory storage capacitor electrically coupled to the second source/drain region. Operation of this memory device may include applying a write/read-enable voltage to the control gate structure across the channel region to allow electrical current flow through the channel region between the first and second source/drain regions. While applying the write/read-enable voltage, a write signal may be applied through the first source/drain region, the channel region, and the second source/drain region to the memory storage capacitor to charge/discharge the memory storage capacitor thereby writing a memory value to the memory storage capacitor. After applying the write signal, different first and second stand-by voltages may be applied to different portions of the control gate structure adjacent the channel region to maintain the memory value of the memory storage capacitor.

According to still other embodiments, a semiconductor memory device may include a semiconductor substrate with first and second spaced apart source/drain regions defining a channel region therebetween. A control gate structure may be on the channel region between the first and second spaced apart source/drain regions, a memory storage capacitor may be electrically coupled to the second source/drain region, and a controller may be coupled to the first source/drain region and the first and second source/drain regions. The controller may be configured to apply a write/read-enable voltage to the control gate structure across the channel region to allow electrical current flow through the channel region between the first and second source/drain regions. The controller may also be configured to apply a write signal through the first source/drain region, the channel region, and the second source/drain region to the memory storage capacitor to charge/discharge the memory storage capacitor thereby writing a memory value to the memory storage capacitor while applying the write/read-enable voltage. The controller may be still further configured to apply different first and second stand-by voltages to different portions of the control gate structure adjacent the channel region to maintain the memory value of the memory storage capacitor after applying the write signal.

According to further embodiments, a method of forming a semiconductor device may include forming first and second spaced apart source/drain regions in a semiconductor substrate defining a channel region in the semiconductor substrate between the first and second source/drain regions. A control gate structure may be formed on the channel region between the first and second spaced apart source/drain regions. The control gate structure may include a first gate electrode on the channel region adjacent the first source/drain region, and a second gate electrode on the channel region adjacent the second source/drain region, with the first and second gate electrodes being electrically isolated.

According to still further embodiments, a semiconductor device may include a semiconductor substrate including first and second spaced apart source/drain regions defining a channel region therebetween, with a surface of the substrate including the channel region being substantially planar. A control gate structure may be on the channel region between the first and second spaced apart source/drain regions, and the control gate structure may include a first gate electrode on the channel region adjacent the first source/drain region, and a second gate electrode on the channel region adjacent the second source/drain region. Moreover, the first and second gate electrodes may be electrically isolated.

According to yet further embodiments, a semiconductor device may include a semiconductor substrate with a trench therein and with first and second source/drain regions on opposite sides of the trench defining a channel region through portions of the semiconductor substrate adjacent the trench between the first and second source/drain regions. A control gate structure may be in the trench, with the control gate structure including first and second gate electrodes on the channel region in the trench. The second gate electrode may be between the first gate electrode and the surface of the substrate, with the first and second gate electrodes being electrically isolated.

According to more embodiments, a semiconductor device may include a semiconductor substrate with a trench having first and second sidewalls therein, with a first source/drain region at the surface of the semiconductor substrate adjacent the first sidewall of the trench, and with a second source/drain regions adjacent a bottom of the trench. A channel region may be defined between the first and second source/drain regions along the first sidewall. A control gate structure may be in the trench on the channel region between the first and second source/drain regions, with the control gate structure including a first gate electrode on the channel region adjacent the first source/drain region, and a second gate electrode on the channel region adjacent the second source/drain region. Moreover, the first and second gate electrodes may be electrically isolated.

According to still more embodiments, a semiconductor device may include a semiconductor substrate with first and second spaced apart source/drain regions defining a first channel region therebetween and with third and fourth spaced apart source/drain regions defining a second channel region therebetween. A first control gate structure may be on the first channel region between the first and second spaced apart source/drain regions, with the first control gate structure including a first gate electrode on the first channel region adjacent the first source/drain region, and a second gate electrode on the first channel region adjacent the second source/drain region. Moreover, the first and second gate electrodes may be electrically isolated. In addition, a second control gate structure may be on the second channel region between the third and fourth spaced apart source/drain regions, with the second control gate structure including a continuous gate electrode on the second channel region extending between the third and fourth source/drain regions.

According to yet more embodiments, a semiconductor device may include first and second word lines configured to control a common channel region.

BRIEF DESCRIPTION OF THE DRAWINGS

Present inventive concepts will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of inventive concepts.

FIGS. 26 to 31 are cross-sectional views illustrating operations of fabricating a semiconductor device having a cross section shown in FIG. 23.

DETAILED DESCRIPTION

Figure 1:
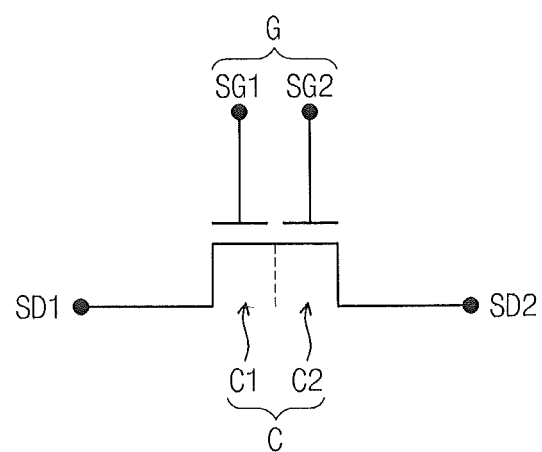
FIG. 1 is a circuit diagram of a semiconductor device according to some inventive concepts.

Advantages and/or features of inventive concepts and methods of achieving these advantages and/or features will be apparent from the following embodiments that will be described in more detail with reference to the accompanying drawings. It should be noted, however, that inventive concepts are not limited to the following examples of embodiments, and may be implemented in various forms. Accordingly, these embodiments are provided only to disclose examples of inventive concepts and to let those skilled in the art understand the nature of inventive concepts.

In the specification, it will be understood that when an element is referred to as being "on" another layer or substrate, it can be directly on the other element, or intervening elements may also be present. Further, it will be understood that when a gate electrode is referred to as being on a channel region, it can be on or beside the channel region. In the drawings, thicknesses of elements are exaggerated for clarity of illustration. The terminology used herein is for the purpose of describing particular embodiments only and is not intended to be limiting of this disclosure. As used herein, the singular forms "a", "an" and "the" are intended to include the plural forms as well, unless the context clearly indicates otherwise. Furthermore, the use of the terms a, an, etc. does not denote a limitation of quantity, but rather denotes the presence of at least one of the referenced items. The use of the terms "first", "second", and the like does not imply any particular order. These terms are instead included to identify individual elements. Moreover, the use of the terms first, second, etc. does not denote any order or importance, but rather these terms first, second, etc. are used to distinguish one element from another. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. In the drawings, like reference numerals in the drawings denote like elements. The shape, size and regions, and the like, of the drawing may be exaggerated for clarity.

FIG. 1 is a circuit diagram of a semiconductor device according to some inventive concepts.

Referring to FIG. 1, a transistor included in/on a semiconductor device may include a gate G controlling a channel region C formed between a first source/drain SD1 and a second source/drain SD2. The gate G includes a first sub-gate SG1 and a second sub-gate SG2. The channel region C includes a first channel region C1 adjacent to the first sub-gate SG1 and a second channel region C2 adjacent to the second sub-gate SG2. The first sub-gate SG1 is adjacent to the first source/drain SD1, and the second sub-gate SG2 is adjacent to the second source/drain SD2. The first channel region C1 may be controlled by a voltage applied to the first sub-gate SG1, and the second channel region C2 may be controlled by a voltage applied to the second sub-gate SG2. Charge migration between the first source/drain SD1 and the second source/drain SD2 may occur from the first channel region C1 to the second channel region C2 and vice versa. The voltage applied to the first sub-gate SG1 and the voltage applied to the second sub-gate SG2 may be independently controlled to reduce leakage current that may be generated at the first source/drain SD1 and the second source/drain SD2 by the sub-gates SG1 and SG2. In addition, subthreshold characteristics of the transistor may be improved. A transistor having the structure of FIG. 1 may be designed to reduce a threshold voltage. Thus, on-current may increase.

A transistor having structure in FIG. 1 may be applied to various semiconductor devices. For example, the transistor may be used as a MOS transistor in a cell array region and/or a peripheral circuit region of a DRAM (Dynamic Random Access Memory) or an SRAM. (Static Random Access Memory). Alternatively, the transistor may be used as a selection transistor (such as a string selection transistor or a ground selection transistors) in a nonvolatile memory device.

As a detailed example, a transistor having the circuit structure shown in FIG. 1 may act as an AND gate in a logic circuit. Table 1 below is a logical table of a transistor including the sub-gates SG1 and SG2.

TABLE 1

|  |  | SG1 | |
|---|---|---|---|
| Logical Value | | ON | OFF |
| SG2 | ON | ON | OFF |
| | OFF | OFF | OFF |

As shown in the Table 1, the entire gate G is turned on when the sub-gates SG1 and SG2 are both in an "ON" state. On the other hand, the entire gate G is turned off when at least one of the sub-gates SG1 and SG2 is in an "OFF" state.

Examples of implementing a transistor having the circuit structure in FIG. 1 will now be described below.

Figure 2:
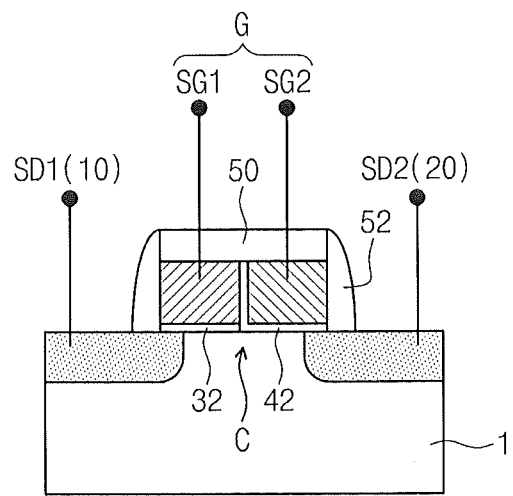
FIG. 2 is a cross-sectional view of a semiconductor device according to an example of inventive concepts.

FIG. 2 is a cross-sectional view of a semiconductor device according to an example of inventive concepts.

Referring to FIG. 2, a gate G is disposed on a substrate 1. The substrate 1 may include a semiconductor material. The substrate 1 may include, for example, single-crystalline silicon. A first impurity-implanted region 10 and a second impurity-implanted region 20 are formed in the substrate 1 adjacent opposite sides of the gate G. The first impurity-implanted region 10 and the second impurity-implanted region 20 may correspond to the first source/drain region SD1 and the second source/drain region SD2 shown in FIG. 1, respectively. The gate G may include a first sub-gate pattern SG1 and a second sub-gate pattern SG2. The first sub-gate pattern SG1 is adjacent the first impurity-implanted region 10, and the second sub-gate pattern SG2 is adjacent the second impurity-implanted region 20. The first and second sub-gate patterns SG1 and SG2 are disposed on a channel region between the first and second impurity-implanted regions 10 and 20. The first impurity-implanted region 10 may extend to a lower portion of the first sub-gate pattern SG1, but does not reach a lower portion of the second sub-gate pattern SG2. That is, the first impurity-implanted region 10 does not vertically overlap the second sub-gate pattern SG2. The second impurity-implanted region 20 may extend to lower portion of the second sub-gate pattern SG2, but does not reach the lower portion of the first sub-gate pattern SG1. That is, the second gate impurity-implanted region 20 does not vertically overlap the first sub-gate pattern SG1.

The first sub-gate SG1 and the second sub-gate SG2 may each include at least one selected from the group consisting of a doped semiconductor material (e.g., doped silicon, doped germanium, etc.), a conducive metal nitride (e.g., titanium nitride, tantalum nitride, etc.), a metal (e.g., tungsten, titanium, tantalum, etc.), and/or a metal-semiconductor compound (e.g., tungsten silicide, cobalt silicide, titanium silicide, etc.).

A first gate insulator 32 is between the first sub-gate pattern SG1 and the substrate 1, and a second gate insulator 42 is between the gate sub-gate pattern SG2 and the substrate 1. The second gate insulator 42 also extends between the first sub-gate pattern SG1 and the second sub-gate pattern SG2. Although it is shown in FIG. 2 that the second gate insulator 42 extends between the first sub-gate pattern SG1 and the second sub-gate pattern SG2, instead of the second gate insulator 42, the first gate insulator 32 may extend between the first sub-gate pattern SG1 and the second sub-gate pattern SG2. The gate insulators 32 and 42 may be/include a layer of one selected from the group consisting of silicon oxide, silicon nitride, and/or a high-k dielectric material. If at least one of the first and second sub-gate patterns SG1 and SG2 includes a metal-containing material, a gate insulator between the sub-gate pattern(s) and the substrate 1 may be/include a layer of a high-k dielectric material.

A capping pattern 50 is disposed on the first sub-gate pattern SG1 and the second sub-gate pattern SG2. A side surface of the first sub-gate pattern SG1 and a side surface of the second sub-gate pattern SG2 may/be covered with an insulating spacer 52. The capping pattern 50 may include silicon nitride, silicon oxide, and/or silicon oxynitride.

A configuration in which a transistor having the circuit structure in FIG. 1 may be disposed on a substrate 1 has been described with reference to FIG. 2. Now, a configuration in which a transistor having the circuit structure in FIG. 1 is disposed in a substrate 1 will be described below in detail.

Figure 3A:
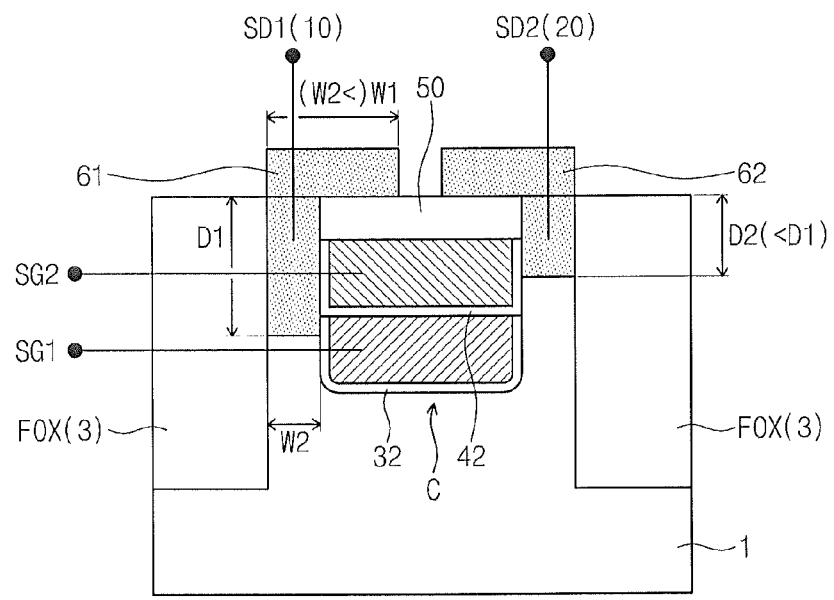
FIG. 3A is a cross-sectional view of a semiconductor device according to other examples of inventive concepts.

FIG. 3A is a cross-sectional view of a semiconductor device according to another example of inventive concepts.

Referring to FIG. 3A, an isolation layer (e.g., a shallow trench isolation or STI layer) 3 is disposed on a substrate 1 as a field oxide (FOX) to define an active region. In the substrate 1, a first sub-gate pattern SG1 and a second sub-gate pattern SG2 may be provided in a trench in the active region spaced apart from the isolation layer 3. The substrate 1 may be doped with, for example, P-type impurities. The first sub-gate pattern SG1 is disposed below the second sub-gate pattern SG2. A capping pattern 50 is disposed on the second sub-gate pattern SG2. The capping pattern 50 may have a top surface that is coplanar with respect to a top surface of the substrate 1. A first gate insulator 32 is interposed between a side surface of the first sub-gate pattern SG1 and the substrate 1 and between a bottom surface of the first sub-gate pattern SG1 and the substrate 1. A second gate insulator 42 is interposed between a side surface of the second sub-gate pattern SG2 and the substrate 1 and between the first sub-gate pattern SG1 and the second sub-gate pattern SG2. A first impurity-implanted region 10 and a second impurity-implanted region 20 are formed in the substrate 1 adjacent opposite sides of the first sub-gate pattern SG1. The first impurity-implanted region 10 and the second impurity-implanted region 20 may be doped with, for example, N-type impurities. At least one of the first and second impurity-implanted regions 10 and 20 may have a width in the range of about 5 to about 20 nanometers (nm).

A depth of the first impurity-implanted region 10 may be different than that of the second impurity-implanted region 20. The first impurity-implanted region 10 may extend to a depth D2 greater than a depth of a top surface of the first sub-gate pattern SG1. A depth D2 of the second impurity-implanted region 20 may be less than a depth D1 of the first impurity-implanted region 10. A bottom surface of the second impurity-implanted region 20 may be higher than a bottom surface of the second sub-gate pattern SG2. A channel region between the first and second impurity-implanted regions 10 and 20 may have a U-shape.

A first pad 61 and a second pad 62 are spaced apart on the substrate 1. The first pad 61 is in contact with the first impurity-implanted region 10, and the second pad 62 is in contact with the second impurity-implanted region 20. For example, the first pad 61 and the second pad 62 may be formed by doping a polysilicon layer with the same N-type impurities as the first and second impurity-implanted regions 10 and 20. Alternatively, the first and second pads 61 and 62 may each be/include a conductive layer. A width W1 of each of the first and second pads 61 and 62 may be greater than a width W2 of at least one of the first and second impurity-implanted regions 10 and 20.

The semiconductor device in FIG. 3A has a gate structure buried in the substrate 1.

In the semiconductor device in FIG. 3A, leakage current generated by a gate-induced drain leakage (GIDL) phenomenon may be reduced by applying different voltages to the first sub-gate SG1 and the second sub-gate SG2. Additionally, the semiconductor device may be designed to drop a threshold voltage of the transistor including the sub-gates SG1 and SG2. Thus, on-current may increase during operation of the semiconductor device. This will now be described in greater detail below.

A typical recessed channel array transistor (RCAT) or buried channel array transistor (BCAT) has a structure where at least a portion of one gate is buried in a substrate. This structure may be similar to a structure where, in FIG. 3A, the first sub-gate SG1 and the second sub-gate SG2 are connected to each other without the gate insulator 42 interposed therebetween. In this structure, a source and a drain may be disposed on a surface of a substrate. Thus, a source/drain and the gate may horizontally overlap each other in the substrate. As a horizontal overlap area of a source/drain and a gate increases, a probability that leakage current is generated by a GIDL phenomenon may also increase. The GIDL phenomenon may occur more easily when there is a great difference between a voltage applied to the gate adjacent to the source/drain and a voltage applied to the source/drain. For example, when a first voltage V1 is applied to the source/drain and a second voltage V2 is applied to the gate, a difference between voltages at the source/drain and the gate is V2−V1.

However, as shown in FIG. 3A, a gate may be divided into a first sub-gate SG1 and a second sub-gate SG2. For example, when a first voltage V1 is applied to the second impurity-implanted region 20 and a second voltage V2 is applied to the first impurity-implanted region 10, a voltage between the first voltage V1 and the second voltage V2 may be applied to the second sub-gate SG2 adjacent to the second impurity-implanted region 20. When a voltage of (V2+V1)/2 is applied to the second sub-gate SG2, a difference between voltages at the second sub-gate SG2 and the second impurity-implanted region 20 is (V2−V1)/2. That is, the voltage difference (V2−V1)/2 is smaller than that in a structure of one gate electrode (hereinafter referred to as "one-gate-electrode-structure"). Thus, occurrence of the GIDL phenomenon may be reduced.

In a BCAT structure, one gate electrode is buried in a substrate. If a gate electrode is buried in the substrate to be spaced apart from a source/drain so as to reduce only occurrence of the GIDL phenomenon, an influence on an electric field by a gate is reduced to increase source/drain resistance. However, since the second sub-gate SG2 horizontally overlaps the second impurity-implanted region 20 in the structure in FIG. 3A, an increase of source/drain resistance may be reduced.

The structure in FIG. 3A may be designed to drop a threshold voltage. As the threshold voltage drops, on-current may increase during operation. When the threshold voltage drops, a probability of leakage current generation may increase. However, as set forth above, different voltages are applied to the sub-gates SG1 and SG2 to reduce generation of leakage current. Thus, on-current may increase during operation due to the design to drop the threshold voltage while reducing generation of leakage current.

Even in a typical BCAT structure, a critical dimension (CD) of a gate may decrease with increase in integration density to degrade characteristics of a transistor and increase a threshold voltage distribution. However, according to some embodiments of inventive concepts, a channel may be relatively lengthened by increasing widths of sub-gates and decreasing widths of the impurity-implanted regions 10 and 20 to about 5 nanometers. Thus, swing characteristics of a voltage-current graph under a threshold voltage (or sub-threshold swing characteristics) may be enhanced and a threshold voltage distribution may be improved. Moreover, instead of decreasing the widths of the impurity-implanted regions 10 and 20 to a range of about 5 to about 20 nanometers, first and second pads 61 and 62 each having widths greater than widths of the respective implanted-impurity regions 10 and 20 are disposed to easily perform a subsequent process of forming a contact on the pads 61 and 62 and decrease resistance of the contact.

Figure 3B:
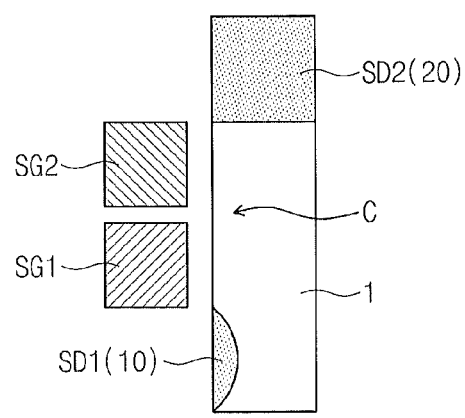
FIG. 3B is a cross-sectional view of a semiconductor device according to further examples of inventive concepts.

FIG. 3B is a cross-sectional view of a semiconductor device according to another example of inventive concepts. FIG. 3B illustrates an example in which the inventive concept is applied to a vertical channel array transistor (VCAT) structure.

Referring to FIG. 3B, a second impurity-implanted region 20 is formed on a surface of a substrate 1, and a first impurity-implanted region 10 is formed in the substrate 1 below the second impurity-implanted region 20. A channel region C between the second impurity-implanted region 20 and the first impurity-implanted region 10 is formed vertically in the substrate 1. In the substrate 1, a first sub-gate pattern SG1 and a second sub-gate pattern SG2 are disposed adjacent to the channel region C to vertically overlap each other. A top surface of the first impurity-implanted region 10 is lower than a top surface of the first sub-gate pattern SG1, and a bottom surface of the second impurity-implanted region 20 is higher than a bottom surface of the second sub-gate pattern SG2.

In FIG. 3B, an isolation layer and a gate insulator are not shown. The substrate 1 may extend to the bottom of the first impurity-implanted region 10 and in directions on opposite sides of the sub-gate patterns SG1 and SG2. The channel region C may be connected to a lower portion of the substrate 1. The two sub gate patterns (SG1, SG2) are formed on (beside) the channel region.

Embodiments of inventive concepts will now be described hereinafter more fully with reference to accompanying drawings.

Embodiment 1

Figure 4:
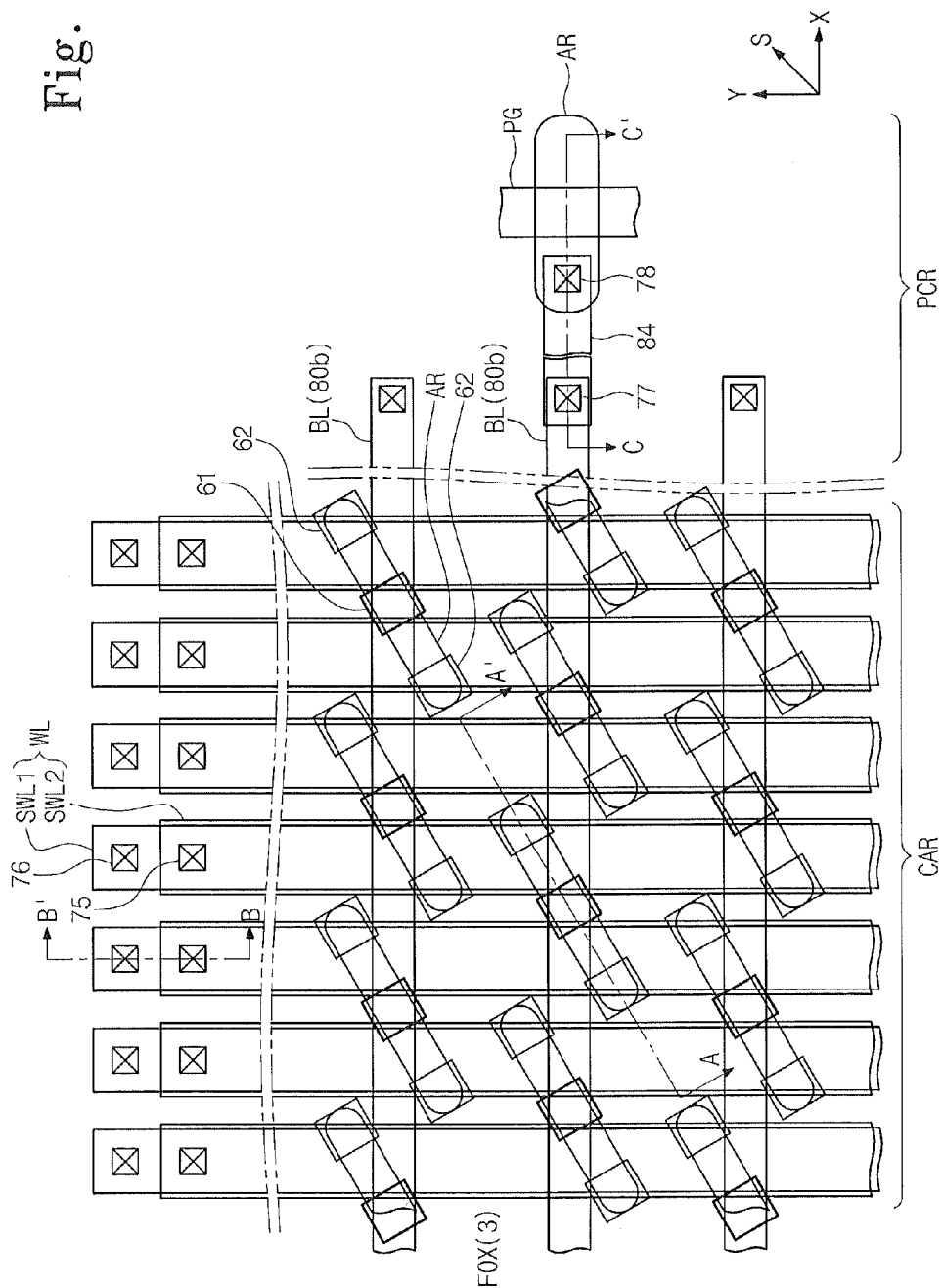
FIG. 4 is a top plan view of a semiconductor device according to first embodiments of inventive concepts.
Figure 5:
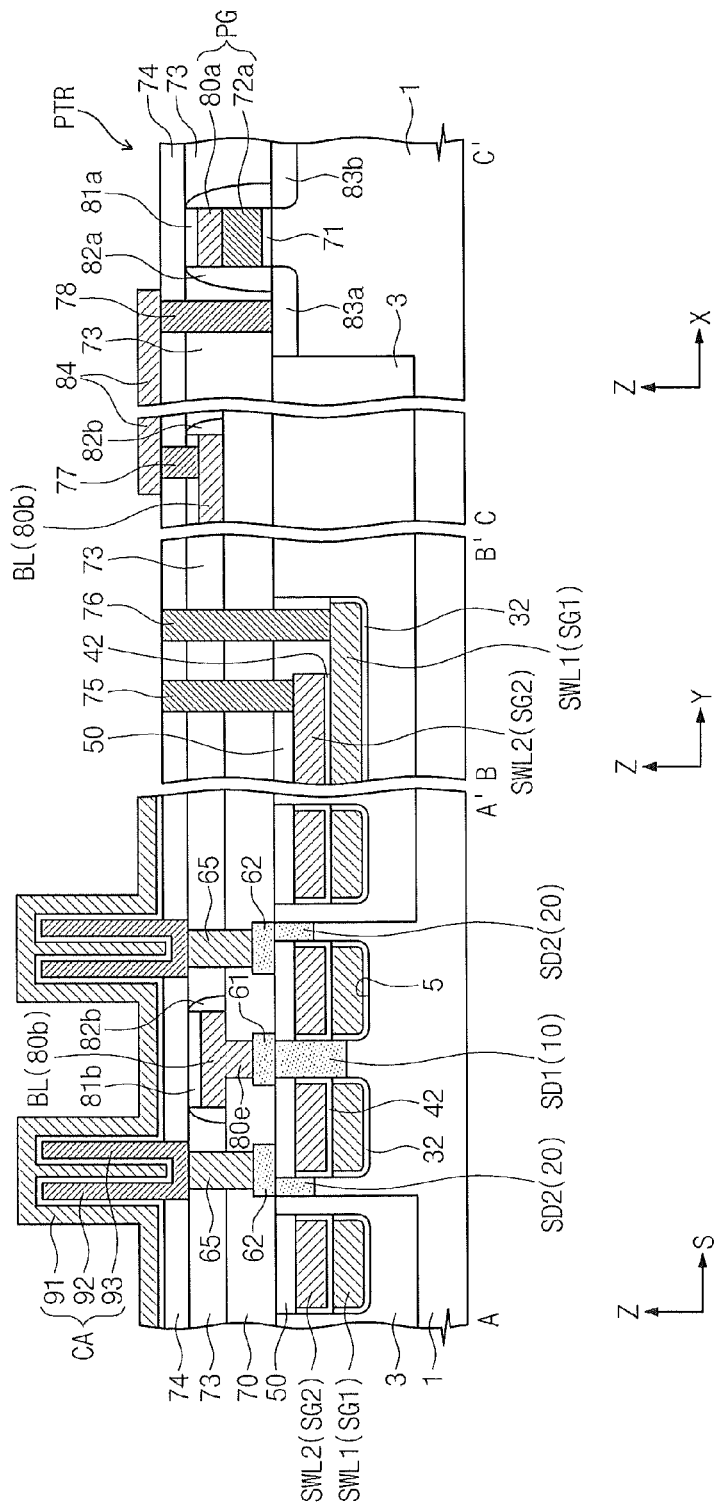
FIG. 5 is a cross-sectional view taken along lines A-A', B-B', and C-C' in FIG. 4.
Figure 6A:
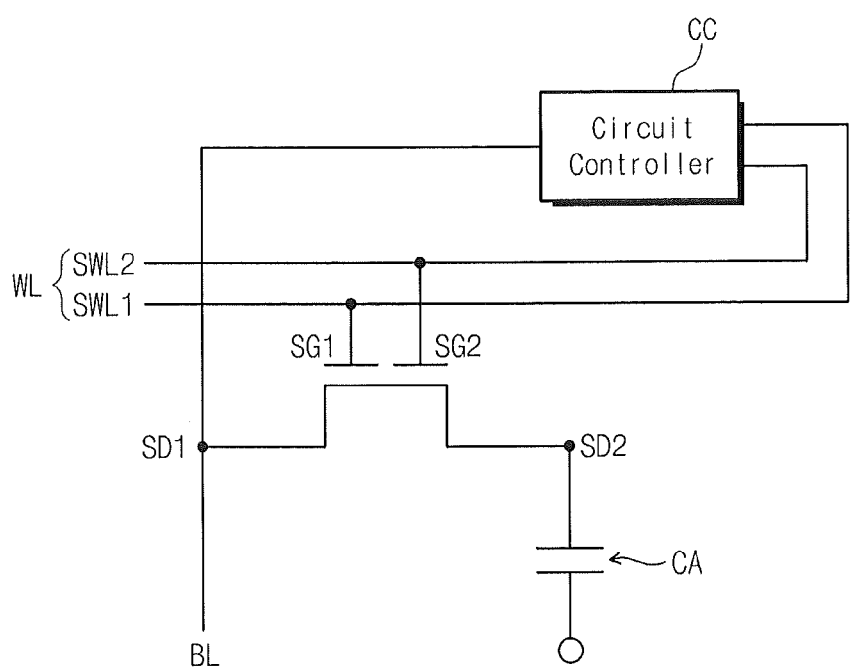
FIG. 6A is a circuit diagram of a unit cell memory according to first embodiments of inventive concepts.

FIG. 4 is a top plan view of a semiconductor device according to first embodiments of inventive concepts, and FIG. 5 is a cross-sectional view taken along lines A-A', B-B', and C-C' in FIG. 4, FIG. 6A is a circuit diagram of a unit cell memory according to the first embodiments. The semiconductor device according to the first embodiments may be a DRAM device with a gate buried in a substrate and a U-shaped channel structure.

Referring to FIGS. 4 and 5, an isolation layer (FOX) 3 is disposed on a substrate 1 to define an active region(s) AR. The substrate 1 includes a cell array region CAR and a peripheral circuit region PCR. In the cell array region CAR, a plurality of parallel bitlines BL (80b) are arranged on the substrate 1 to extend in a first direction X when viewed in plane. A plurality of parallel wordlines WL are arranged on the substrate 1 in a second direction Y orthogonal to the first direction X when viewed in plane. Active regions AR are disposed at intersections of the wordlines WL and the bitlines BL. The active regions AR have a bar shape when viewed in plane and may be disposed to be long in a third direction S non-perpendicular and non-parallel with respect to both the first direction X and the second direction Y. A fourth direction Z is a direction orthogonal to all the first, second, and third directions X, Y, and S. In FIG. 5, a section taken along the line A-A' denotes a Z-S section, a section taken along the line B-B' denotes a Z-Y section, and a section taken along the line C-C' denotes a Z-X section. Each of the wordlines WL includes a first sub-wordline SWL1 and a second sub-wordline SWL2.

A first sub-gate SG1 extends in the second direction Y to provide the first sub-wordline SWL1. A second sub-gate SG2 extends in the second direction Y to provide the second sub-wordline SWL2. The first sub-gate SG1 is disposed below the second sub-gate SG2. A first gate insulator 32 is interposed between the first sub-gate SG1 and the substrate 1, and a second gate insulator 42 is interposed between the second sub-gate SG2 and the substrate 1. The second gate insulator 42 also extends between the first sub-gate SG1 and the second sub-gate SG2.

A first impurity-implanted region SD1 (10) and a second impurity-implanted region SD2 (20) are formed on the substrate 1 adjacent opposite sides of the second sub-gate SG2. The first and second impurity-implanted regions SD1 (10) and SD2 (20) may have the same depth according to some embodiments. According to some other embodiments, however the first impurity region SD1 (10) may extend into the substrate 1 from a surface of the substrate 1 to a greater depth than the second impurity-implanted region SD2 (20). That is, a bottom surface of the first impurity-implanted region SD1 (10) may be lower than a bottom surface of the first sub-gate SD2 (20). The bottom surface of the first impurity-implanted region SD (10) is lower than a top surface of the first sub-gate SG1. Thus, the bottom surface of the first impurity-implanted region SD1 (10) may be disposed adjacent to a sidewall of the first sub-gate SD1. A bottom surface of the second impurity-implanted region SD2 (20) may be higher than a bottom surface of the second sub-gate SG2. At least one of the first and second impurity-implanted regions SD1 (10) and SD2 (20) may have a width in the range of about 5 nanometers to about 20 nanometers (nm). The substrate 1 may be doped with, for example, P-type dopants. The first and second impurity-implanted regions SD1 (10) and SD2 (2) may be doped with, for example, N-type dopants. In some embodiments, the horizontal width of the first and second impurity-implanted regions SD1 (10) and SD2 (20) may be reduced to about 5 nanometers to relatively increase widths of the first and second sub-gates SG1 and SG2. Thus, a channel length may relatively increase to improve subthreshold characteristics and/or a threshold voltage distribution.

The first subs-gate SG1 and the second sub-gate SG2 may each be/include a layer of a conductive material. For example, the first sub-gate SG1 and the second sub-gate SG2 may each include at least one selected from the group consisting of a doped semiconductor material (e.g., doped silicon, doped germanium, etc.), a conducive metal nitride (e.g., titanium nitride, tantalum nitride, etc.), a metal (e.g., tungsten, titanium, tantalum, etc.), and/or a metal-semiconductor compound (e.g., tungsten silicide, cobalt silicide, titanium silicide, etc.). The gate insulators 32 and 42 may each be/include a layer of nitride and/or oxynitride. A first capping pattern 50 may be provided on the second sub-gate SG2. A top surface of the first capping pattern 50 may be coplanar with respect to a top surface of the substrate 1. The first capping pattern 50 may include an insulator material such as silicon oxide, silicon nitride, and/or silicon oxynitride.

In this embodiment, a bottom surface of the first capping pattern 50 may be in contact with a top surface of the second gate insulator 42 and a side surface of the first capping pattern 50 may be in contact with the substrate 1 and/or the isolation layer 3. In an alternative embodiment, the second gate insulator 42 may extend between the first capping pattern 50 and the substrate 1 and/or between the first capping pattern 50 and the isolation layer 3. Especially in this case, the first capping pattern 50 may be/include a layer of silicon nitride and the second gate insulator 42 may be/include a layer of silicon oxide. Portions of the second gate insulator 42 between the first capping pattern 50 and the substrate 1 may act as a buffer layer to alleviate stress between the substrate 1 of single-crystalline silicon and the first capping pattern 510 of silicon nitride.

Referring to the B-B' section in FIG. 5, a length of the first sub-wordline SWL1 in the second direction Y may be greater than that of the second sub-wordline SWL2 in the second direction Y. A sidewall of the end of the first sub-wordline SWL1 is not aligned with that of the end of the second sub-wordline SWL2. The end of the second sub-wordline SWL2 does not cover the end of the first sub-wordline SWL1 and leaves a portion of the first sub-wordline SWL2 exposed. The capping pattern 50 may cover the sidewall of the end of the second sub-wordline SWL2 and a top surface of the first sub-wordline SWL1.

Returning to A-A' section in FIG. 5, a first pad 61 is disposed on the substrate 1 in contact with the first impurity-implanted region SD1 (10), and a second pad 62 is disposed on the substrate 1 to be in contact with SD2 (20). The first and second pads 61 and 62 may each be/include a layer of impurity-doped polysilicon and/or another conductive material. Each of the first and second pads 61 and 62 may have a greater width than that of each of the first and second impurity-implanted regions SD1 (10) and SD2 (20). Accordingly, instead of reducing the widths of each of the impurity-implanted regions SD1 (10) and SD2 (20) to a range of about 5 nanometers to about 20 nanometers (nm), first and second pads 61 and 62 each having a greater width than that of regions SD1 and SD2 are disposed to easily perform a subsequent process of forming contacts (a bottom electrode contact 65 and a bitline contact 80e) on the pads 61 and 62 and decrease resistance at the contact.

In these embodiments, the first and second pads 61 and 62 may protrude over the isolation layer 3. However, portions of each of the first and second pads 61 and 62 may be disposed lower than the isolation layer 3 so that top surfaces thereof are at a same or similar height as a top surface of the isolation layer 3.

A first interlayer dielectric 70 is disposed on the pads 61 and 62. A bitline BL (80b) is disposed on the first interlayer dielectric 70. The bitline BL (80b) may be connected to a bitline contact 80e, which is in contact with the first pad 61, through the first interlayer dielectric 70. The bitline BL (80b) and the bitline contact 80e may be formed as one element or may be separately formed. The bitline BL (810b) and the bitline contact 80e may each include at least one selected from the group consisting of a doped semiconductor material (e.g., doped silicon, doped germanium, etc.), a conducive metal nitride (e.g., titanium nitride, tantalum nitride, etc.), a metal (e.g., tungsten, titanium, tantalum, etc.), and/or a metal-semiconductor compound (e.g., tungsten silicide, cobalt silicide, titanium silicide, etc.). A second capping pattern 81b may be disposed on the bitline BL (80b). A sidewall of the bitline BL (80b) may be covered with a first insulating spacer 82b. The first interlayer dielectric 70 may not be disposed around a peripheral circuit transistor PTR in the peripheral circuit region PCR. Stated in other words, the first interlayer dielectric 70 may be removed from the peripheral circuit region or portions thereof.

A peripheral circuit transistor PTR may be configured to apply a voltage to the bitline BL (80b), and the peripheral circuit transistor may be disposed in the peripheral circuit region PCR adjacent to the end of the bitline BL (80b). The peripheral circuit transistor PTR includes a peripheral gate insulator 71 and a peripheral gate PG disposed thereon. The peripheral gate PG may include a first peripheral gate pattern 72a and a second peripheral gate pattern 80a disposed thereon. The second peripheral gate pattern 80a may include the same material as the bitline BL (80b). A third capping pattern 81a may be disposed on the peripheral gate PG. In addition, the second peripheral gate pattern 80a and the bitline may be disposed with the same thickness at the same height.

The third capping pattern 81a may be/include a layer of the same material as the second capping pattern 81b. A sidewall of the peripheral gate PG is covered with a second insulating spacer 82a. The second insulating spacer 82a and the first insulating spacer 82b may include the same material. In the peripheral circuit region PCR, a first peripheral source/drain region 83a and a second peripheral source/drain region 83b are disposed on the substrate 1 adjacent to the peripheral gate PG. Sidewalls of the insulating spacers 82a and 82b are covered with a second interlayer dielectric 73. The second interlayer dielectric 73 may cover a top surface of the first interlayer dielectric 70 in the cell array region CAR while covering the top surface of the substrate 1 in the peripheral circuit region PCR. The first and second interlayer dielectrics 70 and 73 may each be/include a layer of a material based on silicon oxide, silicon nitride, and/or silicon oxynitride. A top surface of the second interlayer dielectric 73 may be coplanar with top surfaces of the capping patterns 81a and 81b.

In the cell array region CAR, the bottom electrode contact 65 is connected to the second pad 62 through the second interlayer dielectric 73 and the first interlayer dielectric 70. A data storage element may be disposed on the second interlayer dielectric 73 to be in contact with the bottom electrode contact 65. In this embodiment, a capacitor CA will be described by way of example as the data storage element. However, the data storage element can be an MTJ (magnetic tunnel junction) of an MRAM (magnetic random access memory). The capacitor CA may include a bottom electrode 93, a top electrode 91, and a dielectric layer 92 therebetween. The bottom electrode 93 may have a cup shape. The top electrode 91 may be a common electrode horizontally extending to cover all adjacent bottom electrodes 93. A support layer 74 may be disposed between the top electrode 91 and the second interlayer dielectric 73. The support layer 74 may be disposed at a lower portion of the bottom electrode 93 to support the bottom electrode 93, i.e., to hold the bottom electrode 93. The support layer 74 may include an insulating material. In FIG. 5, it is shown that the support layer 74 is disposed at a lower portion of the bottom electrode 93. However, the support layer 74 may be additionally or singularly disposed at a middle portion and/or an upper portion of the bottom electrode 93.

The dielectric layer 92 may extend horizontally between the support layer 74 and the top electrode 91. The support layer 74 may be maintained on the second interlayer dielectric 73 in the peripheral circuit region PCR.

A first sub-wordline end contact 76 and a second sub-wordline end contact 75 may be respectively connected to the end of the first sub-wordline SWL1 and the end of the second sub-wordline SWL2 through the support layer 74, the second interlayer dielectric 73, the first interlayer dielectric 70, and the first capping pattern 50. Although not shown, the first sub-wordline end contact 76 and the second sub-wordline end contact 75 may be connected to separate peripheral circuit transistors that operate independently. Thus, the first sub-wordline end contact 76 and the second sub-wordline end contact 75 may be used as paths along which different voltages are independently applied to the first sub-wordline SWL1 and the second sub-wordline SWL2, respectively.

A bitline end contact 77 is connected to the end of the bitline BL (80b) through the support layer 74 and the second capping pattern 81b. In the peripheral circuit region PCR, a bitline voltage applying interconnection 84 is disposed on the support layer 74 to provide connection to the bitline end contact 77. A peripheral contact 78 connects the first peripheral source/drain region 83a and the bitline voltage applying interconnection 84 through the support layer 74 and the second interlayer dielectric 73. The contacts 75, 76, 77 and 78 can be formed at the same time.

In the DRAM device in FIGS. 4 and 5, two adjacent unit cell memories share one bitline contact 80e and the first impurity-implanted region SD1 (10). The two adjacent unit cell memories may thus be symmetrically disposed on opposite sides of bitline contact 80e. In a DRAM device according to these embodiments, one unit cell memory may include one transistor and one capacitor.

FIG. 6A is a circuit diagram of a unit cell memory according to some embodiments of inventive concepts.

In FIG. 6A, the first impurity-implanted region SD1 may correspond to a bitline node, and the second impurity-implanted region SD2 may correspond to a storage node.

Referring to FIGS. 5 and 6A, operations of the DRAM device will be described. As an example, voltages may be applied by circuit controller CC to a first sub-wordline SWL1, a second sub-wordline SWL2, and a bitline BL of a selected unit cell memory under read, write '1', write '0', and standby (or precharge) states as shown in Table 2 below. Circuit controller CC, for example, may be implemented in a peripheral circuit region of an integrated circuit DRAM device including all elements of FIG. 6A on a same integrated circuit substrate.

TABLE 2

|  | SWL1 | SWL2 | BL | Substrate |
|---|---|---|---|---|
| Read | Vpp | Vpp | Vcc/2 | Vbb1 |
| Write '0' | Vpp | Vpp | 0 V | Vbb1 |
| Write '1' | Vpp | Vpp | Vcc | Vbb1 |
| Standby | Negative Voltage (Vbb2) | >Vbb2 | Vcc/2 | Vbb1 |

As shown in the Table 2, the same voltage (high voltage Vpp) is applied to the first sub-wordline SWL1 and the second sub-wordline SWL2 in a selected unit cell memory during read and write operations. At this point, the high voltage Vpp may be, for example, a voltage of about 0.3 volt. During a data '1' write operation, a power supply Vcc is applied to the bitline BL. For example, a voltage of about 2.0 volt may be applied to the bitline BL. At this point, for example, a power supply voltage of about 2.0 volt may be written to the capacitor CA. A first back bias voltage Vbb1 (e.g., −0.4 volt) may also be applied to the substrate 1.

In a retention (or standby) state before operation, a second back bias voltage Vbb2, for example, a negative voltage (more specifically, e.g., −0.4 volt), may be applied to the first sub-wordline SWL1, and a voltage having a magnitude lower than the second back bias voltage, for example, 0 volt, may be applied to the second sub-wordline SWL2. At this point, for example, the power supply voltage Vcc written into the capacitor CA (e.g., 2 volt) during a write '1' operation may be applied to the second impurity-implanted region SD2 (20) (corresponding to a storage node). A difference between voltages at the second sub-wordline SWL2 and the second impurity-implanted region SD2 may be about the power supply voltage Vcc (e.g., 2 volt).

In a structure where the first sub-wordline SWL1 and the second sub-wordline SWL2 together provide one wordline, a second back bias voltage (e.g., −0.4 volt) is also applied to the second sub-wordline SWL2. Thus, a difference between voltages at the second sub-wordline SWL2 and the second impurity-implanted region SD2 may be "Vcc+(absolute value of Vbb2)", for example, about 2.4 volt. Since this voltage difference is greater than the power supply voltage (e.g., 2 volt) that is a voltage difference of some inventive concepts, a probability of occurrence of a GIDL phenomenon may increase. Likewise when leakage current is generated in the second impurity-implanted region SD2 (20) below a capacitor, charge stored in the capacitor may leak, resulting in data loss.

However, according to some inventive concepts, a high voltage greater than the second back bias voltage Vbb2 is applied to the second sub-wordline SWL2 to reduce a difference between voltages at the second sub-wordline SWL2 and the second impurity-implanted region SD2 (20). Thus, in some structures according to inventive concepts, a probability that leakage current is generated by the GIDL phenomenon may be reduced. Thus, data/charge storage capability of a memory cell capacitor may be enhanced to improve reliability as described in greater detail below. In the description below, a second impurity-implanted region SD2 (20) may correspond to a storage node S and a first impurity-implanted region SD1 (10) may correspond to a bitline node D.

Figure 6B:
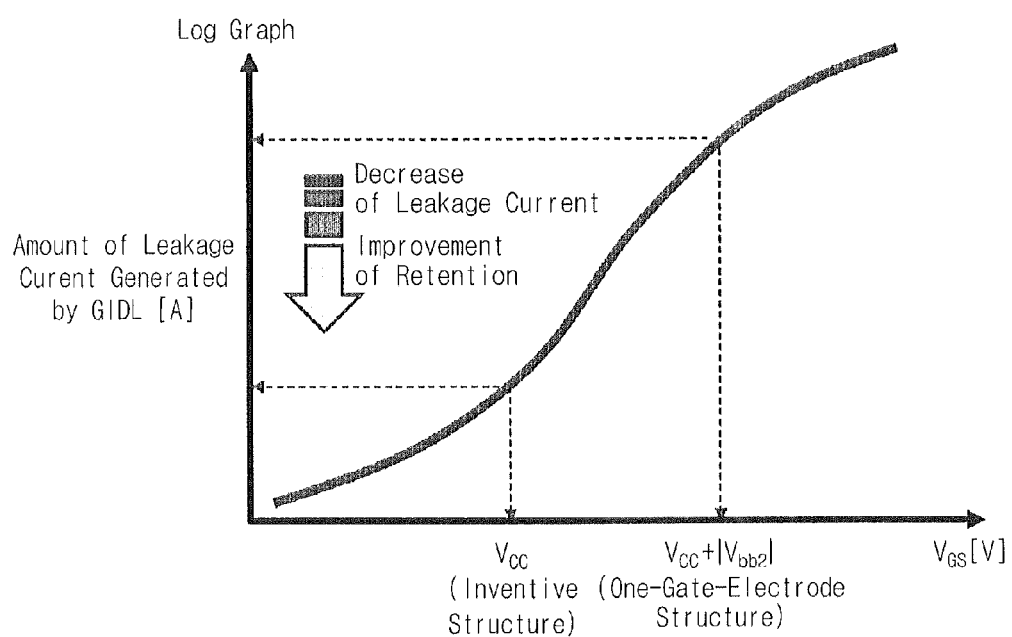
FIG. 6B is a graphic diagram illustrating leakage currents generated in a structure according to some inventive concepts and leakage currents generated in a one-gate-electrode structure.
Figure 6C:
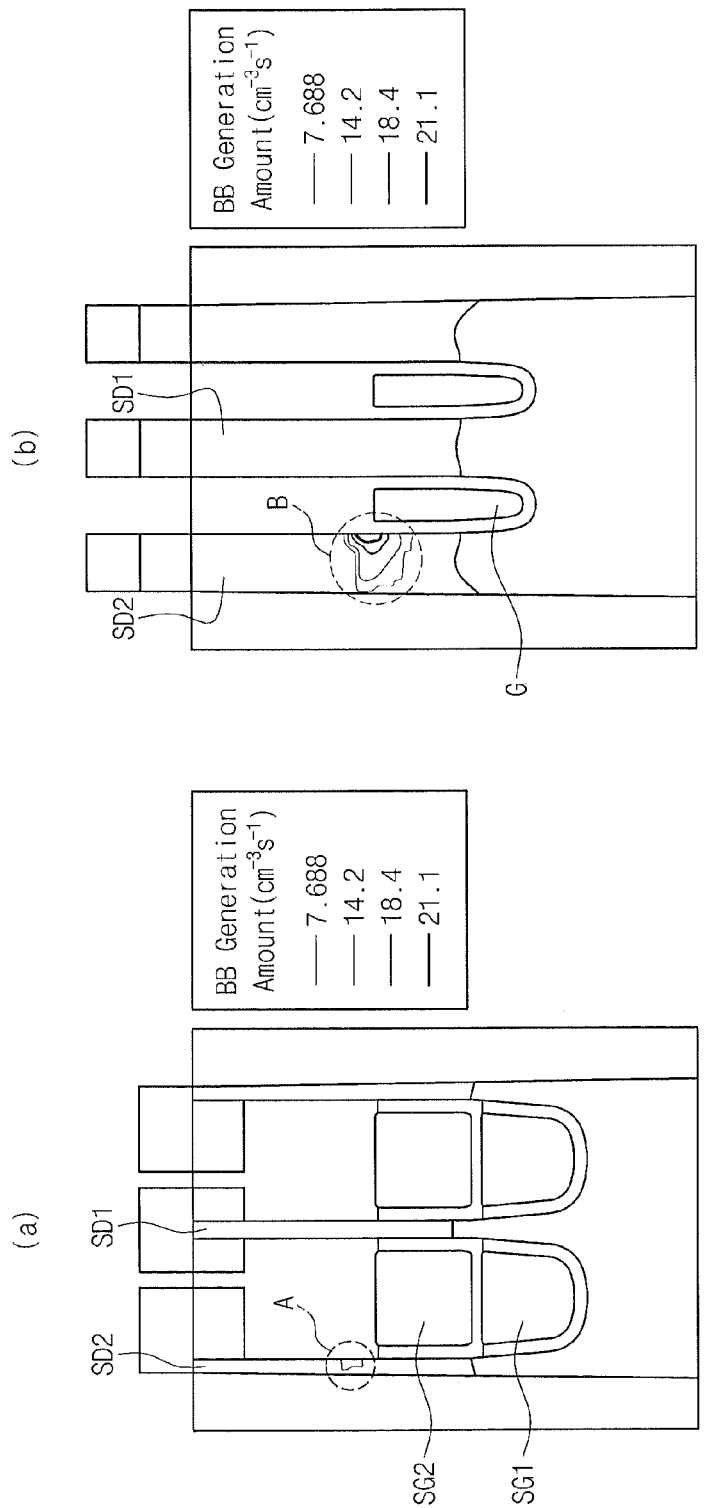
FIG. 6C is a simulation image illustrating leakage current generated (a) according to inventive concepts and leakage current generated in a one-gate-electrode structure (b).

FIGS. 6B and 6C are graphic diagrams showing leakage current generated in a structure according to inventive concepts/structures and leakage current generated in a one-gate-electrode structure, respectively.

In FIG. 6B, $V_{GS}$ on the horizontal axis may represent a difference between voltages at a gate G and a storage node S. with one gate electrode, as described above, $V_{GS}$ may be Vcc+|Vbb2|. With 2 gate electrodes SWL1 and SWL2 according to inventive concepts, $V_{GS}$ may correspond to Vcc. Accordingly, leakage current generated by the GIDL phenomenon in a source region may decrease and data retention performance may be enhanced.

FIG. 6C is a simulation image showing leakage current generated in a structure (a) according to inventive concepts and leakage current generated in a one-gate-electrode structure (b).

Referring to FIG. 6C, in structure (a) according to some inventive concepts, sub-gates SG1 and SG2 each have a width of about 40 nanometers (nm) and impurity-implanted regions SD1 and SD2 each have a width of about 8 nm. When voltages of about −0.4 volt, 0.2 volt, and 0.2 volt were applied to the first sub-gate SG1, the second sub-gate SG2, and the second impurity-implanted region SD2, respectively, weak leakage current was generated at an 'A' region of the second impurity-implanted region SD2. On the other hand, in the one-gate-electrode structure (b), a gate G has a width of about 20 nm and the impurity-implanted regions SD1 and SD2 each have a width of about 20 nm. When voltages of about −0.4 volt and 2.0 volt were applied to the gate G and the second impurity-implanted region SD2, a relatively large leakage current was generated at a 'B' region of the second impurity-implanted region SD2. More specifically, at that point, the leakage current and a maximum band-bending rate (maximum BB rate) are shown in Table 3 below. The maximum BB rate means the number of holes when leakage current is generated, i.e., a hole-generation rate when leakage current is generated. The amount of leakage current is reduced as the maximum BB rate decreases.

TABLE 3

|  | Inventive Structure (a) | One-gate-electrode Structure (b) |
|---|---|---|
| Amount of Leakage Current [A/μm] | $1.26 \times 10^{-20}$ | $1.99 \times 10^{-15}$ |
| Maximum BB Rate [$cm^{-3}s^{-1}$] | $7.2 \times 10^{15}$ | $1.3 \times 10^{21}$ |

As shown in the Table 3, it may be understood that the amount of leakage current is much smaller in structure (a) according to some inventive concepts than in the one-gate-electrode structure (b).

In the structure of FIG. 5 according to some inventive concepts, a threshold voltage may be designed low to increase on-current in an operation state such as read/write. When a threshold voltage drops, a probability of leakage current generation increases in a standby state. However, as set forth above, generation of leakage current may be reduced by applying different voltages to the sub-gates SG1 and SG2. As a result, generation of leakage current may be reduced in a standby state and on-current may increase in and during read/write operations. This will now be described below in detail.

Figure 6D:
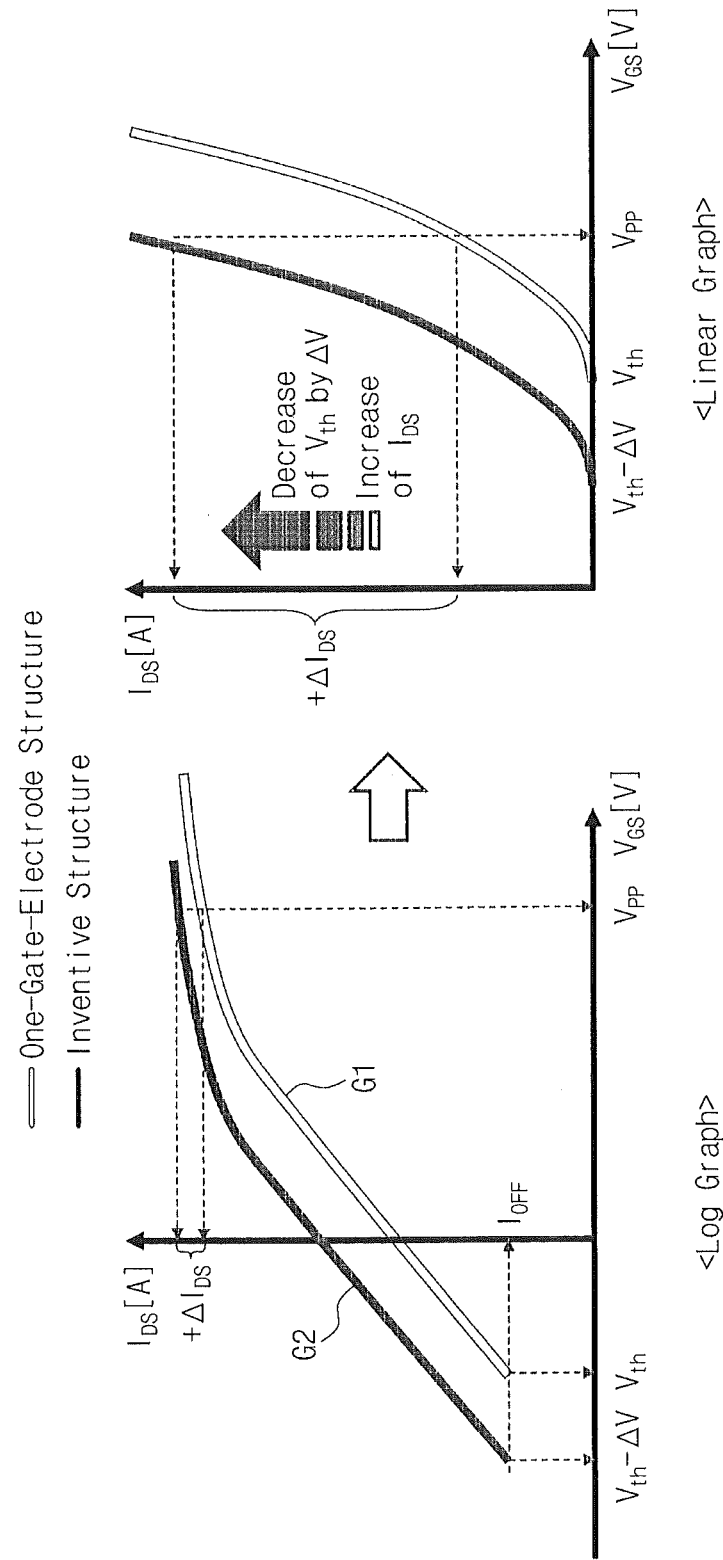
FIGS. 6D to 6F are graphic diagrams illustrating source-drain current generated in a structure according to inventive concepts and of source-drain current generated in a one-gate-electrode structure.
Figure 6E:
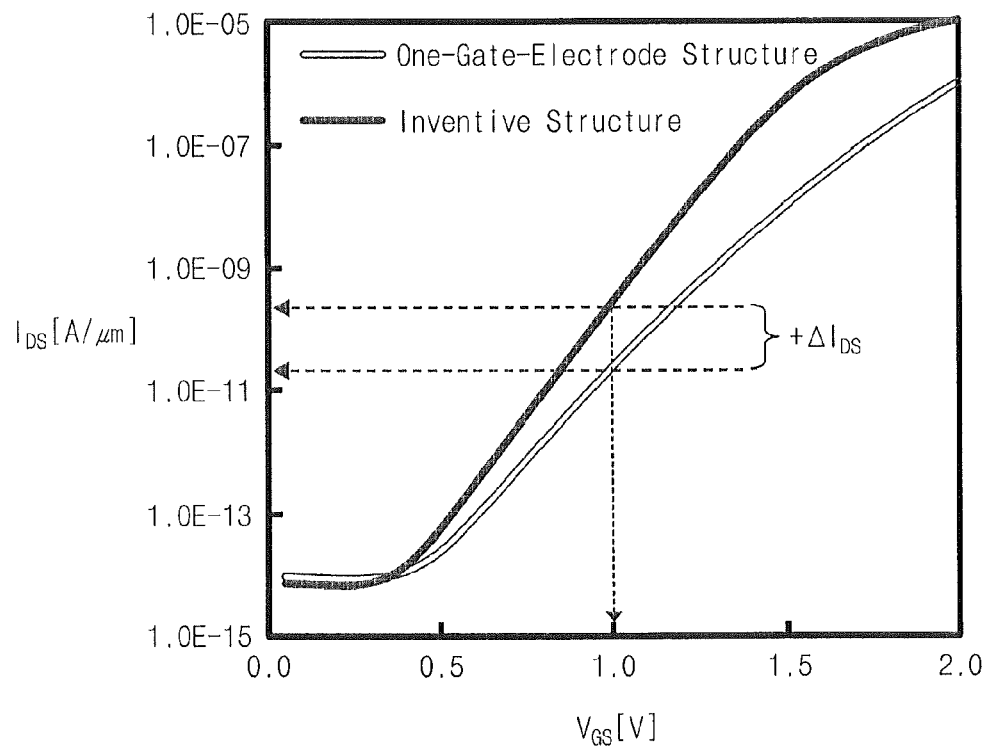
Figure 6F:
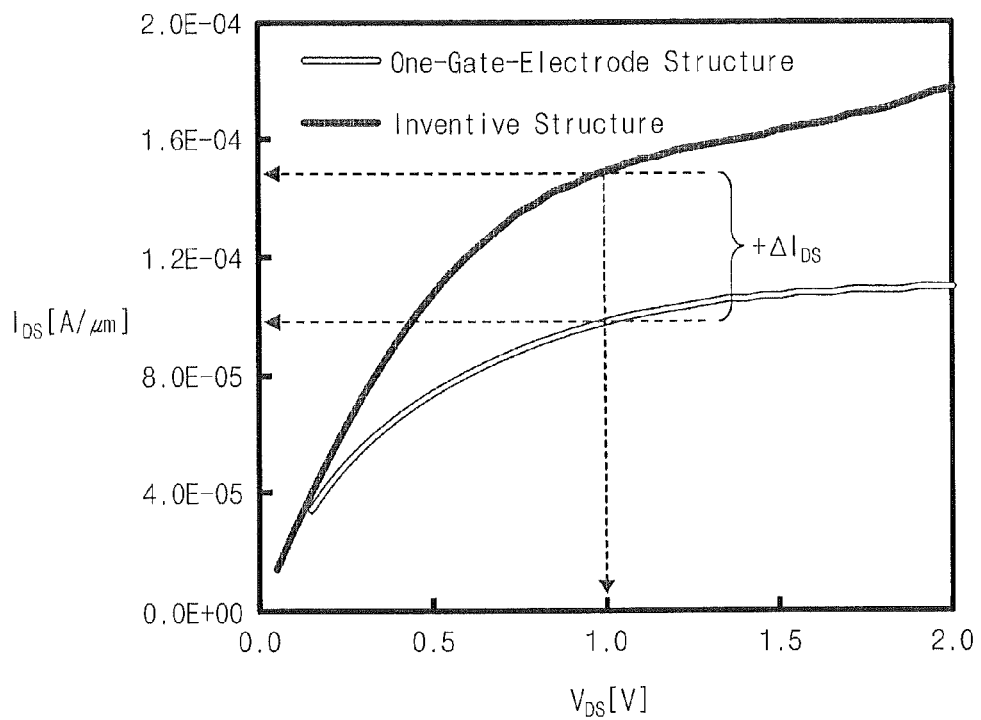

FIGS. 6D to 6F are graphic diagrams showing current between a bitline node and a storage node ($I_{DS}$) generated in a structure according to inventive concepts (referred to as an inventive structure) and current between a bitline node and a storage node ($I_{DS}$) generated in a one-gate-electrode structure.

Referring to FIG. 6D, a first graph G1 shows a relationship between $V_{GS}$ and $I_{DS}$ in a structure including only one gate electrode and having a specific threshold voltage Vth, and a second graph G2 shows a relationship between $V_{GS}$ and $I_{DS}$ when a threshold voltage Vth is reduced by $\Delta V$ in the structure according to some inventive concepts. As described above, according to inventive concepts, since different voltages are applied to two sub-wordlines to reduce generation of leakage current, a lower negative voltage may be applied to the first sub-wordline SWL1. Thus, the threshold voltage Vth may decrease by $\Delta V$ in the structure according to some inventive concepts more than in the one-gate-electrode structure. The second graph G2 may correspond to the first graph G1 through parallel translation of the first graph G1 by $\Delta V$. In the first and second graphs G1 and G2, the amount of current between a bitline node and a storage node ($I_{DS}$) increases by $+\Delta I_{DS}$ when applying a high voltage Vpp that is a data '1' write voltage. This will be understood more clearly in a linear graph than in a log graph. Therefore, it may be understood that a threshold voltage is designed low to increase on-current in an operation state such as a write operation.

A graph in FIG. 6E shows a result obtained through simulation of a relationship between $V_{GS}$ and $I_{DS}$ in the inventive structure (a) and the one-gate-electrode structure (b). For example, when the $V_{GS}$ is about 1 volt, the amount of current between a bitline node and a storage node, which is $I_{DS}$, may increase by $+\Delta I_{DS}$ more than in the one-gate-electrode structure.

A graph in FIG. 6F shows a result obtained through simulation of a relationship between $V_{DS}$ and $I_{DS}$ in the inventive structure (a) and the one-gate-electrode structure (b). $V_{DS}$ on the horizontal axis may represent a difference between voltages at a bitline node D and a storage node S. For example, when the $V_{DS}$ is about 1 volt, the amount of current between a bitline node and a storage node ($I_{DS}$) may increase by $+\Delta I_{DS}$ more than in the one-gate-electrode structure.

Through FIGS. 6D to 6F, it may be understood that the amount of current between a bitline node and a storage node ($I_{DS}$), i.e., on-current of an operation state may increase in the inventive structure (a) more than in the one-gate-electrode structure.

A result obtained through simulation of electrical characteristics in the inventive structure (a) and the one-gate-electrode structure (b) in FIG. 6C are shown in Table 4 below.

TABLE 4

|  | Inventive Structure (a) | One-gate-electrode Structure |
|---|---|---|
| Threshold Voltage [Vth] | 1.6 | 1.8 |
| Subthreshold Swing [mV/decade] | 134 | 159 |
| $I_{DSAT}$ [mA/μm @ $V_{GS}$ = 3.0 V] | 0.18 | 0.11 |

As shown in the Table 4, a threshold voltage in the inventive structure (a) may be reduced more than in the one-gate-electrode structure. In addition, subthreshold swings were 134 in the inventive structure (a) and 159 in the one-gate-electrode structure. That is, the subthreshold swing in the inventive structure (a) was smaller than that in the one-gate-electrode structure. The "subthreshold swing" means the voltage required to reduce current by one-tenth (1/10) in a current value of a threshold voltage. As a subthreshold swing decreases, performance of a transistor may improve. Accordingly, it may be understood that subthreshold characteristics may be improved. In addition, it may be understood that when $V_{GS}$ is 3.0 volt, a value of saturation current ($I_{DSAT}$) increases in the inventive structure (a) more than in the one-gate-electrode structure.

FIGS. 7 to 24 are cross-sectional views illustrating operations of fabricating a semiconductor device having a cross section shown in FIG. 5.

Figure 7:
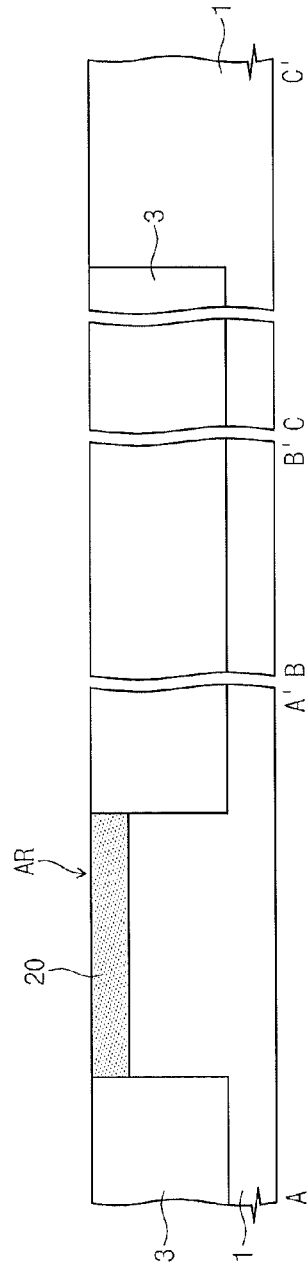
FIGS. 7 to 24 are cross-sectional views illustrating operations of fabricating a semiconductor device having a cross section shown in FIG. 5.

Referring to FIG. 7, an isolation layer 3 is formed on a substrate 1 to define an active region AR. The isolation layer 3 may be formed using a shallow trench isolation (STI) technique. The isolation layer 3 may be formed of materials such as silicon nitride, silicon oxide, silicon oxynitride, etc. In the cell array region CAR, impurity-implanted region 20 may be formed on the entire surface of the active region AR in the substrate 1 using ion implantation. The impurity-implanted region 20 may be doped with, for example, N-type impurities. Although not shown, a plurality of well regions may be formed on the substrate 1 before forming the impurity-implanted region 20.

Figure 8:
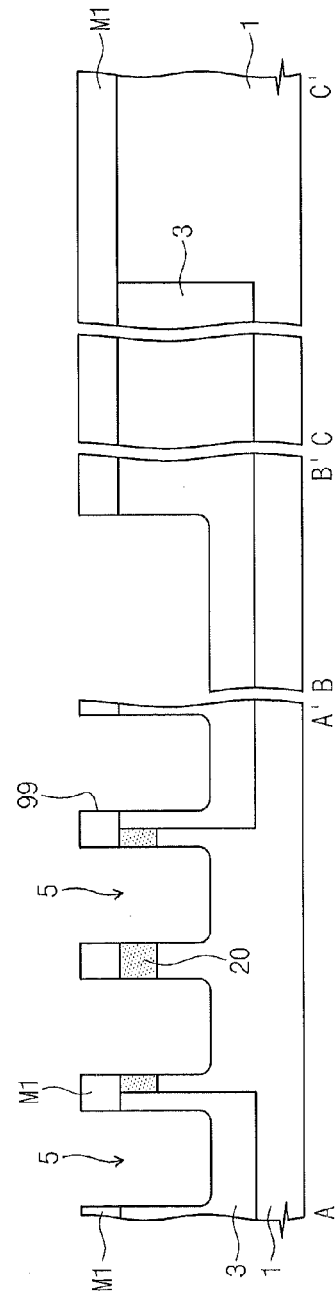

Referring to FIG. 8, mask pattern M1 is formed on the substrate 1. Mask pattern M1 is formed to have a first opening(s) 99 defining a region(s) where sub-wordlines SWL1 and SWL2 are disposed. Mask pattern M1 may be a hard mask pattern such as silicon nitride or a photoresist pattern. In the cell array region CAR, the substrate 1 and the isolation layer 3 are etched using the first mask pattern M1 as an etch mask to form a plurality of line-type grooves 5 extending in a second direction Y.

Figure 9:
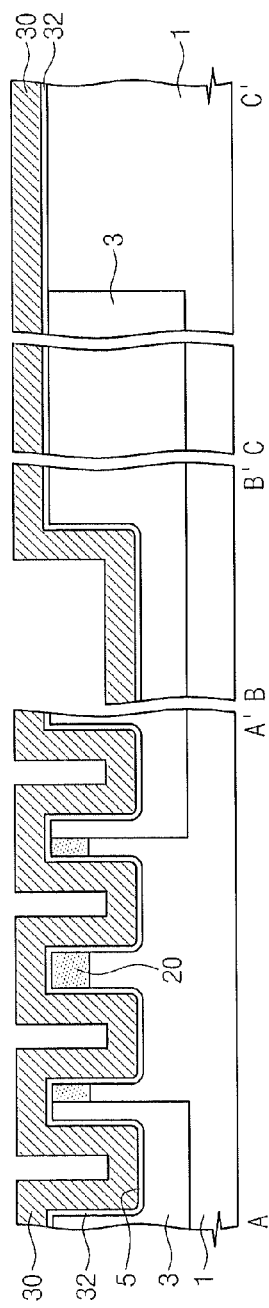

Referring to FIG. 9, the first mask pattern M1 is removed. If the first mask pattern M1 is a photoresist pattern, it may be removed using an ashing process. If the first mask pattern M1 is formed of silicon nitride, it may be removed using a cleaning process using phosphoric acid or the like. A first gate insulator 32 is formed on the substrate 1 where the grooves 5 are formed. The first gate insulator 32 may be, for example, a silicon oxide layer formed using atomic layer deposition (ALD) or chemical vapor deposition (CVD). A first sub-gate layer 30 is conformally formed on the entire surface of the substrate 1 where the first gate insulator 32 is formed. The first sub-gate layer 30 may be formed to be at least as thick as a first sub-gate SG1 to be formed in a subsequent process.

Figure 10:
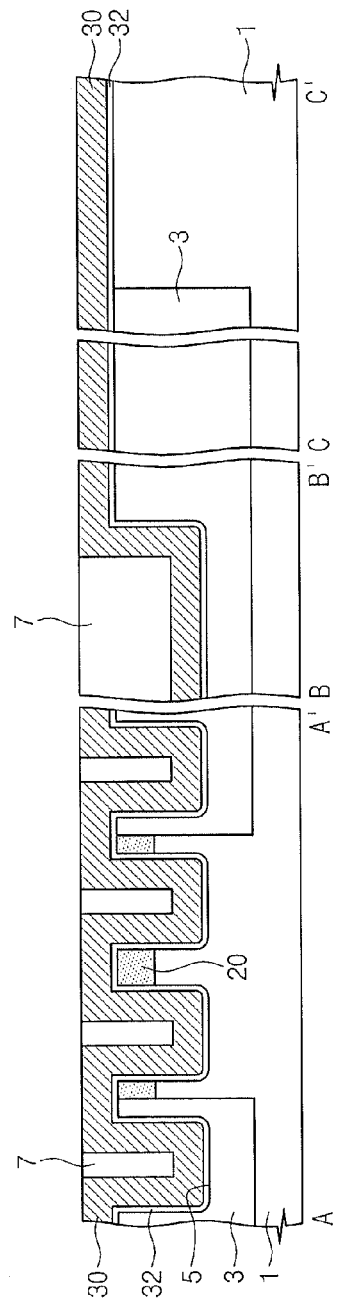

Referring to FIG. 10, a first sacrificial layer 7 is formed on the substrate 1 to fill the groove 5. The first sacrificial layer 7 may be formed of a material having an etch selectivity with respect to the first sub-gate layer 30. The first sacrificial layer 7 may be formed of, for example, of an oxide such as silicon oxide. The first sacrificial layer 7 is planarized to make a surface of the first sacrificial layer 7 even with or lower than that of the first sub-gate layer 30.

Figure 11:
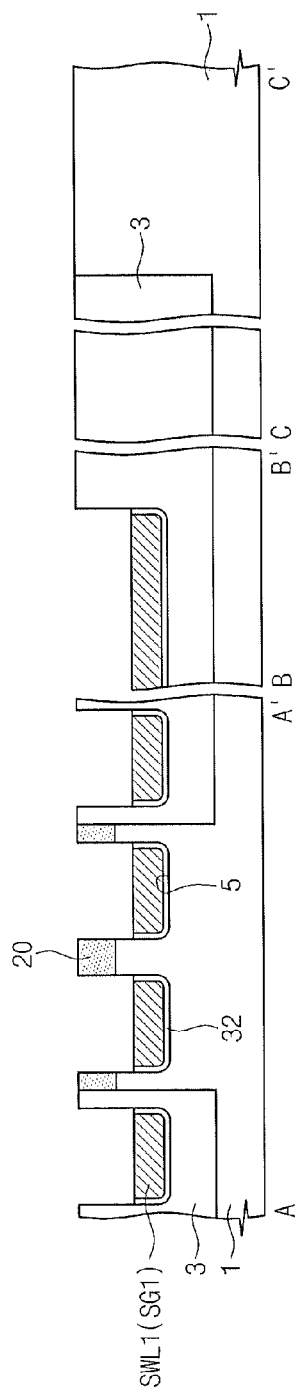

Referring to FIG. 11, an etching process recipe is adjusted such that the first sacrificial layer 7 and the first sub-gate layer 30 are etched almost at a ratio of one to one. For this reason, the first sacrificial layer 7 and the first sub-gate layer 30 may be etched at substantially a same rate. During this etching, the first sacrificial layer 7 may protect portions of the first sub-gate layer 30 in lower portions of groove 5 from etching. This etching may be continued until portions of the first sub-gate layer 30 remaining in the groove 5 have a desired thickness. A top surface of the first sub-gate layer 30 remaining within the groove 5 may be lower than a bottom surface of the second impurity-implanted region 20. Due to this etching, the first sacrificial layer 7 may be entirely removed and a first sub-gate SG1 (or a first sub-wordline SWL1) is formed in the groove 5. Since etching damage may occur on portions of the first gate insulator 32 that are exposed and not covered with the first sub-gate SG1, the first gate insulator 32 may be removed. Thus, top surfaces of the isolation layer 3 and the substrate 1 may be exposed.

Figure 12:
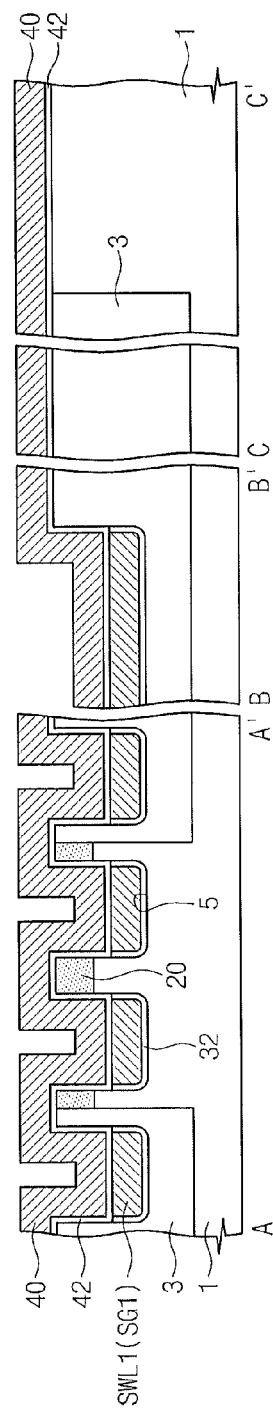

Referring to FIG. 12, a second gate insulator 42 is conformally formed on the entire surface of the substrate 1. The second gate insulator 42 may be, for example, a silicon oxide layer formed using thermal oxidation, atomic layer deposition (ALD), or chemical vapor deposition (CVD). The second gate insulator 42 may have the same (or similar) thickness as the first gate insulator 32. A second sub-gate layer 40 is conformally formed on the second gate insulator 42. The second sub-gate layer 40 may be formed to be at least as thick as a second sub-gate SG2 to be formed in a subsequent process.

Figure 13:
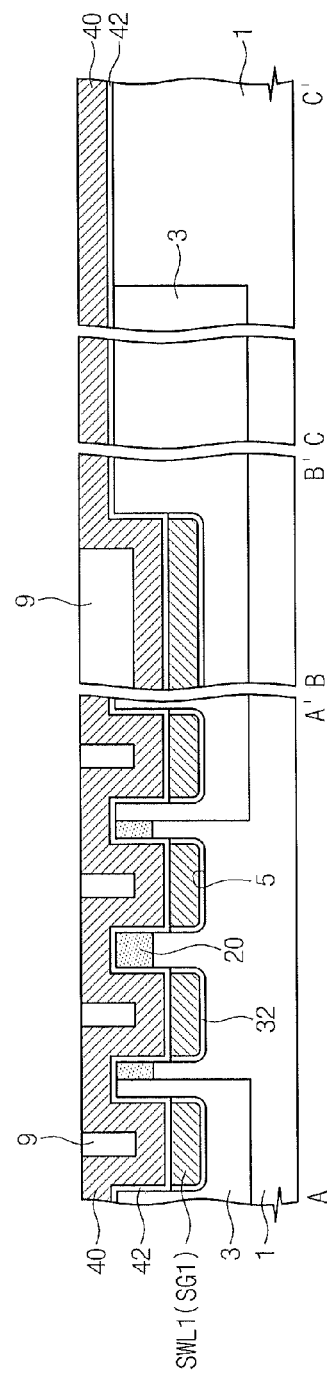

Referring to FIG. 13, a second sacrificial layer 9 is formed on the substrate 1 to fill the groove 5. The second sacrificial layer 9 may be formed of a material having an etch selectivity with respect to the second sub-gate layer 40. The second sacrificial layer 9 may be formed of, for example, an oxide such as silicon oxide. The second sacrificial layer 9 is planarized to make a top surface of the second sacrificial layer 9 even with or lower than that of the second sub-gate layer 40.

Figure 14:
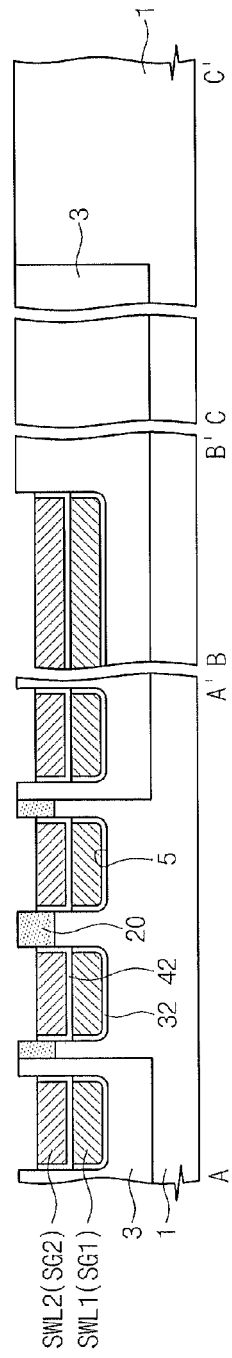

Referring to FIG. 14, an etching process recipe is adjusted such that the second sacrificial layer 9 and the second sub-gate layer 40 are etched almost at a ratio of one to one. For this reason, the second sacrificial layer 9 and the second sub-gate layer 40 may be etched at substantially a same rate. During this etching, the second sacrificial layer 9 may protect portions of the second sub-gate layer 40 in lower portions of the groove 5 from etching. This etching may be continued until portions of the second sub-gate layer 40 remaining in the groove 5 have a desired thickness. Due to this etching, the second sacrificial layer 9 is entirely removed and a second sub-gate SG2 (or a second sub-wordline SWL2) is formed in the groove 5. Since etching damage may occur on portions of the second gate insulator 42 that are exposed and not covered with the second sub-gate SG2, the second gate insulator 42 may be removed. Thus, the top surfaces of the isolation layer 3 and the substrate 1 may be exposed.

Figure 15:
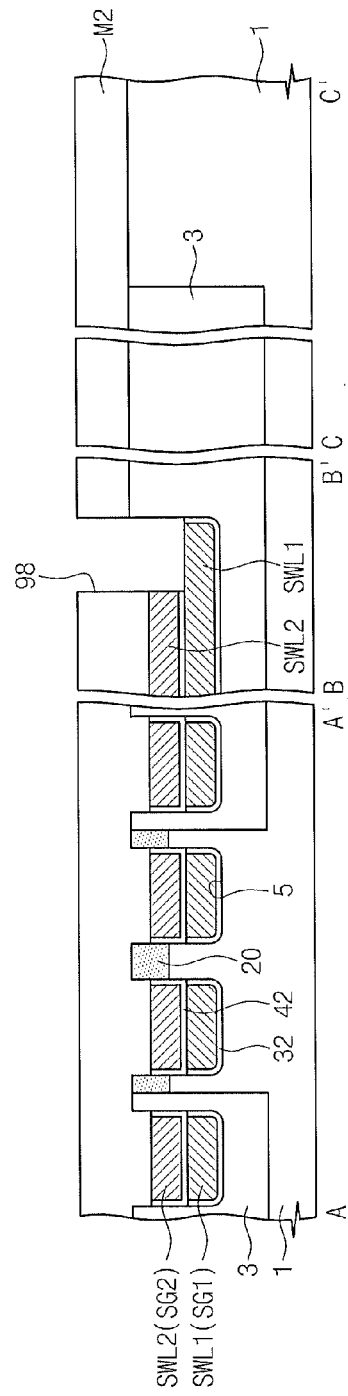

Referring to the B-B' section in FIG. 15, a second mask pattern M2 is formed on the substrate 1. The second mask pattern M2 has a second opening 98 to expose the end of the second sub-gate SG2 (i.e., the end of the second sub-wordline SWL2). The second mask pattern M2 may be a hard mask pattern such as silicon nitride or a photoresist pattern. In the cell array region CAR, the end of the second sub-wordline SWL2 is etched using the second mask pattern M2 as an etch mask. At this point, a portion of the second gate insulator 42 may be removed to expose a top surface of the end of the first sub-wordline SWL1.

Figure 16:
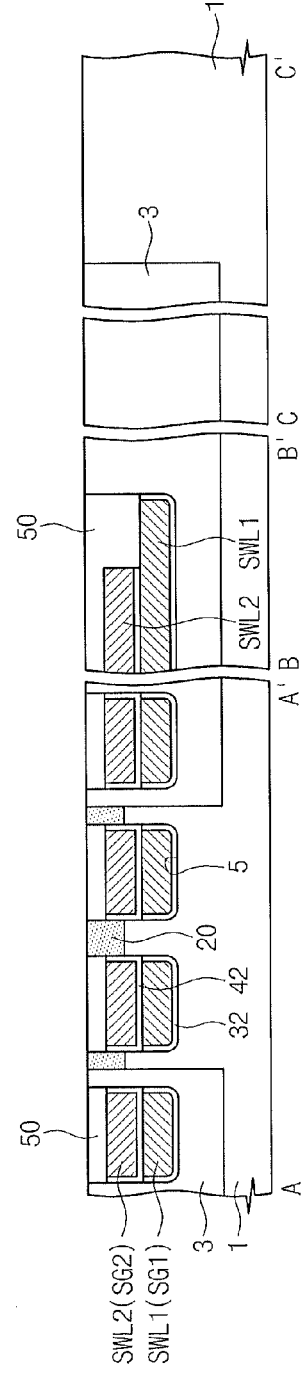

Referring to FIG. 16, the second mask pattern M2 is removed. If the second mask pattern M2 is a photoresist pattern, it may be removed using an ashing process. If the second mask pattern M2 is formed of silicon nitride, it may be removed by a cleaning process using phosphoric acid or the like. After a capping layer is formed on the entire surface of the substrate 1, a planarization process is performed to form a first capping pattern 50 in the groove 5. The first capping pattern 50 may be formed of at least one selected from the group consisting of silicon nitride, silicon oxide, and/or silicon oxynitride.

Figure 17:
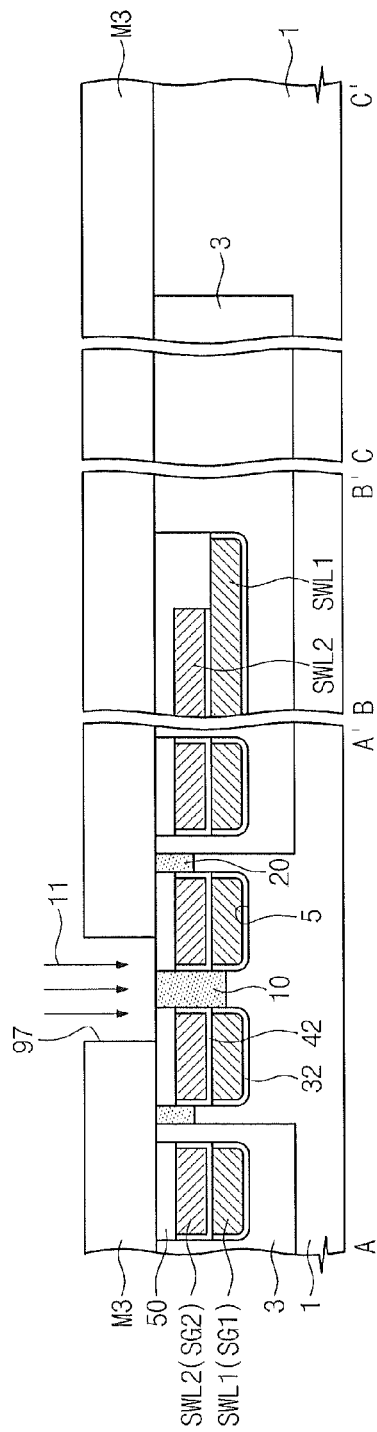

Referring to FIG. 17, a third mask pattern M3 is formed on the substrate 1. The third mask pattern M3 may have a third opening 97 at a position where a first impurity-implanted region SD1 (10) is to be formed. The third mask pattern M3 may be used as a mask for ion implantation. Impurities are implanted the substrate 1 exposed through the third opening 91 to form the impurity-implanted region 10 between two adjacent sub-wordlines SWL2. The impurity-implanted region 10 may be doped with the same N-type impurities as the second impurity-implanted region 20. In this case, a bottom surface of the impurity-implanted region 10 may be lower than that of the impurity-implanted region 20. Furthermore, the bottom surface of the impurity-implanted region 20 may be lower than a top surface of the first sub-gate SG1.

Figure 18:
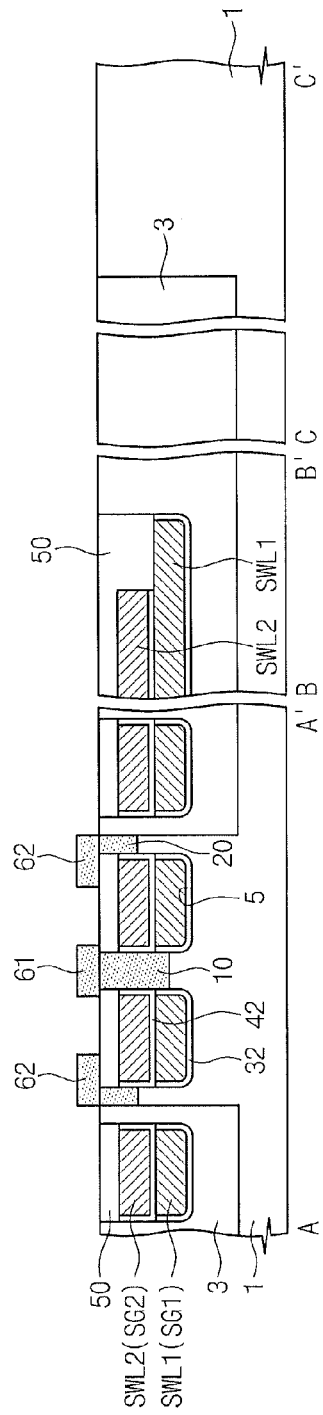

Referring to FIG. 18, the third mask pattern M3 is removed. A doped polysilicon layer, a doped single-crystalline silicon layer, or a conductive layer is formed and patterned to form a first pad 61 and a second pad(s) 62. The first pad 61 is formed in contact with the impurity-implanted region SD1 (10), and the second pad(s) 62 is formed to be in contact with the impurity-implanted region(s) SD2 (20). If the first and second pads 61 and 62 are formed of doped polysilicon or single-crystalline silicon, they may be doped with impurities of the same conductivity type as the impurity-implanted regions 10 and 20.

Figure 19:
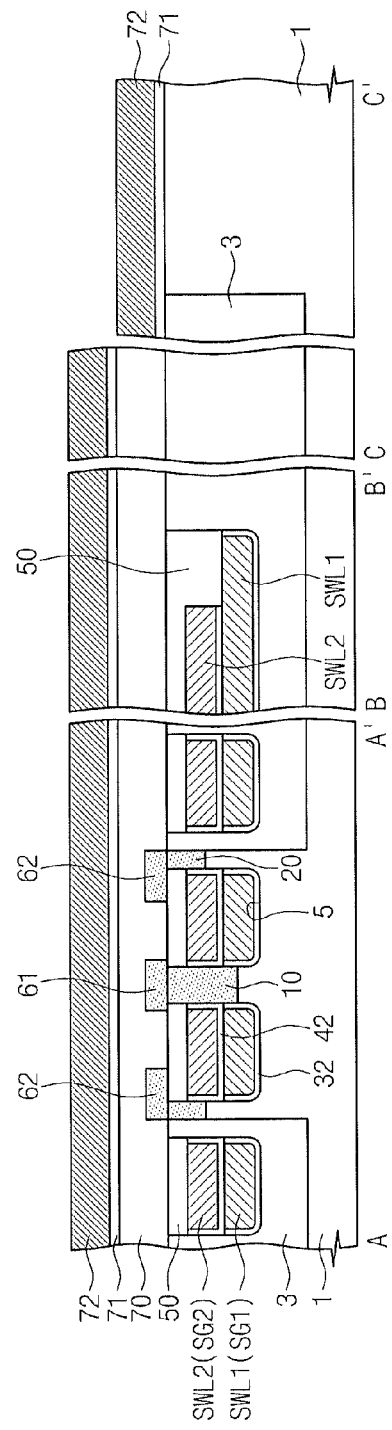

Referring to FIG. 19, a first interlayer dielectric 70 is formed on the entire surface of the substrate 1 and then patterned to expose a surface of the substrate 1 in the peripheral circuit region PCR. A peripheral gate insulator 71 is formed on the exposed substrate 1 in the peripheral circuit region PCR. A first peripheral gate layer 72 is formed on the peripheral gate insulator 71. The first peripheral gate layer 72 may be formed of doped polysilicon or a metal-containing material.

Figure 20:
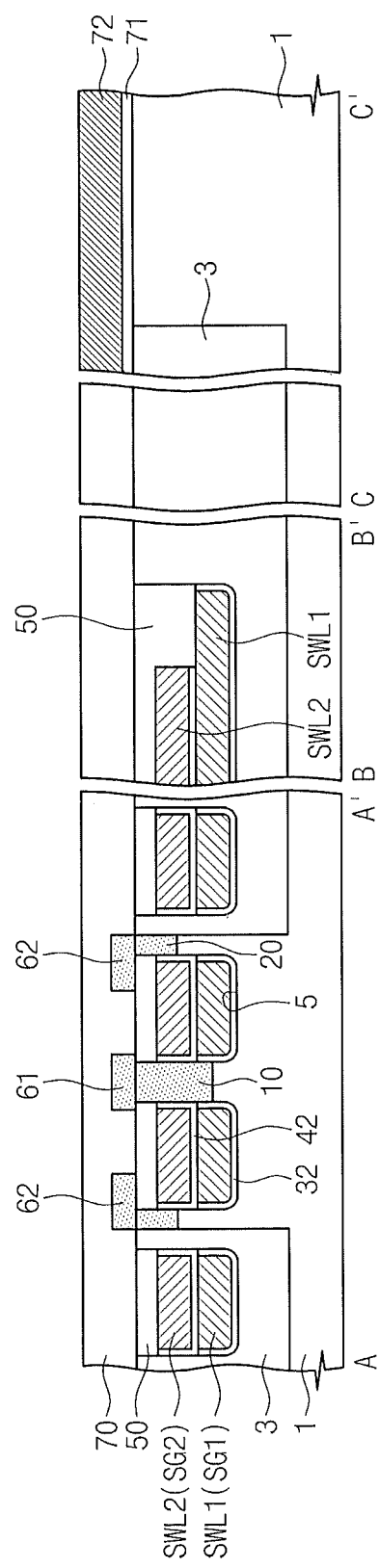

Referring to FIG. 20, an etch process is performed for the first peripheral gate layer 72 to expose a top surface of the first interlayer dielectric 70 in the cell array region CAR while maintaining portions of the first peripheral gate layer 72 in the peripheral circuit region PCR. The etch process may be an etchback process or a chemical mechanical polishing (CMP) process.

Figure 21:
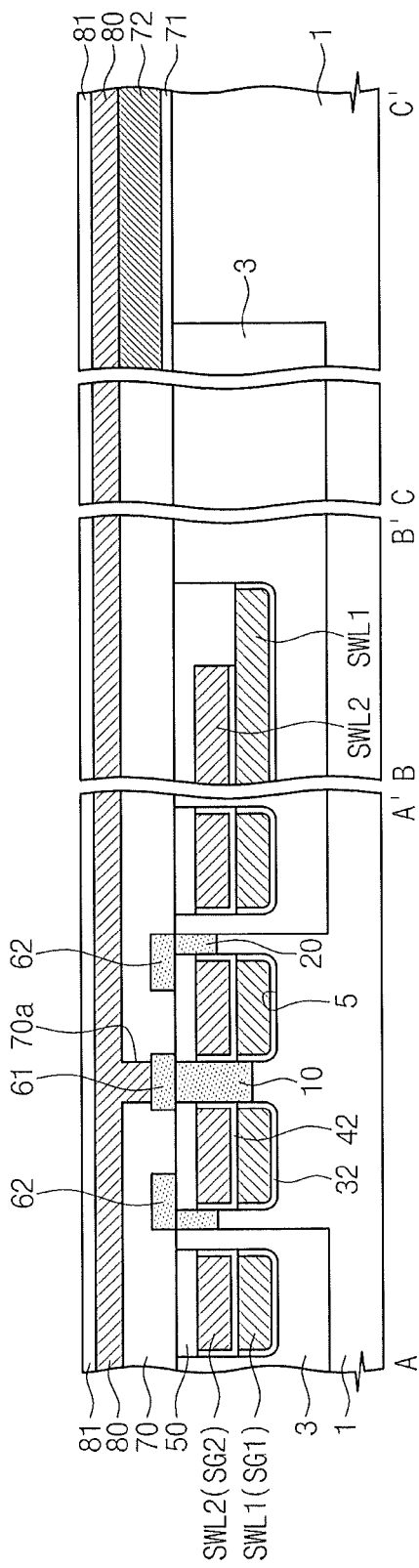

Referring to FIG. 21, a portion of the interlayer dielectric 70 is patterned such that a bitline contact hole 70a is formed to expose the first pad 61. When the bitline contact hole 70a is formed, a probability of misalignment may be reduced by providing the first pad 61 with a relatively large area. A bitline layer 80 is formed on the entire surface of the substrate 1. The bitline layer 80 may be formed of a metal-containing material. The bitline layer 80 is formed to fill the bitline contact hole 70a. A second capping layer 81 is formed on the bitline layer 80.

Figure 22:
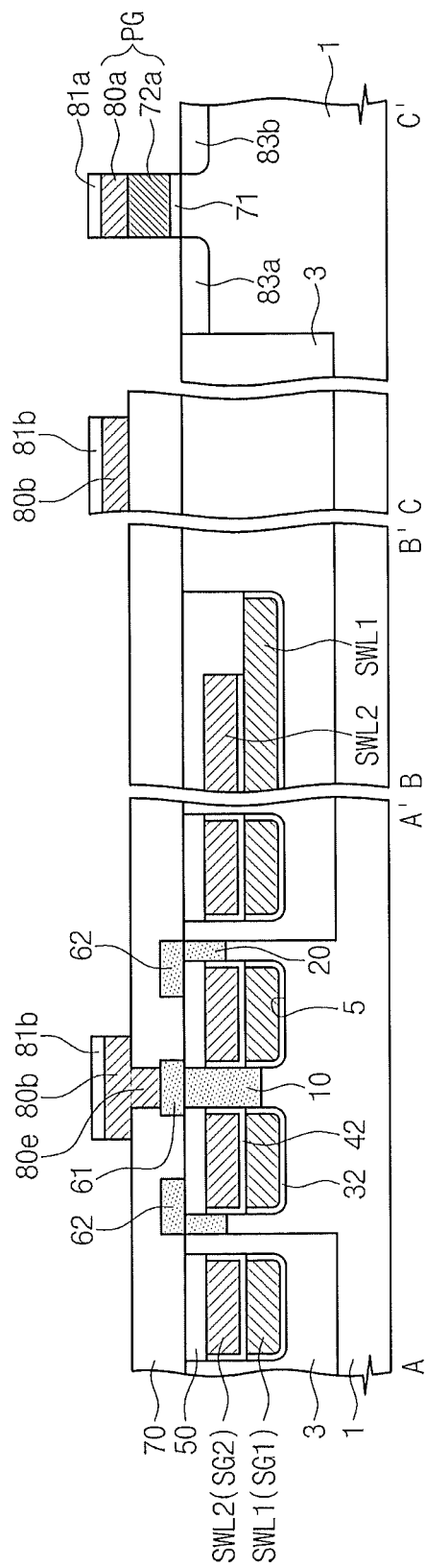

Referring to FIG. 22, in the cell array region CAR, the second capping layer 81 and the bitline 80 are patterned to form a bitline 80b and a second capping layer 81b thereon. At this point, a bitline contact 80e is formed in the bitline contact hole 70a. In the peripheral circuit region PCR, the second capping layer 81, the bitline layer 80, and the first peripheral gate layer 72 are successively patterned to form a first peripheral gate pattern 72a, a second peripheral gate pattern 80a, and a third capping pattern 81a that are stacked in the order named. In the peripheral circuit region PCR, first and second impurity-implanted regions 83a and 83b are formed on the substrate 1 using the third capping pattern 81a as an ion implantation mask. The second peripheral gate pattern 80a and the bitline 80b may thus be simultaneously formed of the same material.

Figure 23:
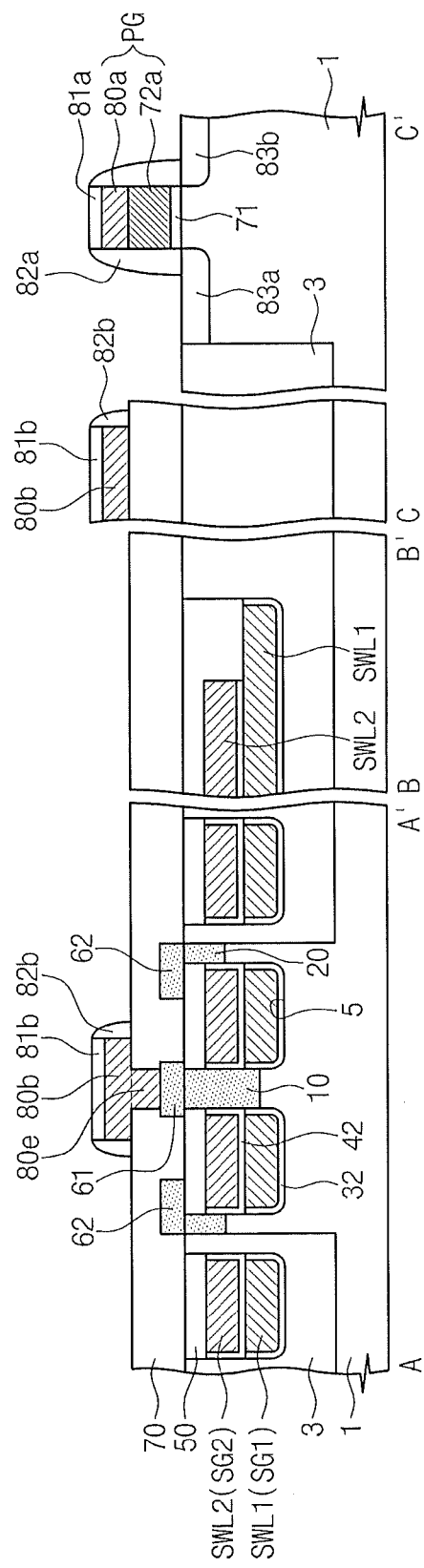

Referring to FIG. 23, an insulating spacer layer is conformally formed on the entire surface of the substrate 1 and then anisotropically etched to form a first insulating spacer 82a covering the sidewall of the bitline 80b and a second insulating spacer 82a covering the sidewall of the peripheral gate PG. The first and second insulating spacers 82b and 82a may each be formed of for example, silicon nitride, silicon oxynitride, and/or silicon oxide.

Figure 24:
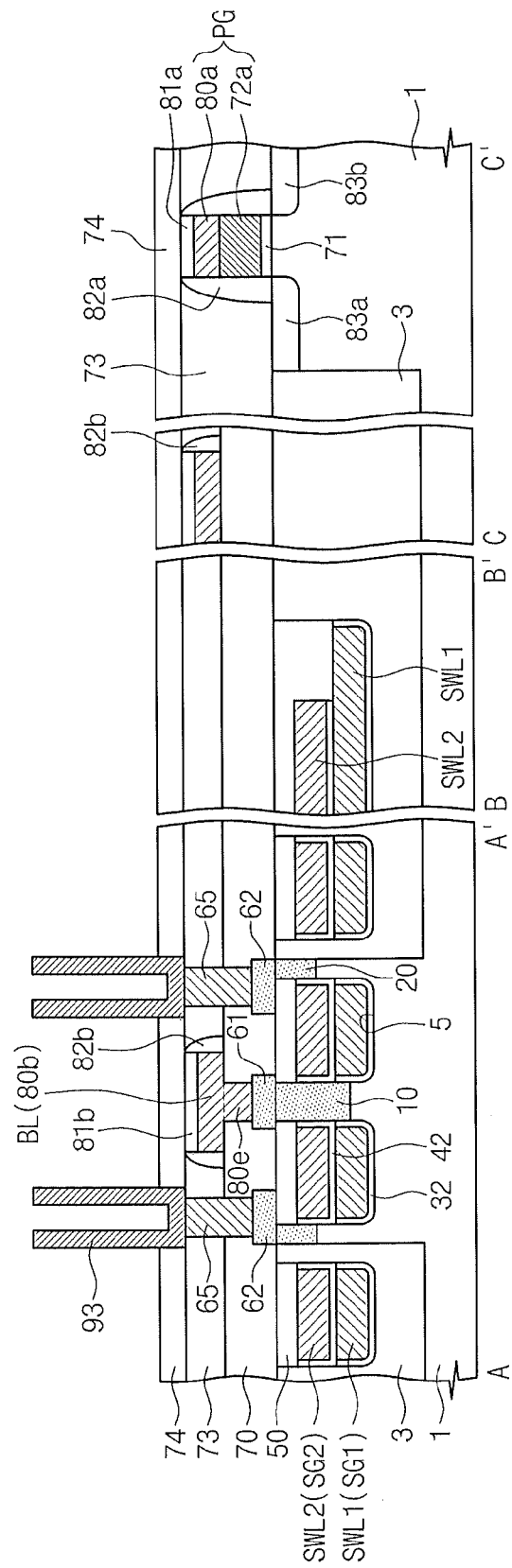

Referring to FIG. 24, after a second interlayer dielectric 73 is formed on the substrate 1, a planarization process is performed to expose top surfaces of the second and third capping patterns 81b and 81a. In the cell array region CAR, a bottom electrode contact 65 is formed connected to the second pad 62 through the second interlayer dielectric 73 and the first interlayer dielectric 70. Even when the bottom electrode contact 65 is formed, a probability of misalignment is reduced because the second pad 62 may have a relatively large area. A support layer 74 is formed on the second interlayer dielectric 73. The support layer 74 may be formed of silicon oxide, silicon nitride, or silicon oxynitride. Bottom electrodes 93 are formed connected to bottom electrode contacts 65 through the support layer 74. Each of the bottom electrodes 93 may exhibit a cup shape.

Returning to FIG. 5, in the cell array region CAR, a dielectric layer 92 and a top electrode 91 are formed to conformally cover the bottom electrodes 93. Thus, capacitors CA are completed. A first sub-wordline end contact 76 and a second sub-wordline end contact 75 are formed respectively connected to the end of the first sub-wordline SWL1 and the end of the second sub-wordline SWL2 through the support layer 74, the second interlayer dielectric 73, the first interlayer dielectric 70, and the first capping pattern 50. In the peripheral circuit region PCR, a peripheral contact 78 is formed connected to the first peripheral source/drain region 83a through the support layer 74 and the second interlayer dielectric 73. A bitline voltage applying interconnection 84 is formed on the support layer 74 to connect the bitline end contact 77 to the peripheral contact 78. As a result, a semiconductor device shown in FIG. 5 may be formed.

Embodiment 2

Figure 25:
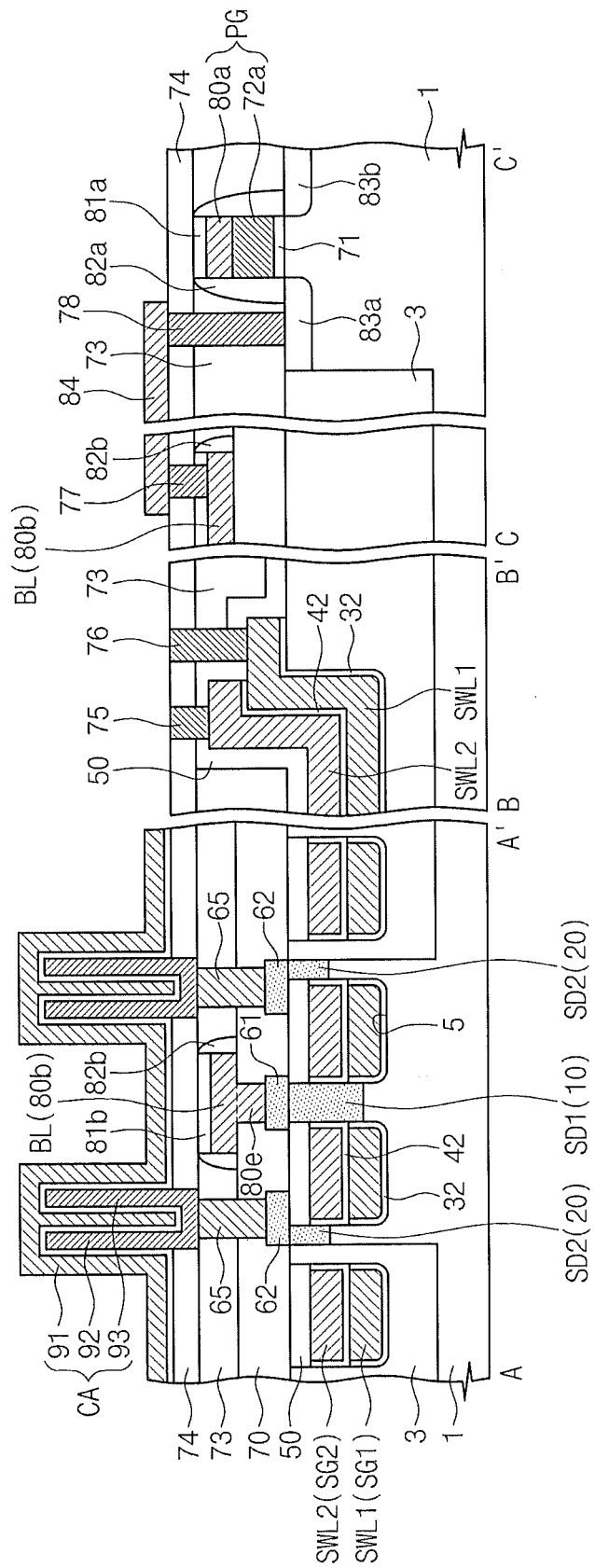
FIG. 25 is a cross-sectional view taken along lines A-A', B-B', and C-C' in FIG. 4 according to second embodiments of inventive concepts.

FIG. 25 is a cross-sectional view taken along lines A-A', B-B', and C-C' in FIG. 4 according to second embodiments of inventive concepts.

Referring to a B-B' section, the end of a first sub-wordline SWL1 and the end of a second sub-wordline SWL2 may extend to a surface of the substrate 1 outside a groove 5. The end of the first sub-wordline SWL1 and the end of the second sub-wordline SWL2 may form a step shape. A first capping pattern 50 covers not only a top surface of the end of the first sub-wordline SWL1 but also a top surface and a side surface of the end of the second sub-wordline SWL2. The first capping pattern 50 adjacent to the end of the first sub-wordline SWL1 may not be in contact with a first interlayer dielectric 70 but may be in contact with both a second interlayer dielectric 73 and a support layer 74. A first sub-wordline end contact 76 and a second sub-wordline end contact 75 are connected to the end of the first sub-wordline SWL1 and the end of the second sub-wordline SWL2 through the support layer 74 and the first capping pattern 50, respectively. Other configurations and operations may be the same as in the first embodiment.

FIGS. 26 to 31 are cross-sectional views illustrating a procedure of fabricating a semiconductor device having a cross section shown in FIG. 23.

Referring to FIG. 26 (which is similar to the structure of FIG. 10) a first sacrificial layer 7 is formed to fill a groove 5 and then planarized to form a fourth mask pattern M4 on the first sub-gate layer 30 in a region where the end of the first sub-wordline SWL1 is formed. The fourth mask pattern M4 is formed to overlap the edge of the groove 5 and the substrate 1 at a predetermined distance.

Referring to FIG. 27, the first sub-gate layer 30 and the first sacrificial layer 7 are anisotropically etched using the fourth mask pattern M4 as an etch mask. In this case, the anisotropic etching is performed with an etch process recipe having no significant etch selectivity with respect to the first sacrificial layer 7 and the first sub-gate layer 30. Thus, a first sub-wordline (SWL1, SG1) is formed in the groove 5. Since the end of the first sub-wordline (SWL1, SG1) is not etched due to protection of the overlying first mask pattern M4, an end of the first sub-wordline (SWL1, SG1) is formed to protrude onto the substrate 1. The fourth mask pattern M4 is removed.

Figure 28:
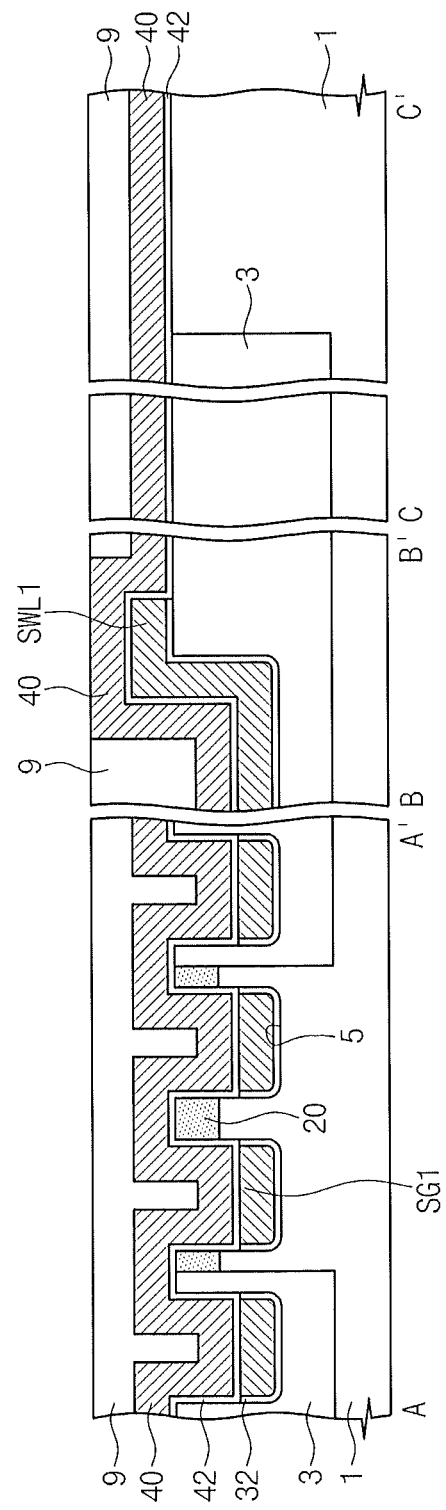

Referring to FIG. 28, a second insulating layer 42 and a second sub-gate layer 40 are conformally formed on the substrate 1. And a second sacrificial layer 9 is formed to fill the groove 5. The second sacrificial layer 9 is planarized to expose a top surface of the second sub-gate layer 40. Since an end of the first sub-wordline SWL1 protrudes onto a surface of the substrate 1, a height of the second sub-gate layer 40 may be greatest on this portion. Thus, the planarization process is performed to expose a top surface of the second sub-gate layer 40 on this portion.

Figure 29:
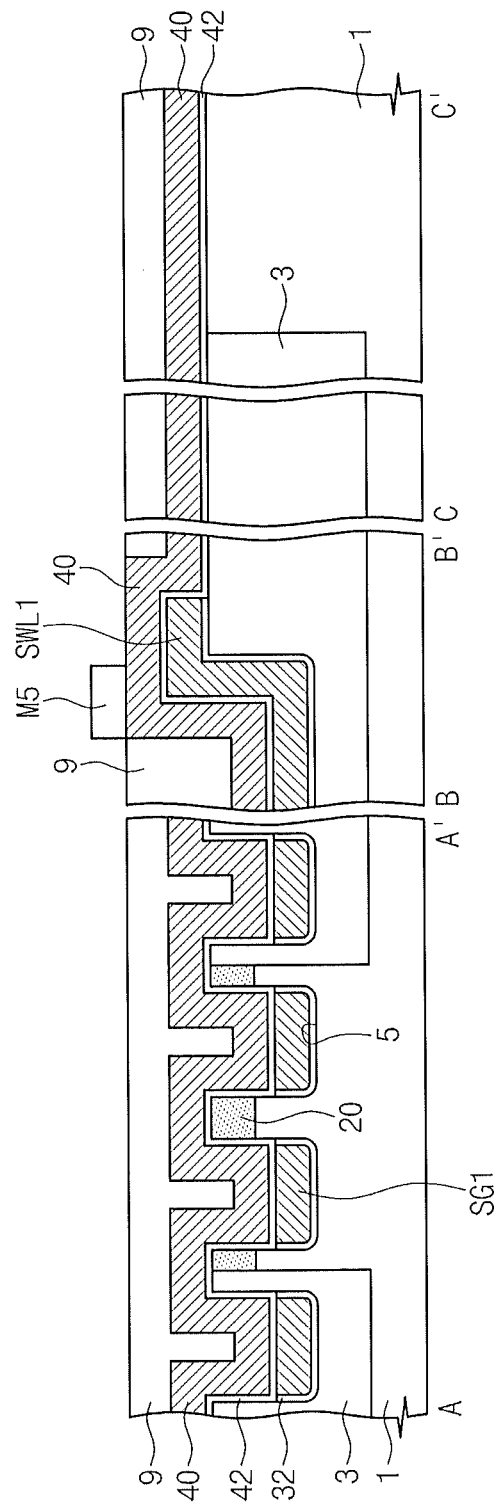

Referring to FIG. 29, a fourth mask pattern M5 is formed on the exposed top surface of the second sub-gate layer 40. The fifth mask pattern M5 may be formed to be narrower than the fourth mask pattern M4.

Figure 30:
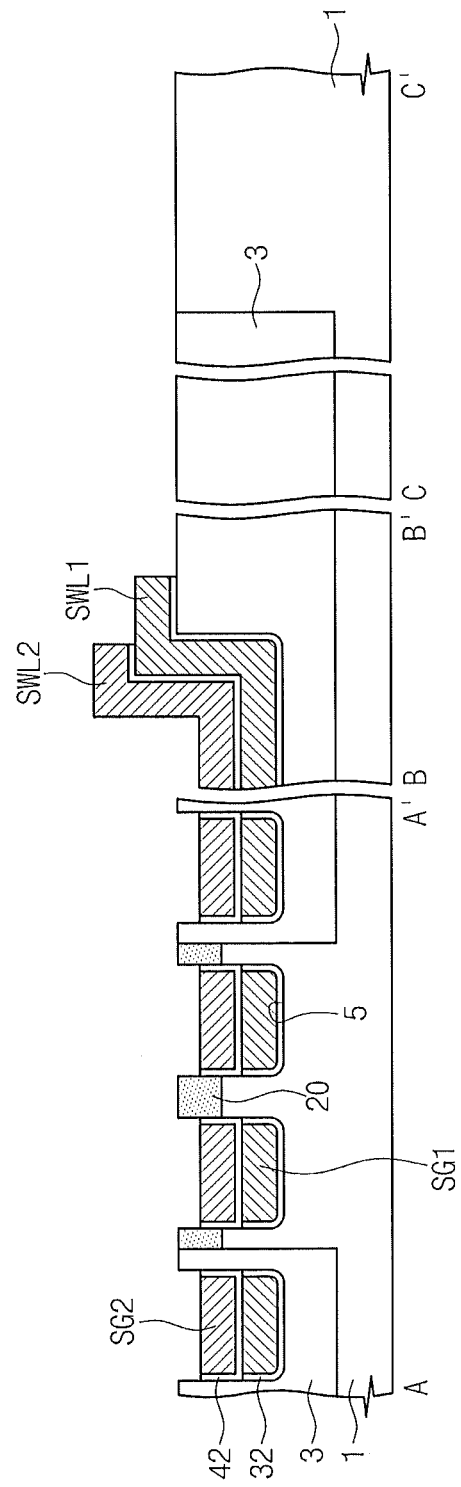

Referring to FIG. 30, the second sub-gate layer 40 and the second sacrificial layer 9 are anisotropically etched using the fifth mask pattern M5 as an etch mask to form a second sub-wordline (SWL2, SG2) in the groove 5. The end of the second sub-wordline SWL2 is formed to expose the end of the first sub-wordline SWL1. The fifth mask pattern M5 is removed.

Figure 31:
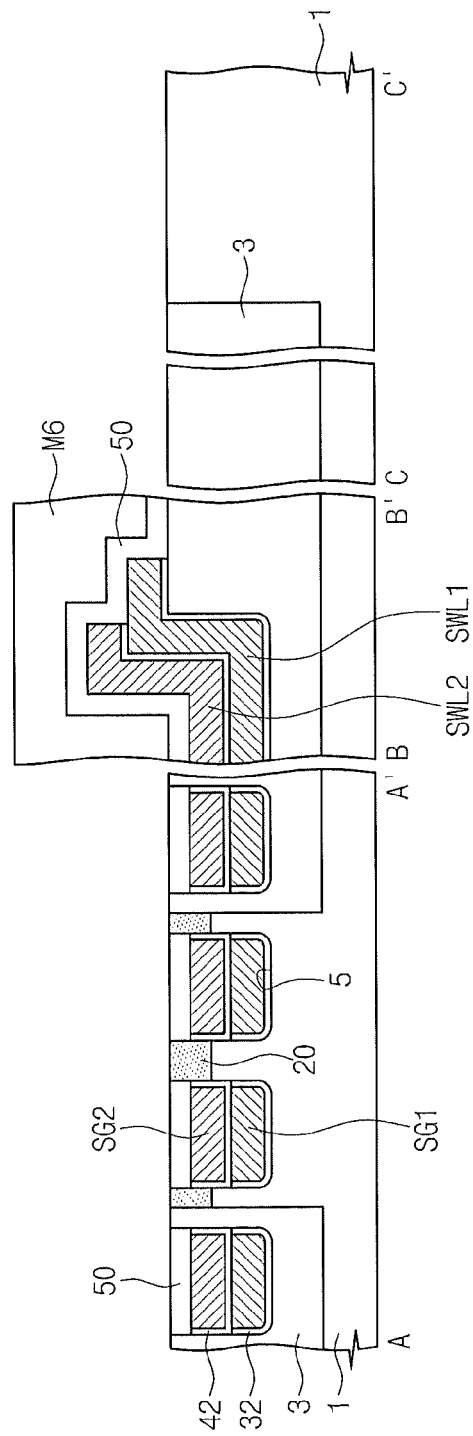

Referring to FIG. 31, a first capping pattern 50 is formed on the entire surface of the substrate 1. A sixth mask pattern M6 is formed to cover the ends of the first sub-wordline SWL1 and the second sub-wordline SWL2. A first capping pattern 50 is formed in the groove 5 using an anisotropic etchback process using the sixth mask pattern M6 as an etch mask. The first capping pattern 50 may be formed to conformally cover the ends of the first and second sub-wordlines SWL1 and SWL2.

In a subsequent process, the sixth mask pattern M6 is removed. And the same (or similar) process as in the first embodiment may be performed to form the semiconductor device shown in FIG. 25.

Embodiment 3

Figure 32:
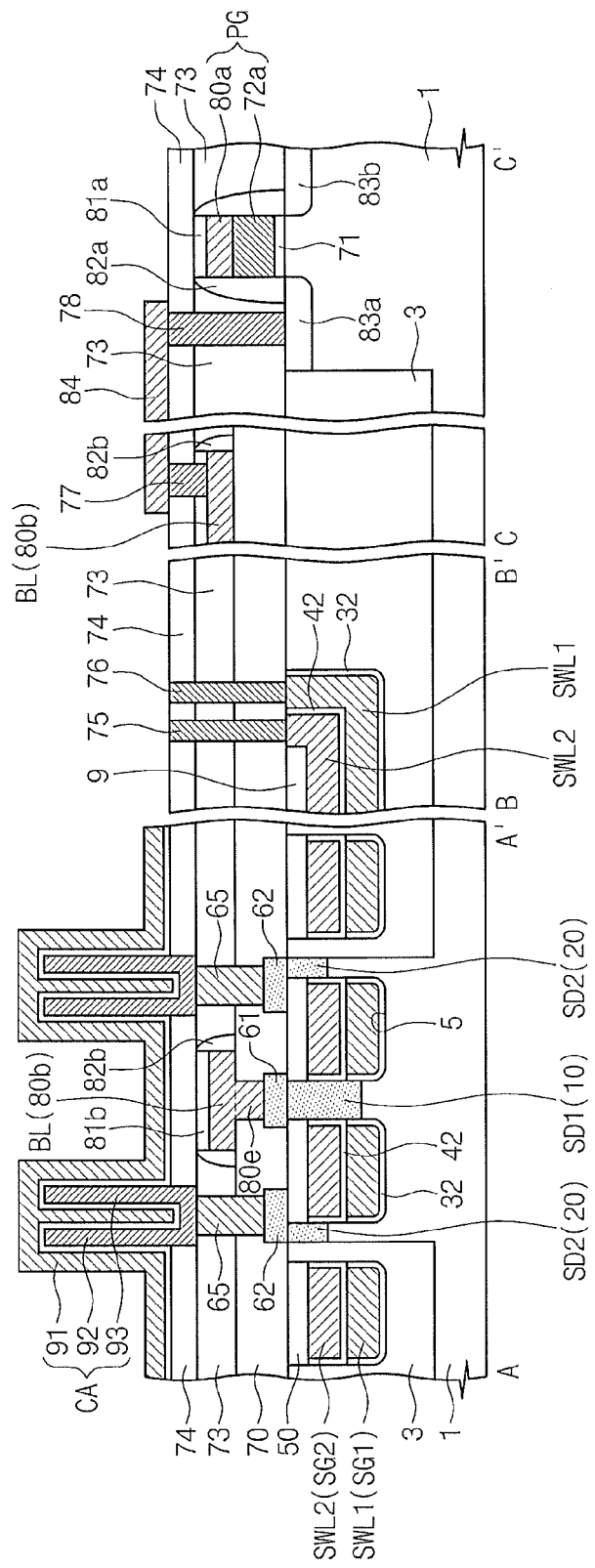
FIG. 32 is a cross-sectional view taken along lines A-A', B-B', and C-C' in FIG. 4 according to third embodiments of inventive concepts.

FIG. 32 is a cross-sectional view taken along lines A-A', B-B', and C-C' in FIG. 4 according to third embodiments of inventive concepts.

Referring to a B-B' section in FIG. 32, the ends of a first sub-wordline SWL1 and a second sub-wordline SWL2 are disposed within a groove 5 and do not protrude onto a surface of a substrate 1. The ends of the first sub-wordline SWL1 and the second sub-wordline SWL2 may each have an L-shaped section. A top surface of the end of the first sub-wordline SWL1 may be coplanar with that of the end of second sub-wordline SWL2. The end of the second sub-wordline SWL2 may not be covered with the first capping pattern 50, and a second sacrificial layer 9 may remain. A first sub-wordline end contact 76 and a second sub-wordline end contact 75 may be connected to the end of the first sub-wordline SWL1 and the end of the second sub-wordline SWL2 through a support layer 74, a second interlayer dielectric 73, and a first interlayer dielectric 70. Other configurations and operations may be the same (or similar) to those of the first embodiments.

FIGS. 33 to 38 are cross-sectional views illustrating a procedure of fabricating a semiconductor device having a cross section shown in FIG. 32.

Figure 33:
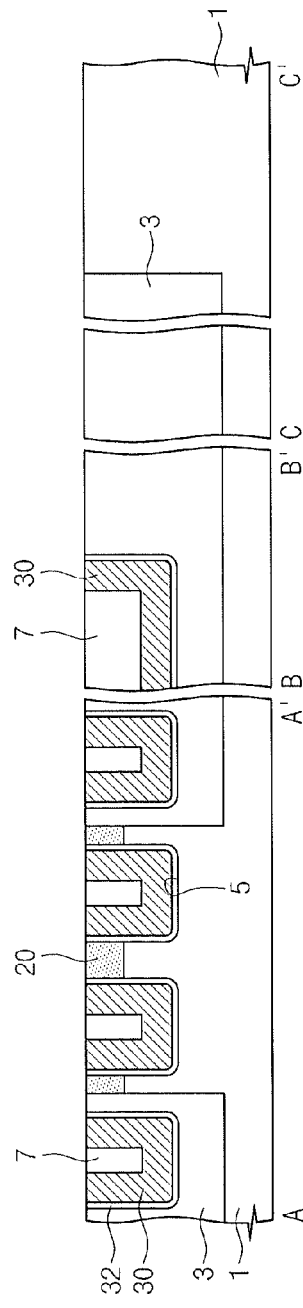
FIGS. 33 to 38 are cross-sectional views illustrating operations of fabricating a semiconductor device having a cross section shown in FIG. 32.

Referring to FIG. 33 (which is similar to the structure of FIG. 10) a first sacrificial layer 7 is formed to fill the groove 5 and then planarized. Thereafter, the first sacrificial layer 7 and a first sub-gate layer 30 are planarized to expose top surfaces of the substrate 1 and an isolation layer 3 while maintaining the first sacrificial layer 7 and the first sub-gate layer 30 in the groove 5. Thus, a top surface of the end of the first sub-gate layer 30 may be coplanar with that of the substrate 1.

Figure 34:
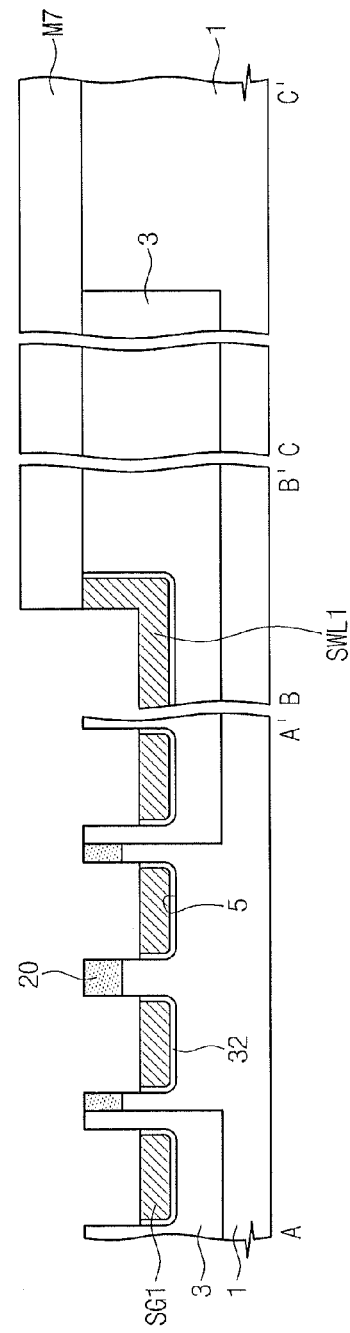

Referring to FIG. 34, a seventh mask pattern M7 is formed on the substrate 1. The seventh mask pattern M7 is formed to cover a peripheral circuit region PCR and the end of the first sub-gate layer 30. The first sub-gate layer 30 and the first sacrificial layer 7 are anisotropically etched using the seventh mask pattern M7 as an etch mask to form a first sub-gate SG1 (or a first sub-wordline SWL1) in the groove 5.

Figure 35:
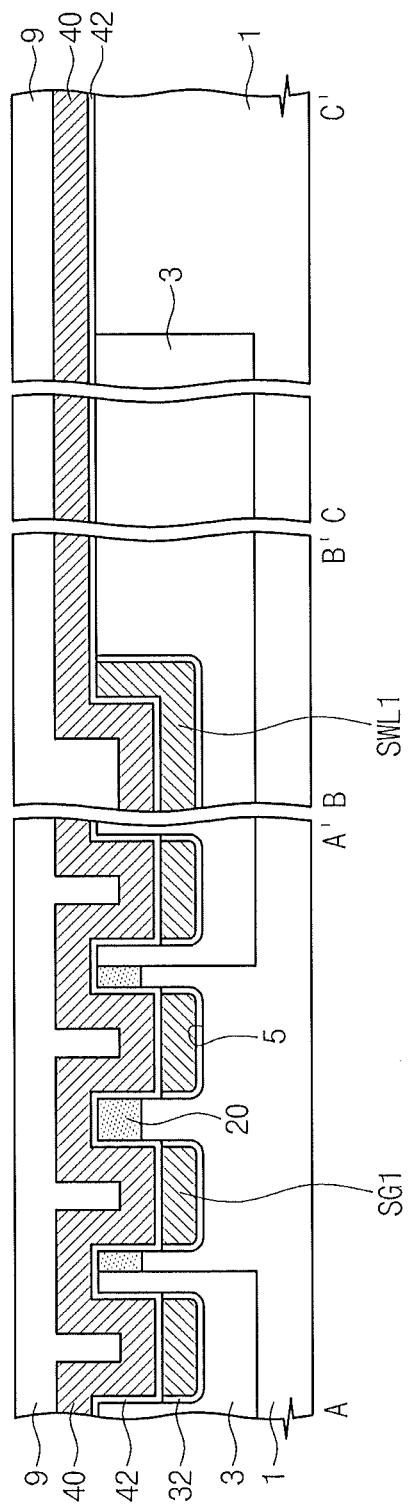

Referring to FIG. 35, the seventh mask pattern M7 is removed. A second gate insulator 42 and a second sub-gate layer 40 are conformally formed on the substrate 1. And a second sacrificial layer 9 is formed to fill the groove 5.

Figure 36:
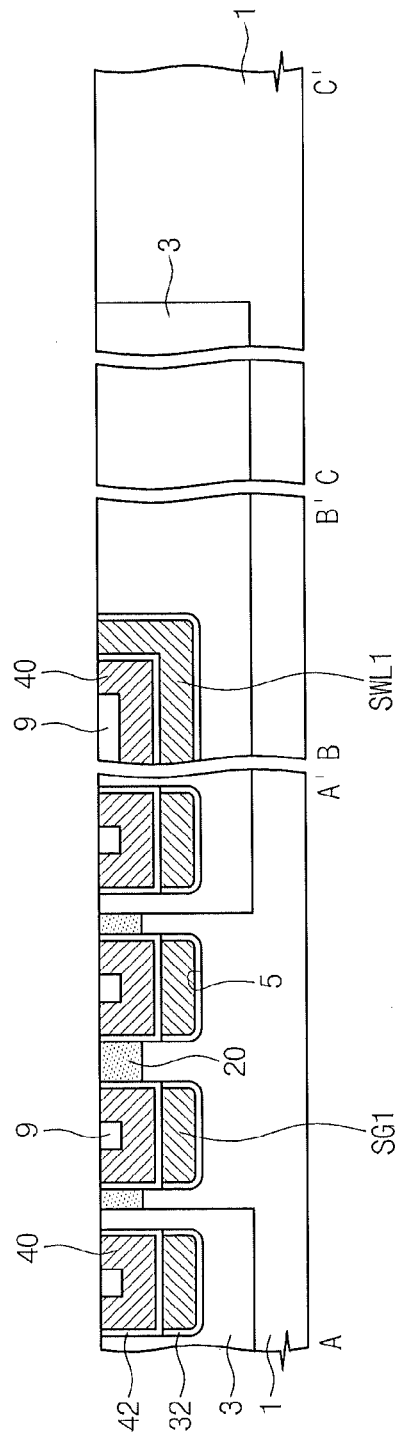

Referring to FIG. 36, the second sacrificial layer 9 and the second sub-gate layer 40 are planarized to expose the surfaces of the substrate 1 and the isolation layer 3 while making the second sacrificial layer 9 and the second sub-gate layer 40 remain within the groove 5. Thus, a top surface of the end of the second sub-gate layer 40 may be coplanar with that of the substrate 1.

Figure 37:
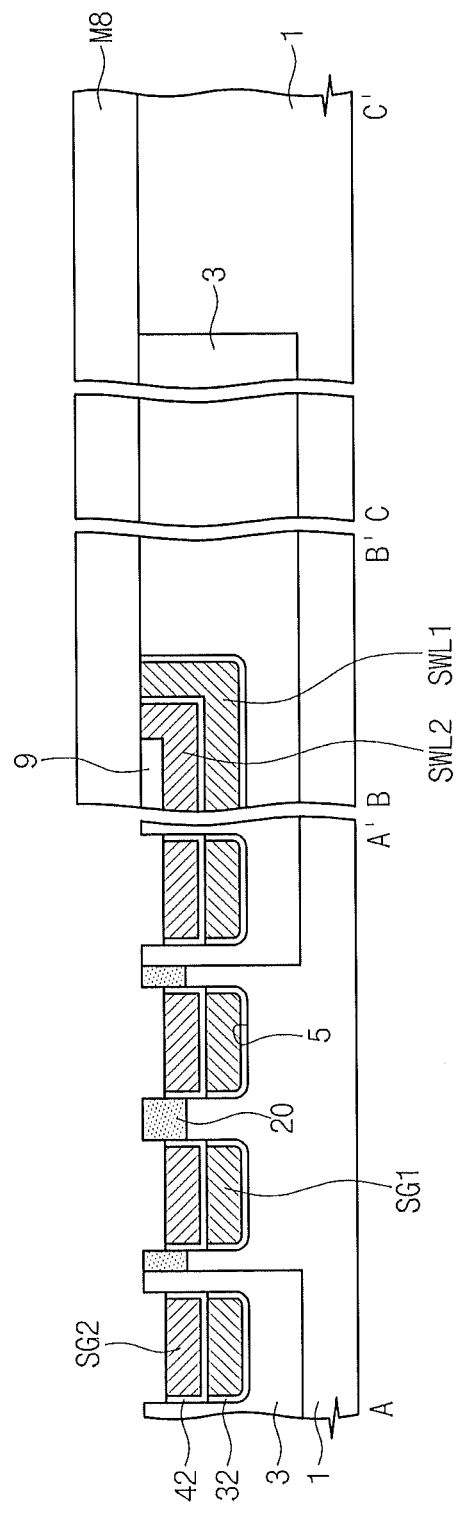

Referring to FIG. 37, an eighth mask pattern M8 is formed on the substrate 1. The eighth mask pattern M8 is formed to cover a peripheral circuit region PCR and the end of the second sub-gate layer 40. The second sub-gate layer 40 and the second sacrificial layer 9 are anisotropically etched using the eighth mask pattern M8 as an etch mask to form a second sub-gate SG2 (or a second sub-wordline SWL2) in the groove 5.

Figure 38:
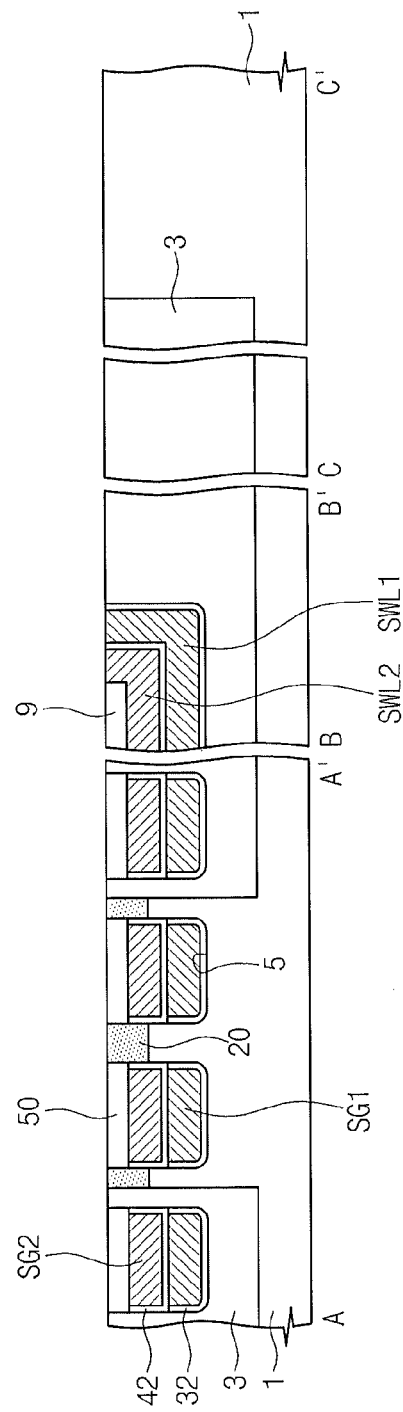

Referring to FIG. 38, the eighth mask pattern M8 is removed. A first capping layer is stacked on the substrate 1 and then planarized to form a first capping pattern 50 in the groove 5 and expose top surfaces of the first and second sub-wordlines SWL1 and SWL2. In this case, the second sacrificial layer 9 below the eighth mask pattern M8 may be maintained.

Other formation operations may be the same (or similar) as in the first embodiment.

Embodiment 4

Figure 39:
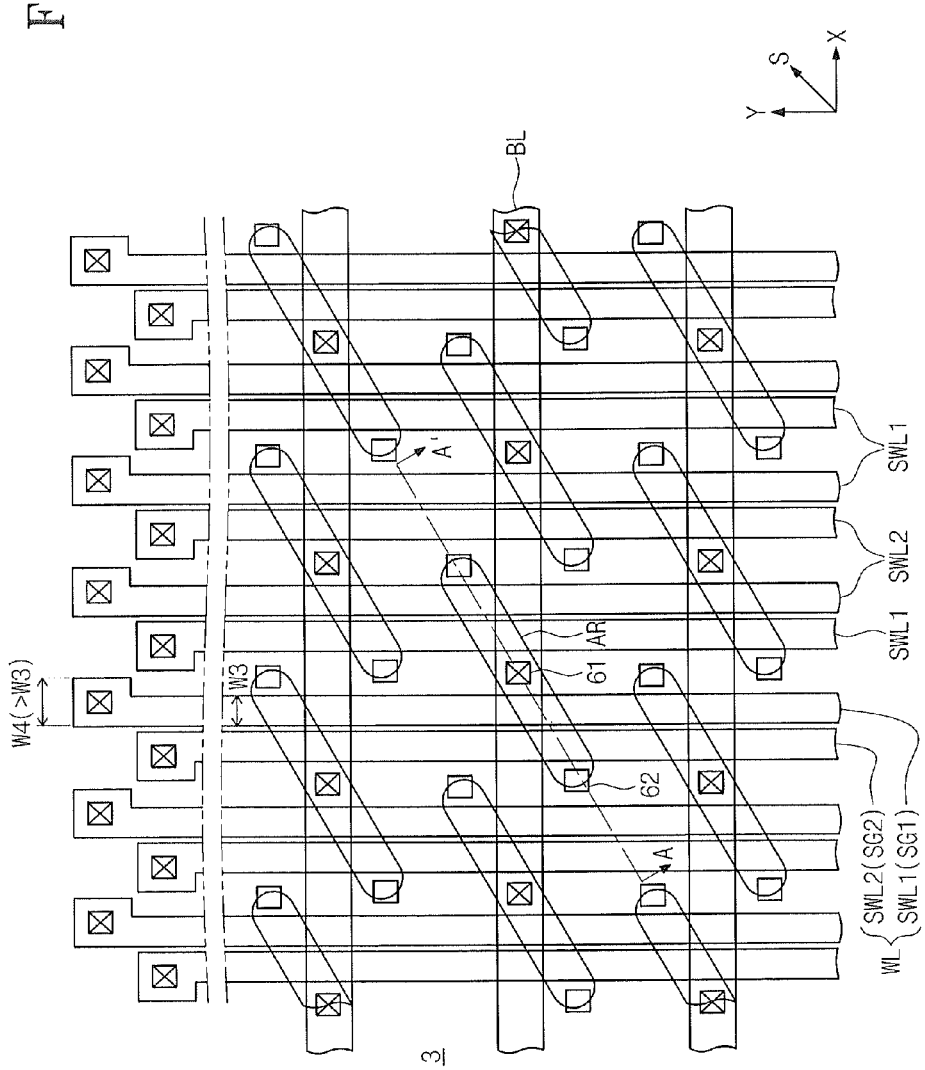
FIG. 39 is a top plan view of a semiconductor device according to fourth embodiments of inventive concepts.
Figure 40:
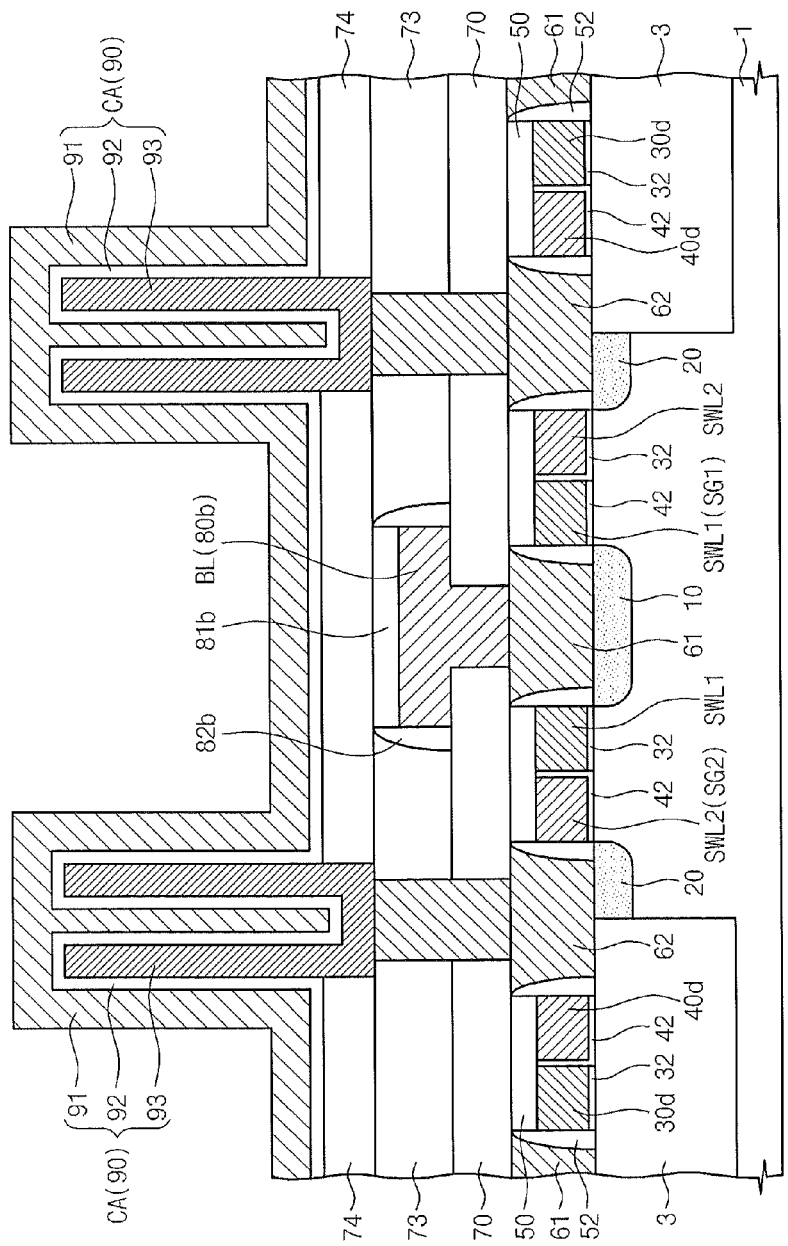
FIG. 40 is a cross-sectional view taken along a line A-A' in FIG. 39.

FIG. 39 is a top plan view of a semiconductor device according to fourth embodiments of inventive concepts, and FIG. 40 is a cross-sectional view taken along a line A-A' in FIG. 39. A semiconductor device according to fourth embodiments may be a DRAM device in which a channel is formed in a horizontal direction.

Referring to FIGS. 39 and 40, an isolation layer (FOX) 3 on substrate 1 defines active region AR. Only a cell array region is shown in FIGS. 39 and 40 while a peripheral circuit region is not shown, because the peripheral circuit region is the same (or similar) as in the first embodiments. A plurality of parallel bitlines BL (80b) are arranged on the substrate 1 to extend in a first direction X when viewed in plane. A plurality of parallel wordlines WL are arranged on the substrate 1 to extend in a second direction Y orthogonal to the first direction X when viewed in plane. Active regions AR are provided at intersections of the wordlines WL and the bitlines BL. The active regions AR have a bar shape when viewed in plane and may be provided to be long in a third direction S non-perpendicular to both the first direction X and the second direction Y. A fourth direction Z is a direction orthogonal to all the first, second, and third directions X, Y, and S. In FIG. 40, a section taken along the line A-A' denotes a Z-S section. Each of the wordlines WL includes a first sub-wordline SWL1 and a second sub-wordline SWL2 that are horizontally arranged in parallel.

A first sub-gate SG1 extends in the second direction Y to provide the first sub-wordline SWL1. A second sub-gate SG2 extends in the second direction Y to provide the second sub-wordline SWL2. The first sub-gate SG1 is disposed at one side of the second sub-gate SG2. A first gate insulator 32 is provided between the first sub-gate SG1 and the substrate 1, and a second gate insulator 42 is provided between the second sub-gate SG2 and the substrate 1. The second gate insulator 42 extends between the first sub-gate SG1 and the second sub-gate SG2. Two adjacent wordlines WL may be symmetrically arranged on opposite sides of bit-line pad 61. A width W4 of the end of the first sub-wordline SWL1 is greater than a width W3 of the first sub-wordline SWL1. A width of the end of the second sub-wordline SWL2 is greater than that of the second sub-wordline SWL2. A length of the first sub-wordline SWL1 may be different from that of the second sub-wordline SWL2. For example, the first sub-wordline SWL1 may be longer than the second sub-wordline SWL2. Ends of first and second sub-wordlines SWL1 and SWL2 may be provided in a zigzag pattern. The end width and arrangement of the first and second sub-wordlines SWL1 and SWL2 make reduce complexity of subsequent processes during formation of contact to apply voltages to the first and second wordlines SWL1 and SWL2.

A first impurity-implanted region SD1 (10) is formed in the substrate 1 between two adjacent first sub-gates SG1. A second impurity-implanted region SD2 (20) is formed in the substrate 1 adjacent to the second sub-gates SG2. A first capping pattern 50 is provided on the wordlines WL, and the sidewall of the first capping pattern 50 is covered with a first insulating spacer 52. A first pad 61 and second pads 62 are disposed on the substrate 1 between adjacent wordlines WL. The first and second pads 61 and 62 cover sidewalls of the first insulating spacers 52. Other configurations and operations may be the same (or similar) as in the first embodiment.

FIGS. 41 to 45 are cross-sectional views illustrating operations of fabricating a semiconductor device having a cross section shown in FIG. 40.

Figure 41:
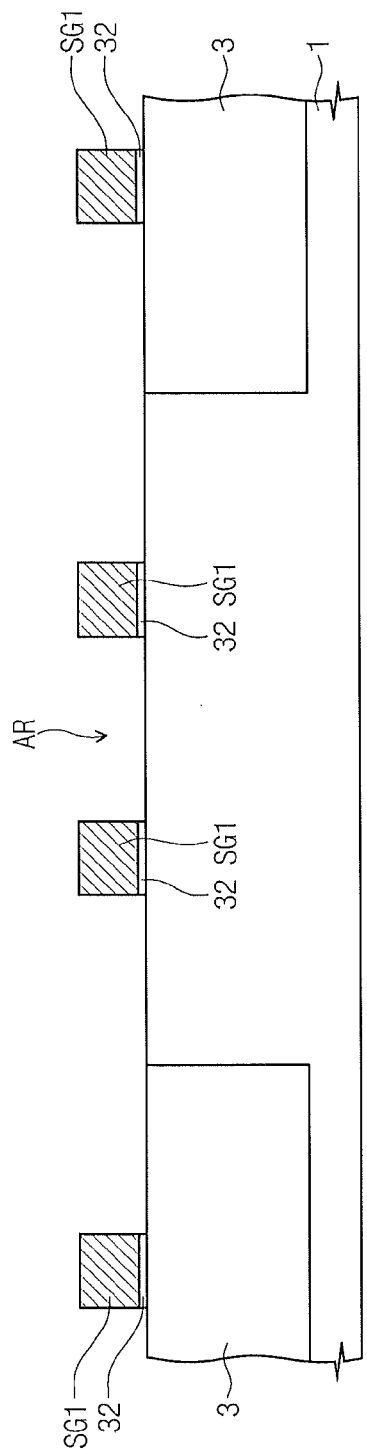
FIGS. 41 to 45 are cross-sectional views illustrating operations of fabricating a semiconductor device having a cross section shown in FIG. 40.

Referring to FIG. 41, an isolation layer 3 is formed on a substrate 1 to define an active region(s). A first gate insulator 32 is formed on the substrate 1. The first gate insulator 32 may be formed using of thermal oxidation. A first sub-gate layer is stacked on the first gate insulator 32 and then patterned to form a plurality of parallel first sub-wordlines (or first sub-gates) SG1 crossing over the substrate 1. The first sub-wordline SG1 may be formed of at least one selected from the group consisting of a doped semiconductor material (e.g., doped silicon, doped germanium, etc.), a conductive metal nitride (e.g., titanium nitride, tantalum nitride, etc.), a metal (e.g., tungsten, titanium, tantalum, etc.), and a metal-semiconductor compound (e.g., tungsten silicide, cobalt silicide, titanium silicide, etc.). During the patterning process, the first gate insulator 32 may be patterned to expose top surfaces of the substrate 1 and the isolation layer 3.

Figure 42:
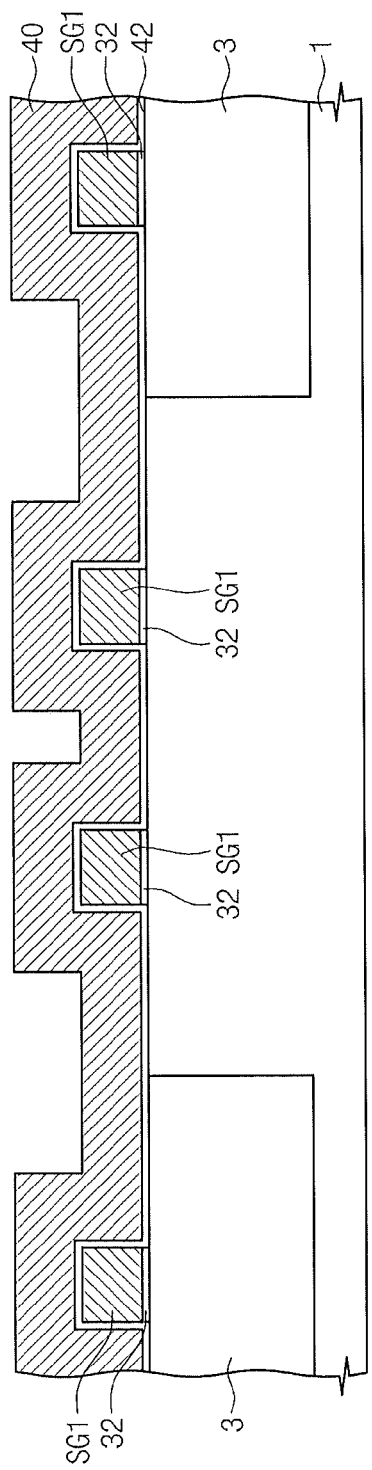

Referring to FIG. 42, a second gate insulator 42 and a second sub-gate layer 40 are conformally formed on the entire surface of the substrate 1 where the first sub-wordlines SG1 are formed. The second gate insulator 42 may be formed using a deposition such as atomic layer deposition (ALD). The second sub-gate layer 40 may be formed of the same (or similar) material as the first sub-gate layer 30.

Figure 43:
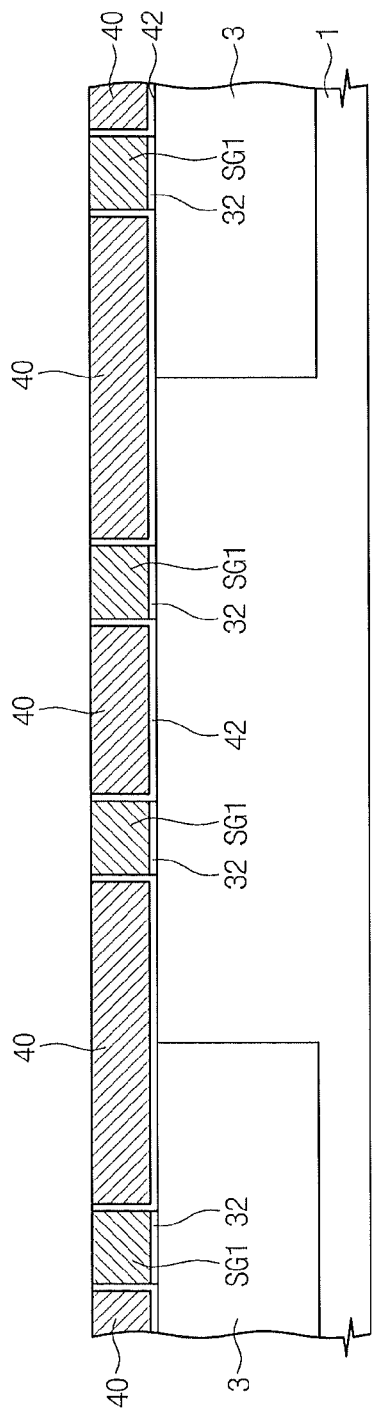

Referring to FIG. 43, the second sub-gate layer 40 is planarized to expose a top surface of the first sub-wordline SG1 while the second sub-gate layer 40 is formed to have a top surface coplanar with that of the first sub-wordline SG1.

Figure 44:
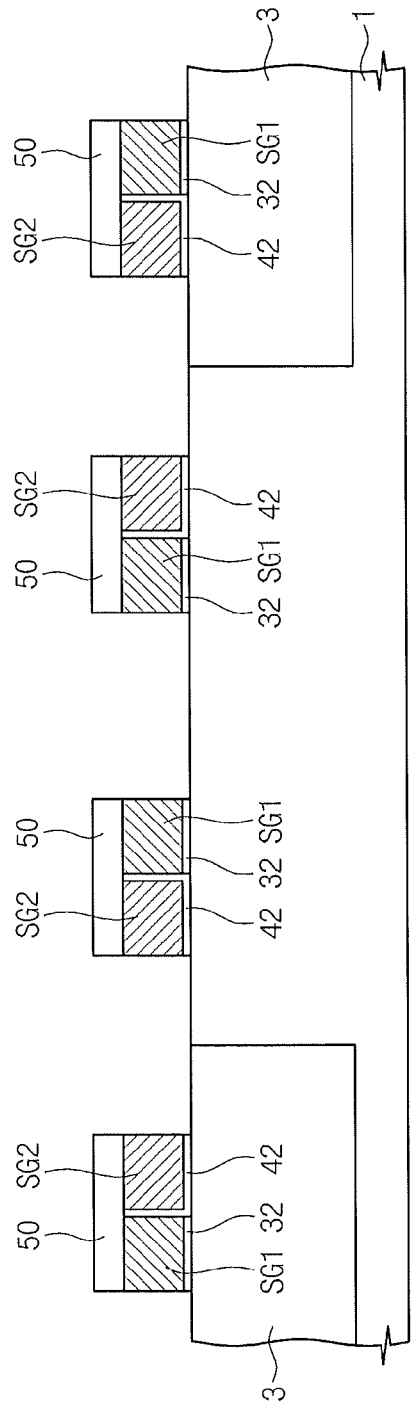

Referring to FIG. 44, a first capping pattern 50 is formed on the first sub-wordline SG1 and the second sub-gate layer 40. The second sub-gate layer 40 is etched using the first capping pattern 50 as an etch mask to form a second sub-gate SG2. During this etching, the second gate insulator 42 may also be etched. The second gate insulator 42 may have an L shape with portions thereof between the first sub-gate SG1 and the second sub-gate SG2.

Figure 45:
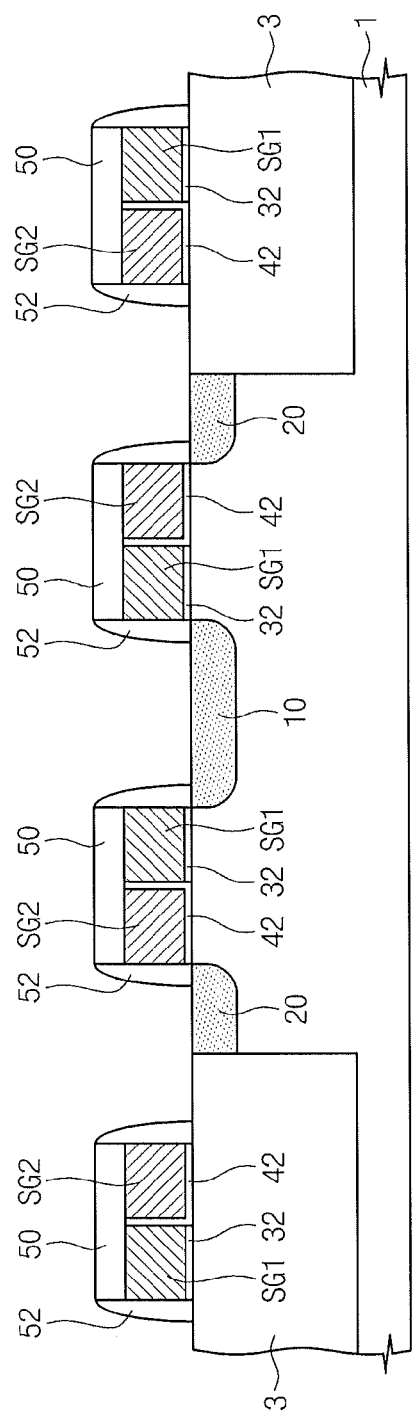

Referring to FIG. 45, impurities are doped into the substrate 1 using the first capping pattern 50 as an ion implantation mask to form a first impurity-implanted region 10 and a second impurity-implanted region 20 at the same time. An insulating spacer 52 is formed on the sidewalls of the sub-gates SG1 and SG2.

As a subsequent process, referring to FIG. 40, a conductive layer is stacked on the substrate 1 and then planarized and patterned to form first and second pads 61 and 62 aligned with the active region AR between the wordlines WL. A bitline BL and a capacitor CA may be formed in a manner similar to that of the first embodiment.

Embodiment 4

Figure 46:
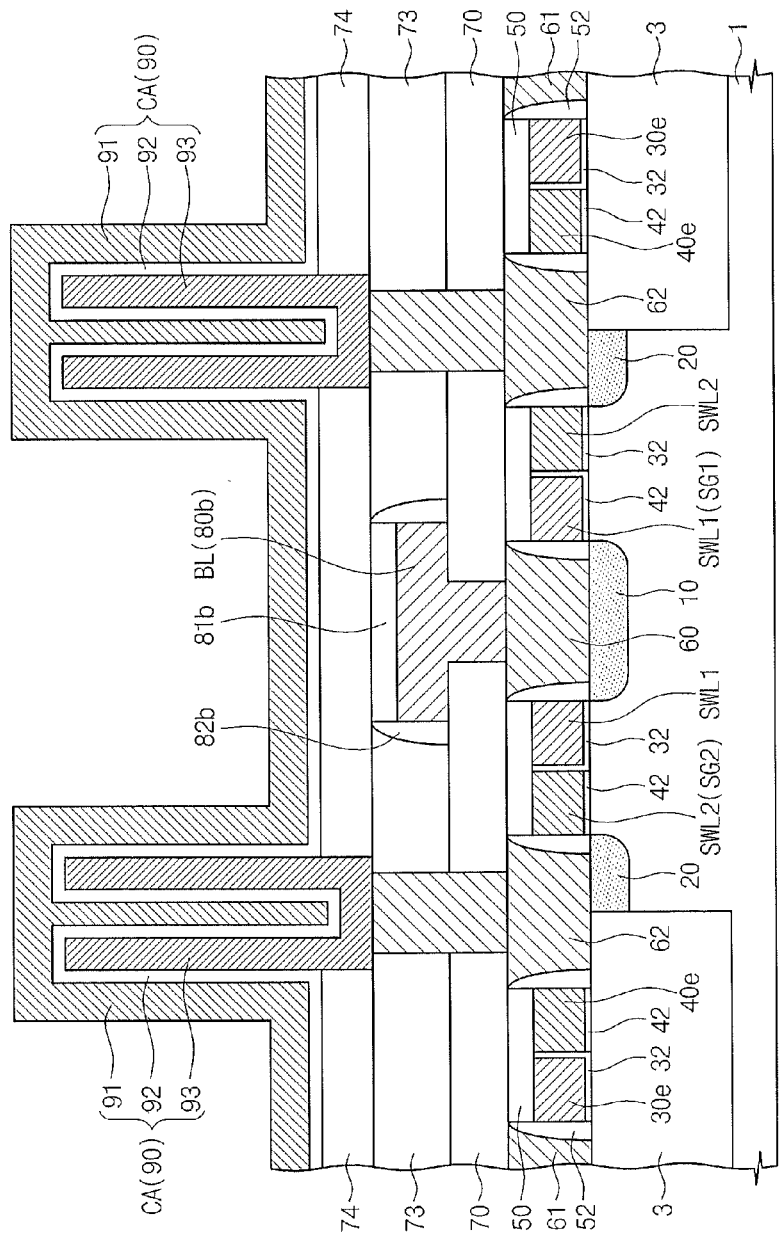
FIG. 46 is a cross-sectional view taken along a line A-A' in FIG. 39 according to fifth embodiments of inventive concepts.

FIG. 46 is a cross-sectional view taken along a line A-A' in FIG. 39 according to fifth embodiments of inventive concepts.

Referring to FIG. 46, a first gate insulator 32 is between a first sub-gate SG1 and a substrate 1. A second gate insulator 42 is between a second sub-gate SG2 and the substrate 1. The second gate insulator 32 has an L-shaped section so that portions thereof are also between a first sub-gate SG1 and a second sub-gate SG2. Other configurations and operations may be the same (or similar) as in the first embodiments.

FIGS. 47 to 50 are cross-sectional views illustrating a procedure of fabricating a semiconductor device having a cross section shown in FIG. 46.

Figure 47:
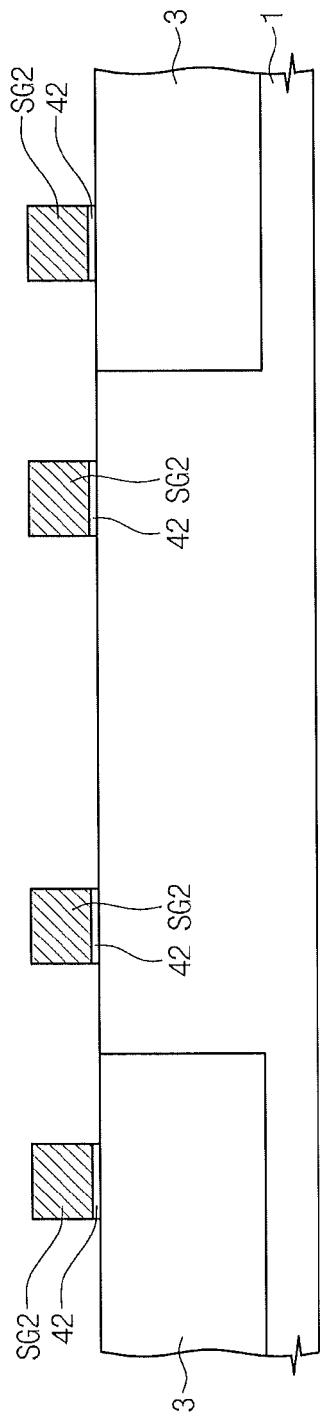
FIGS. 47 to 50 are cross-sectional views illustrating operations of fabricating a semiconductor device having a cross section shown in FIG. 46.

Referring to FIG. 47, an isolation layer 3 is formed on a substrate 1 to define an active region(s). A second gate insulator 42 is formed on the substrate 1. The second gate insulator 42 may be formed using of thermal oxidation. A second sub-gate layer is stacked on the second gate insulator 42 and then patterned to form a plurality of parallel second sub-wordlines (or second sub-gates) SG2 crossing over the substrate 1. During the patterning process, the second gate insulator 42 may be patterned to expose top surfaces of the substrate 1 and the isolation layer 3.

Figure 48:
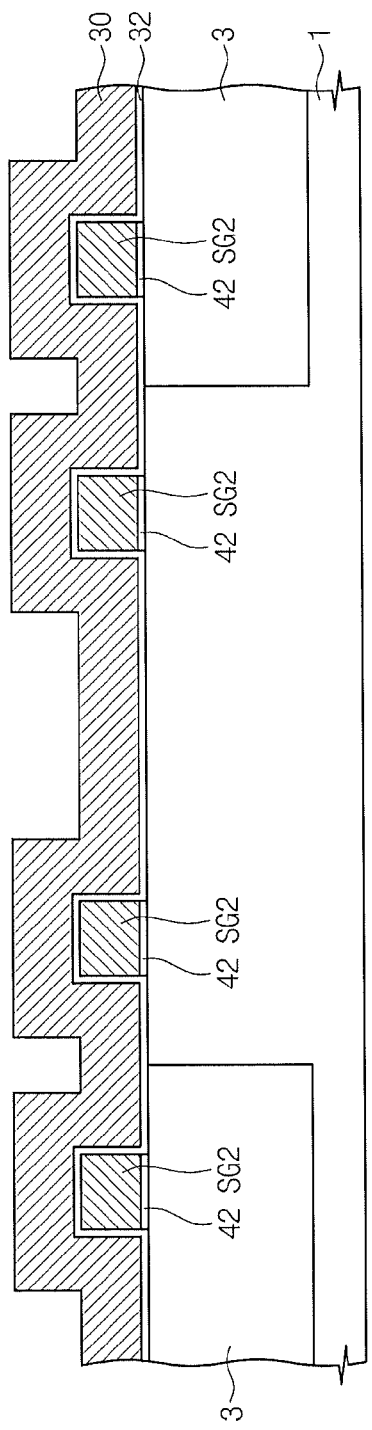

Referring to FIG. 48, a first gate insulator 32 and a first sub-gate layer 30 are conformally formed on the entire surface of the substrate 1 where the second sub-wordlines SG2 are formed. The first gate insulator 32 may be formed by means of deposition such as atomic layer deposition (ALD).

Figure 49:
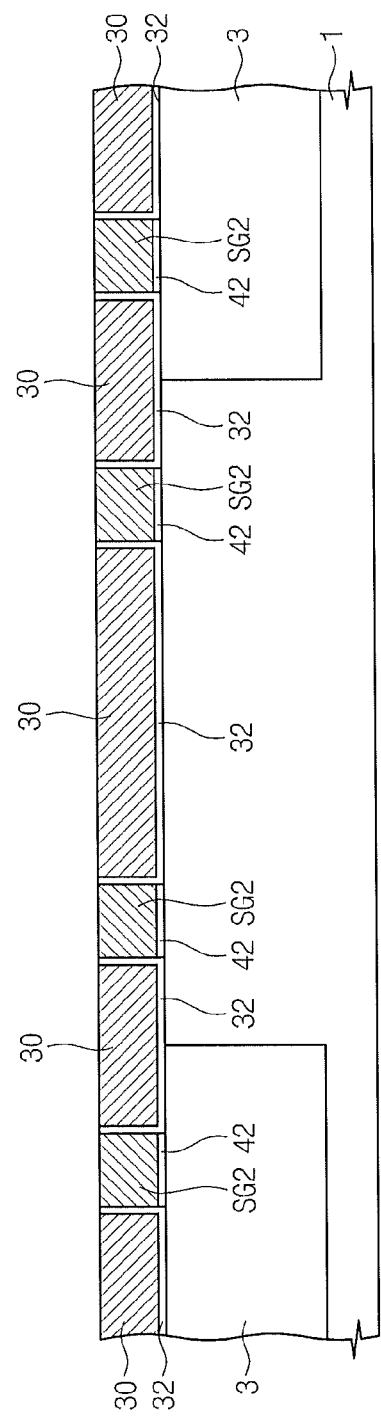

Referring to FIG. 49, the first sub-gate layer 30 is planarized to expose a top surface of the second sub-wordline SG2 while the first sub-gate layer 30 is formed to have a top surface coplanar with that of the second sub-wordline SG2.

Figure 50:
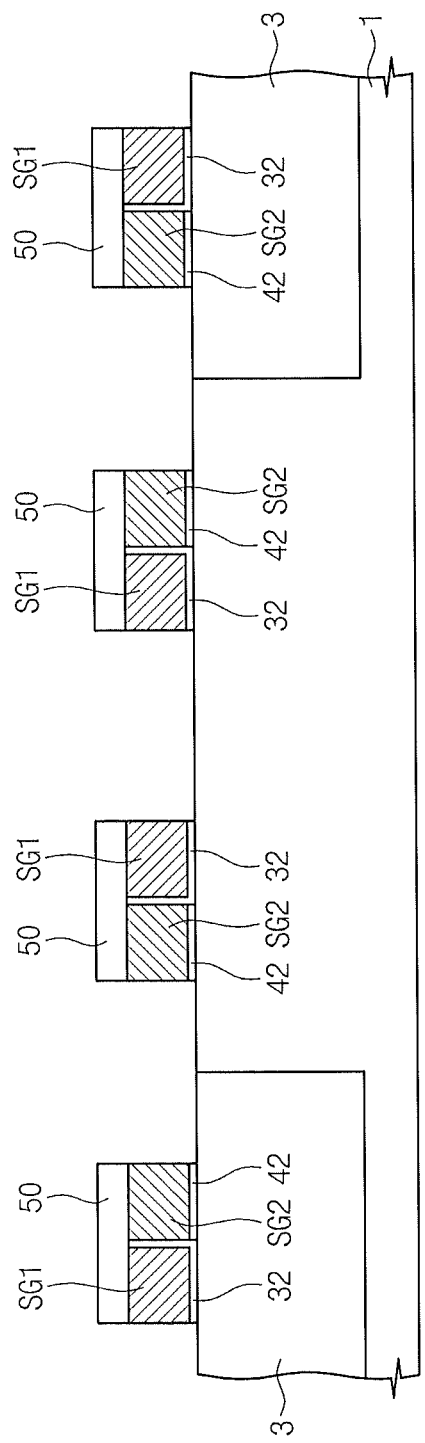

Referring to FIG. 50, first capping patterns 50 are formed on portions of the first sub-wordlines SWL2 and the first sub-gate layers 30. The first sub-gate layer 30 is etched using the first capping pattern 50 as an etch mask to form a first sub-gate SG1. During this etching, the first gate insulator 32 may also be etched. The first gate insulator 32 may have an L shape with portions thereof between the first sub-gate SG1 and the second sub-gate SG2. Subsequent operations may be, the same (or similar) as those of the fourth embodiments to form a semiconductor device having a section shown in FIG. 46.

Embodiment 6

Figure 51:
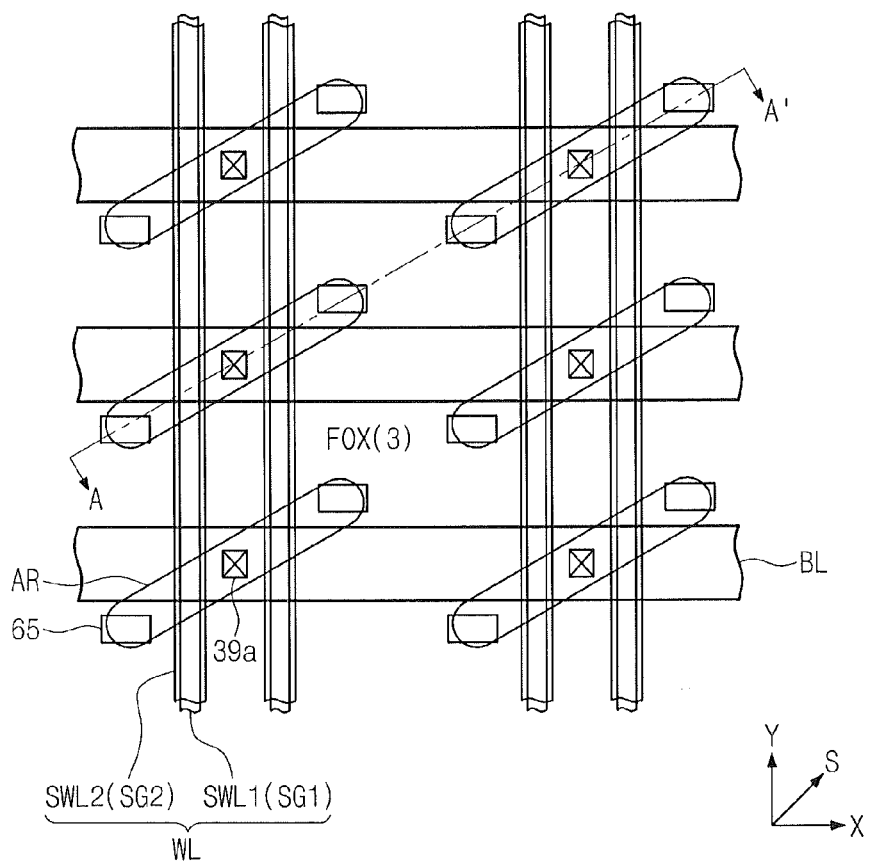
FIG. 51 is a top plan view of a semiconductor device according to sixth embodiments of inventive concepts.
Figure 52:
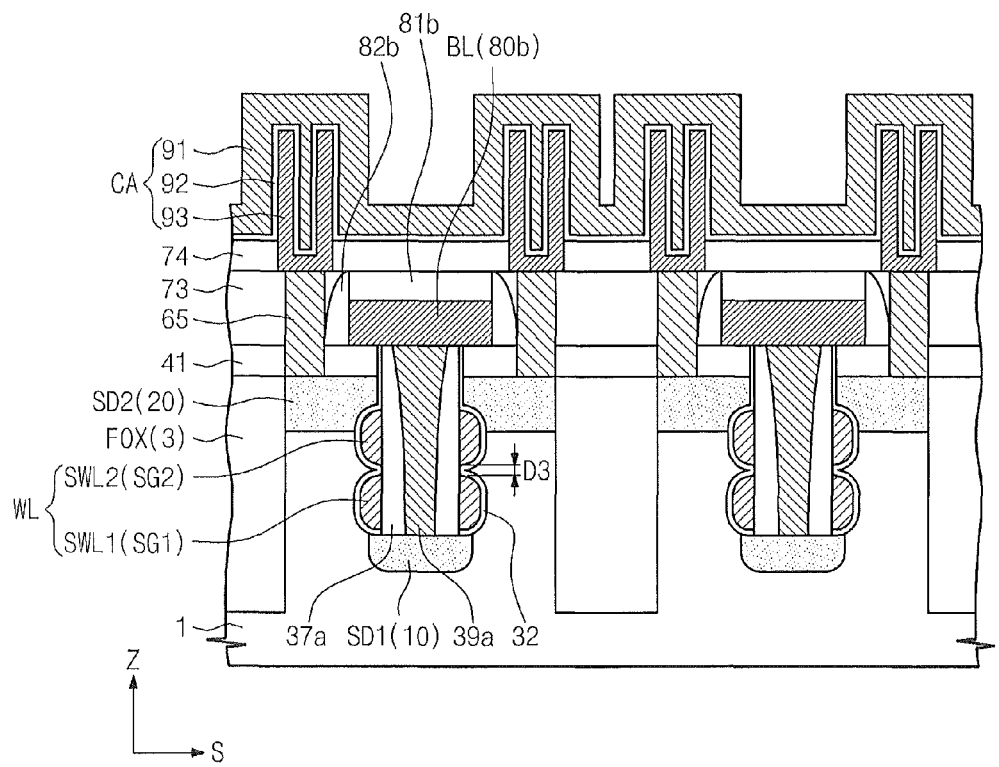
FIG. 52 is a cross-sectional view taken along a line A-A' in FIG. 51.

FIG. 51 is a top plan view of a semiconductor device according to sixth embodiments of inventive concepts, and FIG. 52 is a cross-sectional view taken along a line A-A' in FIG. 51. Sixth embodiments will now be described with respect to a DRAM device in which a channel is vertically formed.

Referring to FIGS. 51 and 52, a field isolation oxide layer (FOX) 3 is disposed on a substrate 1 to define an active region AR. Only a cell array region is shown in FIGS. 51 and 52 while a peripheral circuit region is not shown because the peripheral circuit region is the same as (or similar to) that of the first embodiment. A plurality of parallel bitlines BL (80b) are arranged on the substrate 1 to extend in a first direction X when viewed in plane. A plurality of parallel wordlines WL are arranged on the substrate 1 to extend in a second direction Y orthogonal to the first direction X when viewed in plane. Active regions AR are disposed at intersections of the wordlines WL and the bitlines BL. The active regions AR have a bar shape when viewed in plane and may be disposed to be long in a third direction S non-perpendicular to both the first direction X and the second direction Y. A fourth direction Z is a direction orthogonal to all the first, second, and third directions X, Y, and S. In FIG. 52, a section taken along the line A-A' denotes a Z-S section. Each of the wordlines WL includes a first sub-wordline SWL1 and a second sub-wordline SWL2 that are horizontally arranged in parallel.

A first sub-gate SG1 extends in the second direction Y to provide the first sub-wordline SWL1. A second sub-gate SG2 extends in the second direction Y to provide the second sub-wordline SWL2. The first sub-gate SG1 is disposed below the second sub-gate SG2. A first gate insulator 32 is interposed between the first sub-gate SG1 and the substrate 1, between the second sub-gate SG2 and the substrate 1, and between the first sub-gate SG1 and the second sub-gate SG2. The first and second sub-gates SG1 and SG2 may be formed of the same material at the same time. Each of the first and second sub-gates SG1 and SG2 may have a semicircular section.

A second impurity-implanted region SD2 (20) is formed on a surface of the substrate 1 adjacent to the second sub-gate SG2. A first impurity-implanted region SD1 (10) is formed on the substrate 1 below the first sub-gate SG1. A bottom surface of the second impurity-implanted region SD2 (20) is higher than that of the second sub-gate electrode SG2. A top surface of the first impurity-implanted region SD1 (10) is lower than that of the first sub-gate SG1. A bottom surface of the isolation layer (FOX) 3 is lower than that of the first impurity-implanted region SD1 (10).

Adjacent wordlines WL may be symmetrical with respect to each other. A bitline contact 39a is provided between two adjacent wordlines. The bitline contact 39a is connected to the first impurity-implanted region SD1 (10) through the substrate 1. A buried insulating spacer pattern 37a is provided between the bitline contact 39a and the wordline WL. A fourth capping pattern 41 is provided on the substrate 1. The bitline contact 39a may protrude into the substrate 1 with a top surface having a same height as the fourth capping pattern 41. A bitline BL (80b) is provided on the bitline contact 39a. A second capping pattern 81b is provided on the bitline BL (80b), and a first insulating spacer 82b is provided on a sidewall of the second capping pattern 81b. An interlayer dielectric 73 is provided on the fourth capping pattern 41 to cover a sidewall of the first insulating spacer 82b. A bottom electrode contact 65 is connected to the second impurity-implanted region 20 through the interlayer dielectric 73 and the fourth capping pattern 41. Other configurations and operations may be the same as in first embodiments.

FIGS. 53 to 71 are cross-sectional views illustrating operations of fabricating a semiconductor device having a cross section shown in FIG. 52.

Figure 53:
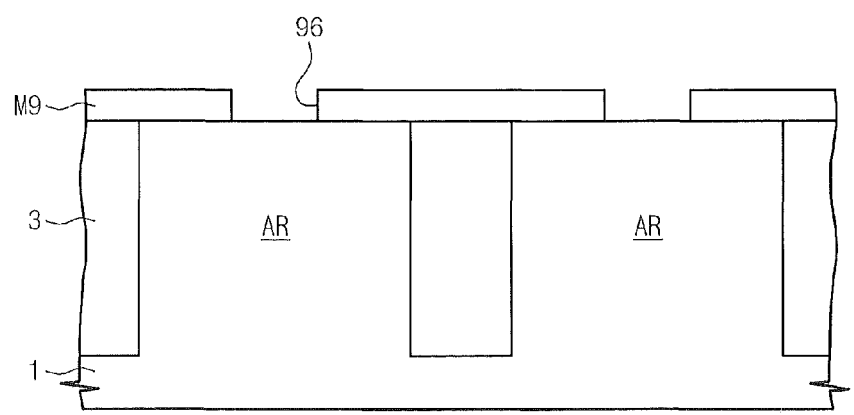
FIGS. 53 to 71 are cross-sectional views illustrating operations of fabricating a semiconductor device having a cross section shown in FIG. 52.

Referring to FIG. 53, an isolation layer 3 is formed on a substrate 1 to define an active region AR. A ninth mask pattern M9 is formed on the substrate 1. The ninth mask pattern M9 has an opening 96 to partially expose a central portion between adjacent isolation layers 3. The opening 96 may be a line-type opening extending in the second direction Y.

Figure 54:
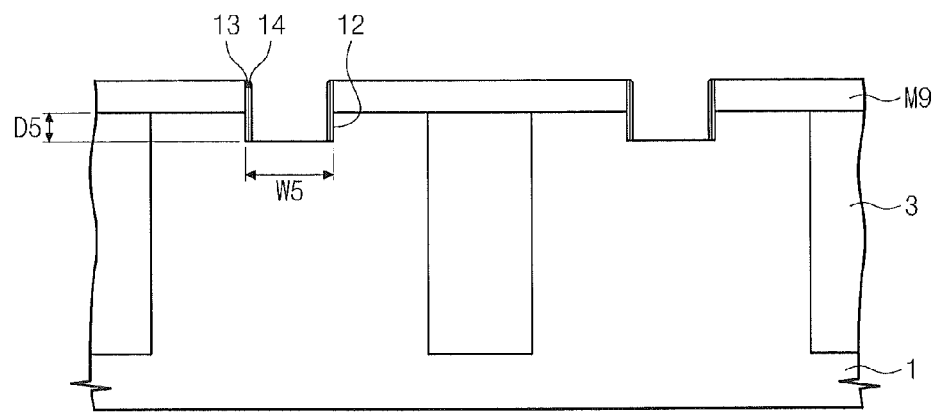

Referring to FIG. 54, portions of the substrate 1 and/or the isolation layer 3 exposed through the opening 96 are partially etched using the ninth mask M9 as an etch mask to form a line-type first groove 12. The first groove 12 is formed to have a fifth depth D5 and a fifth width W5. A first etch protective spacer 13 and a second etch protective spacer 14 are formed to cover the sidewall of the first groove 12 while exposing the bottom of the first groove 12. The first and second etch protective spacers 13 and 14 may be formed by means of deposition and anisotropic etching. The first etch protective spacer 13 is formed of a material having an etch selectivity with respect to the second etch protective spacer 14.

Figure 55:
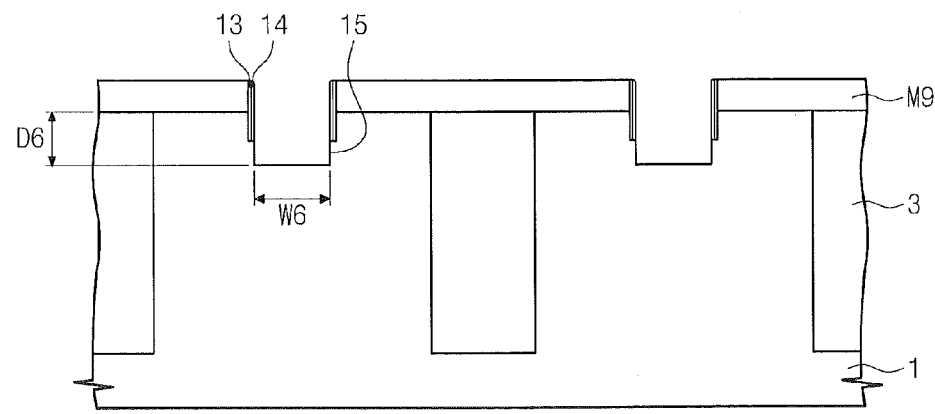

Referring to FIG. 55, a bottom surface of the first groove 12 is anisotropically etched using the etch protective spacers 13 and 14 as etch masks to form a second groove 15 below the first groove 12. The second groove 15 has a sixth depth D6 and a sixth width W6. The sixth depth D6 may be greater than the fifth depth D5, and the sixth width W6 may be smaller than the fifth width W5.

Figure 56:
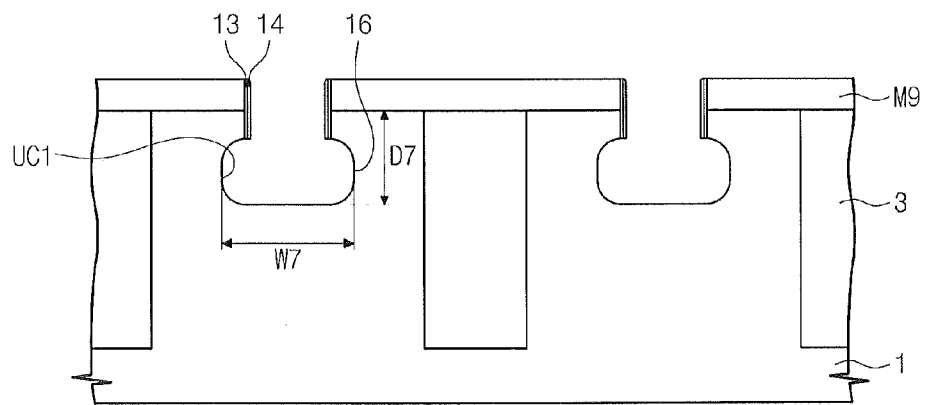

Referring to FIG. 56, portions of the substrate 1 exposed by the second groove 15 are isotropically etched using the ninth mask pattern M9 and the etch protective spacers 13 and 14 as etch masks to form a third groove 16. The third groove 16 has a seventh width W7 greater than the sixth width W6 and a seventh depth D7 greater than the sixth depth D6. The third groove 16 includes a first undercut region UC1. Inside and bottom portions of the third groove 16 are formed to have a rounded profile. Although not shown, the third groove 16 is also formed in the isolation layer 3 in the second direction Y. In this case, the isolation layer 3 includes a third oxide layer and a nitride liner. For this reason, when the isotropic etching is performed, the thermal oxide layer and the nitride liner must be etched partially and sequentially. Thus, the isotropic etching may be performed twice or more. Since a side surface of the first groove 12 covered with the etch protective spacers 13 and 14 must be protected without being etched during the isotropic etching, the etch protective spacers 13 and 14 may be formed of different materials. For example, the first etch protective spacer 13 may be formed of a material having an etch selectivity with respect to the thermal oxide layer, and the second etch protective spacer 14 may be formed of a material having an etch selectivity with respect to the nitride liner. For example, the second etch protective spacer 14 may be formed of oxide (e.g., silicon oxide), and the first etch protective spacer 13 may be formed of nitride and/or oxynitride (e.g., silicon nitride and/or silicon oxynitride).

Figure 57:
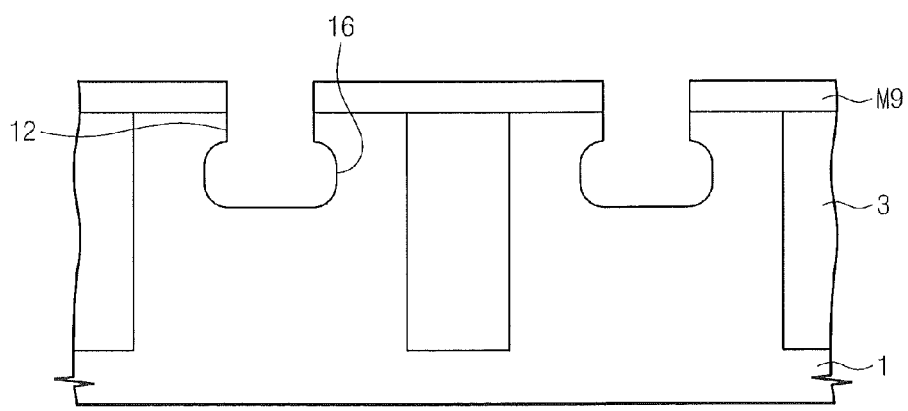

Referring to FIG. 57, the first and second etch protective spacers 13 and 14 are sequentially removed to form the third groove 16 and the first groove 12 vertically overlapping the substrate 1. The third and first grooves 16 and 12 may provide a profile of bottle having a convex lower portion and a narrow upper portion.

Figure 58:
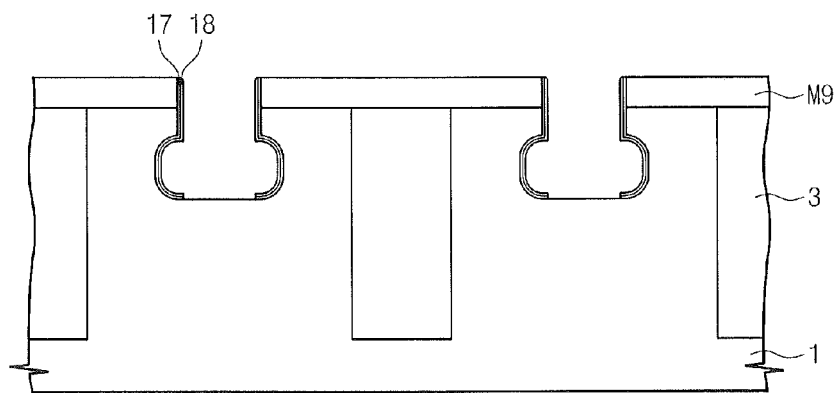

Referring to FIG. 58, a third etch protective spacer 17 and a fourth etch protective spacer 18 are formed to cover sidewalls of the first groove 12 and the third groove 16. Similar to the first etch protective spacer 13, the third etch protective spacer 17 may be formed of nitride and/or oxynitride. Similar to the second etch protective spacer 14, the fourth etch protective spacer 18 may be formed of oxide.

Figure 59:
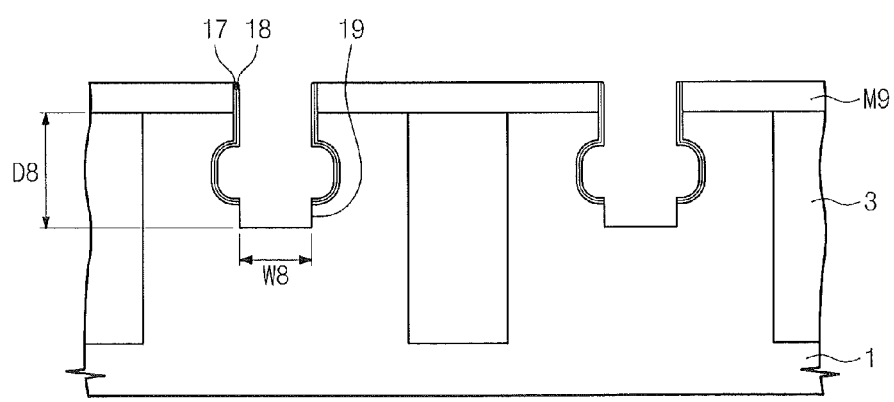

Referring to FIG. 59, a bottom surface of the third groove 16 is partially etched using the ninth mask pattern M9 and the protective spacers 17 and 18 as etch masks to form a fourth groove 19 having an eighth depth D8 and an eighth width W8. The eighth width W8 is nearly equal to the sixth width W6. The eighth depth D8 is greater than the seventh depth D7.

Figure 60:
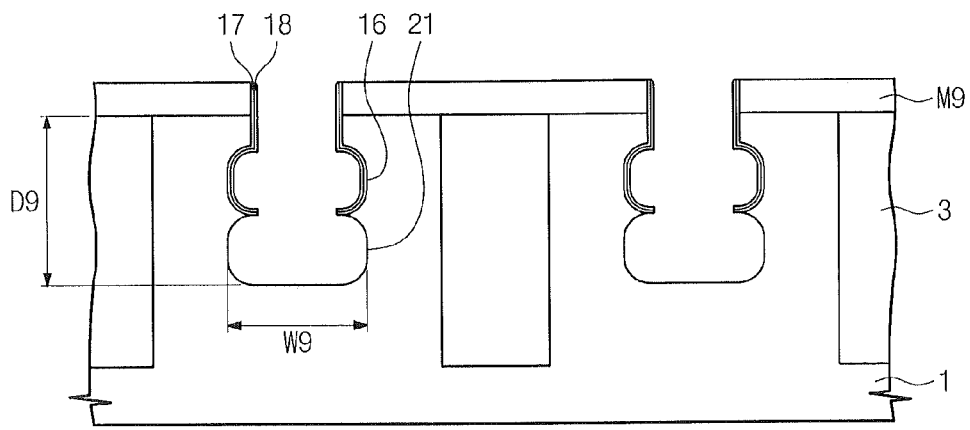

Referring to FIG. 60, portions of the substrate 1 exposed by the fourth groove 9 are isotropically etched using the ninth mask pattern M9 and the etch protective spacers 17 and 18 as etch masks to form a fifth groove 21 having a ninth depth D9 and a ninth width W9. The ninth depth D9 may be greater than the eighth depth D8, and the ninth width W9 may be substantially the same as the seventh width W7. An inner sidewall of the fifth groove 21 may have a rounded profile.

Figure 61:
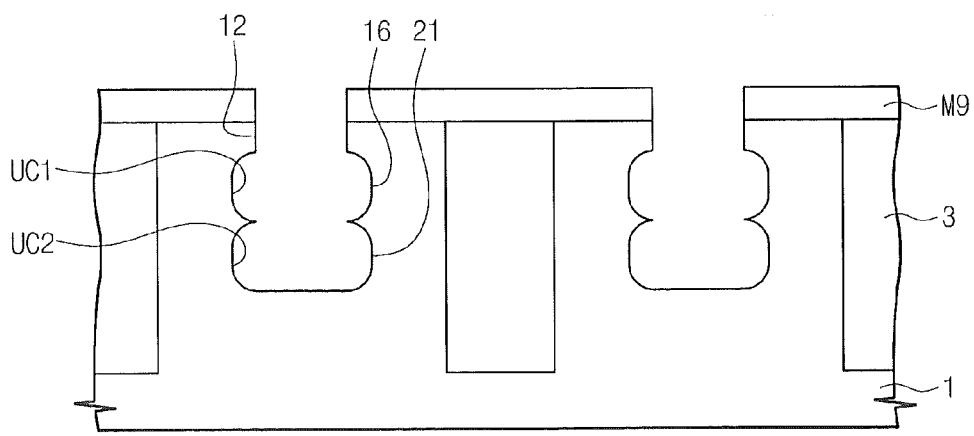

Referring to FIG. 61, the etch protective spacers 17 and 18 are sequentially removed to form a fifth groove 21, a third groove 16, and a first groove 12 vertically overlapping the substrate 1. The fifth groove 21 includes a second undercut region UC2 that is horizontally recessed.

Figure 62:
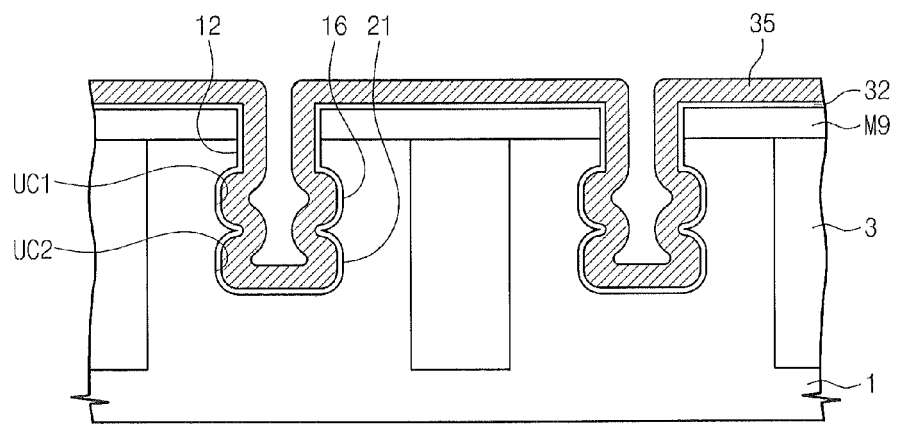

Referring to FIG. 62, a first gate insulator 32 is conformally formed on the substrate 1. A sub-gate layer 35 is conformally formed on the first gate insulator 32. The sub-gate layer 35 is formed to be thick enough to fill at least the undercut regions UC1 and UC2 of the third and fifth grooves 16 and 21.

Figure 63:
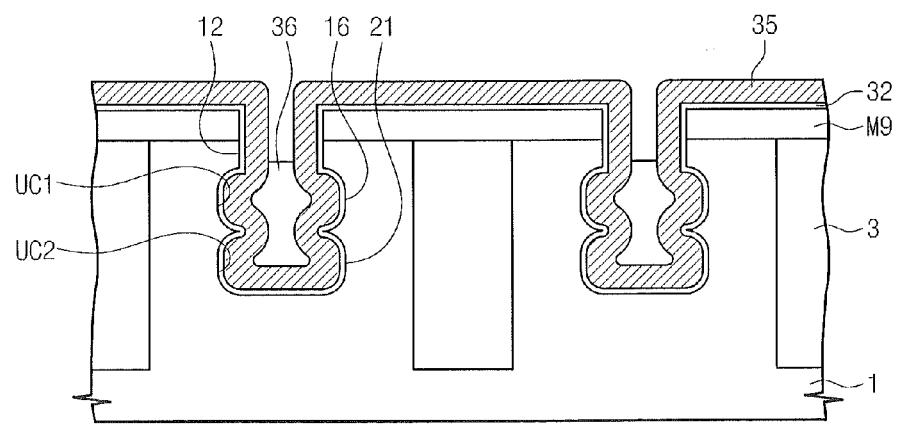

Referring to FIG. 63, a first sacrificial layer 36 is formed on the sub-gate layer 35 to fill the grooves 21, 16, and 12. The first sacrificial layer 36 may be formed of a material having an etch selectivity with respect to the ninth mask pattern M9 and the sub-gate layer 35. The first sacrificial layer 36 may be formed of, for example, an oxide such as silicon oxide. An upper portion of the first sacrificial layer 36 is selectively recessed to make a top surface of the first sacrificial layer 36 higher than an entrance of the third groove 16.

Figure 64:
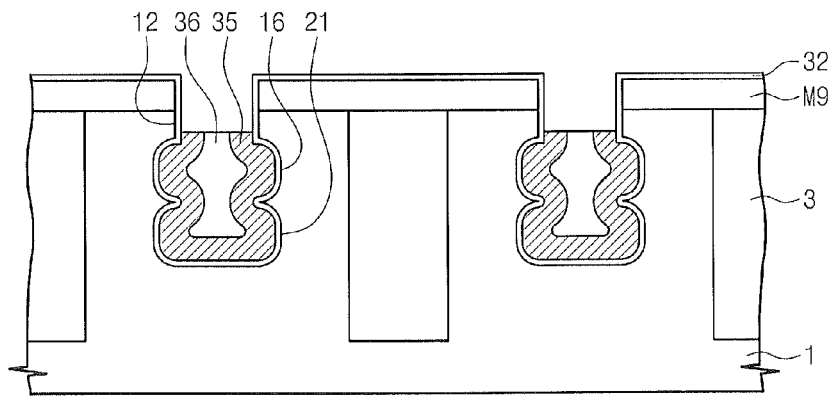

Referring to FIG. 64, a portion of the sub-gate layer 35 higher than the top surface of the first sacrificial layer 36 is removed. In this case, portions filling the undercut regions UC1 and UC2 of the sub-gate layer 35 and a portion disposed below the first sacrificial layer 36 remain. A portion of the sub-gate layer 35 may be removed by isotropic etching.

Figure 65:
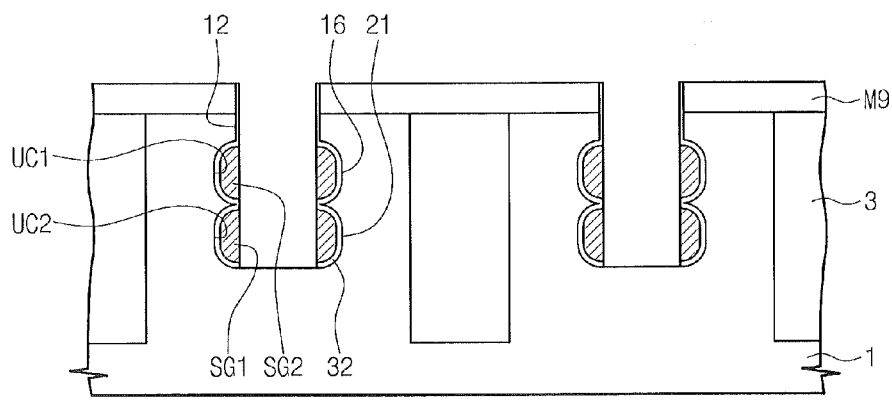

Referring to FIG. 65, the first sacrificial layer 36 is removed. The sub-gate layer 35 is isotropically etched using the ninth mask pattern M9 as an etch mask to expose the bottom of the fifth groove 21 while maintaining portions of the sub-gate layer 35 in the undercut regions UC1 and UC2. Thus, the first undercut region UC1 and the second undercut region UC2 are formed, a first sub-gate SG1 is formed in the second undercut region UC2, and a second sub-gate SG2 is formed in undercut region UC1.

Figure 66:
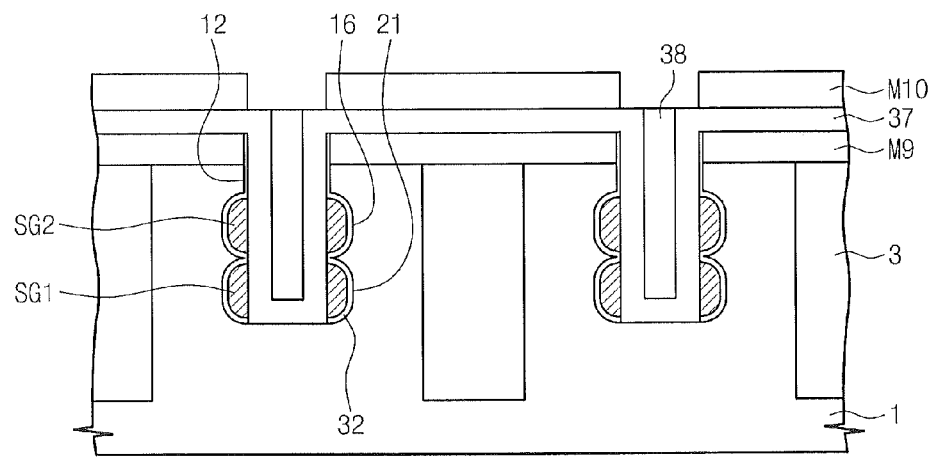

Referring to FIG. 66, a buried insulating spacer layer 37 is conformally formed on the substrate 1. A second sacrificial layer 38 is stacked on the buried insulating spacer layer 37 to fill the grooves 21, 16, and 12. The second sacrificial layer 38 is planarized to expose a top surface of the buried insulating spacer layer 37 while maintaining the second sacrificial layer 38 within the grooves 21, 16, and 12. A tenth mask pattern M10 is formed on the buried insulating spacer layer 37. The tenth mask pattern M10 is formed to expose portions of the second sacrificial layer 38 on the substrate 10 in the active region AR and cover portions of the second sacrificial layer 38 in the isolation layer 3.

Figure 67:
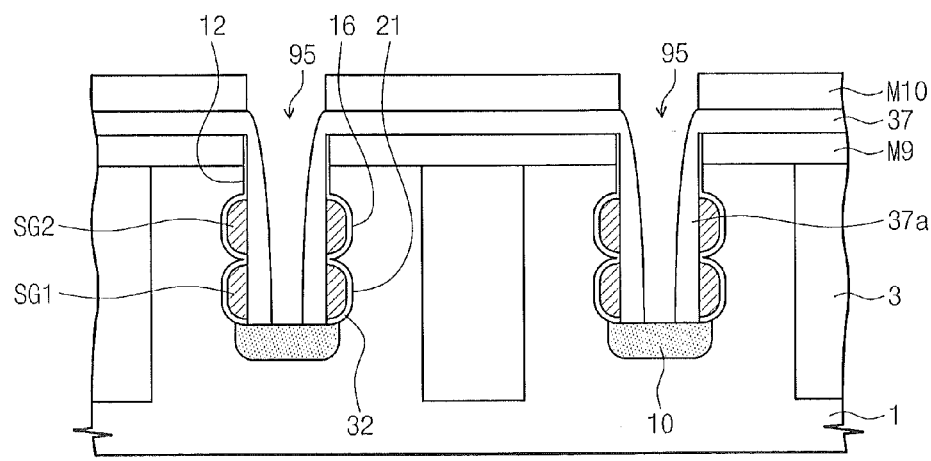

Referring to FIG. 67, the second sacrificial layer 38 and the buried insulating spacer layer 37 are anisotropically etched using the tenth mask pattern M10 as an etch mask. Thus, a buried insulating spacer pattern 37a is formed to cover inner sidewalls of the sub-gates SG1 and SG2 and a bitline contact hole 95 is formed to expose portions of the substrate 1 in the active region AR. Impurities are implanted into the exposed substrate 1 below the bitline contact hole 95 to form a first impurity-implanted region 10.

Figure 68:
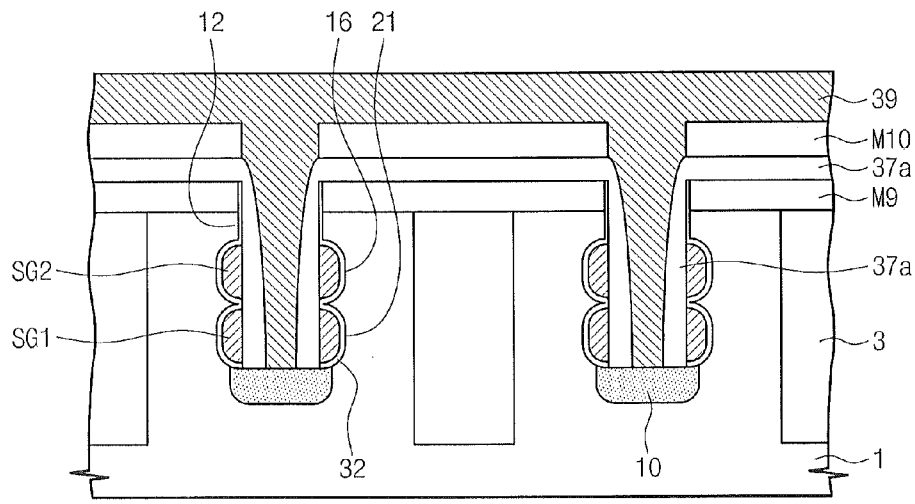

Referring to FIG. 68, a bitline contact layer 39 is formed on the entire surface of the substrate 1 to fill the bitline contact hole 95. The bitline contact layer 39 may be formed of at least one selected from the group consisting of a doped a semiconductor material (e.g., doped silicon, doped germanium, etc.), a conducive metal nitride (e.g., titanium nitride, tantalum nitride, etc.), a metal (e.g., tungsten, titanium, tantalum, etc.), and/or a metal-semiconductor compound (e.g., tungsten silicide, cobalt silicide, titanium silicide, etc.).

Figure 69:
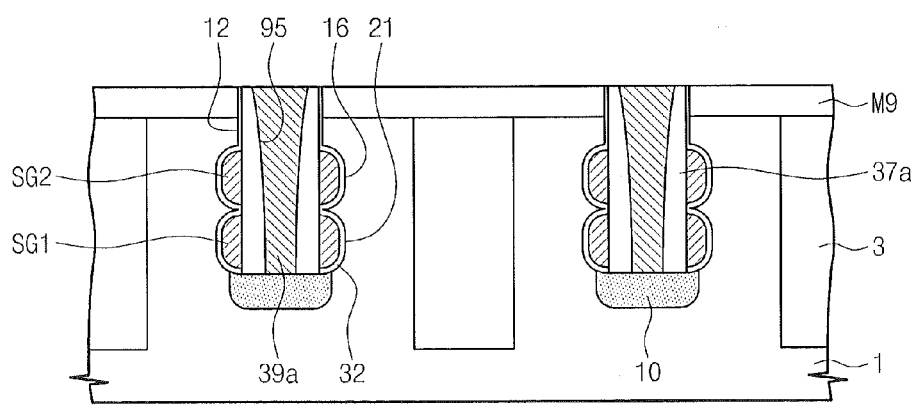

Referring to FIG. 69, a planarization process is performed to remove the buried insulating spacer 37, the tenth mask pattern M10, and the bitline contact layer 39 on the ninth mask pattern M9 and form a bitline contact 39a in the bitline contact hole 95.

Figure 70:
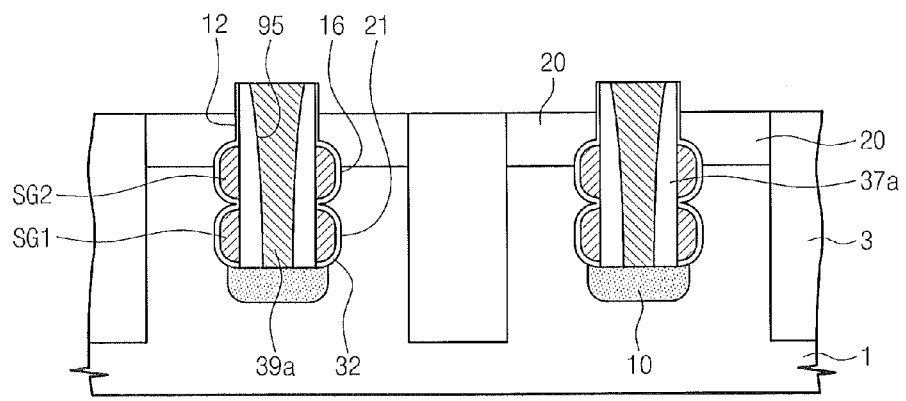

Referring to FIG. 70, the ninth mask pattern M9 is removed to expose the top surface of the substrate 1. In this case, top surfaces of the buried insulating spacer pattern 37a and the bitline contact 39a protrude beyond the surface of substrate 1. Impurities are doped into the exposed surface of the substrate 1 to form a second impurity-implanted region 20.

Figure 71:
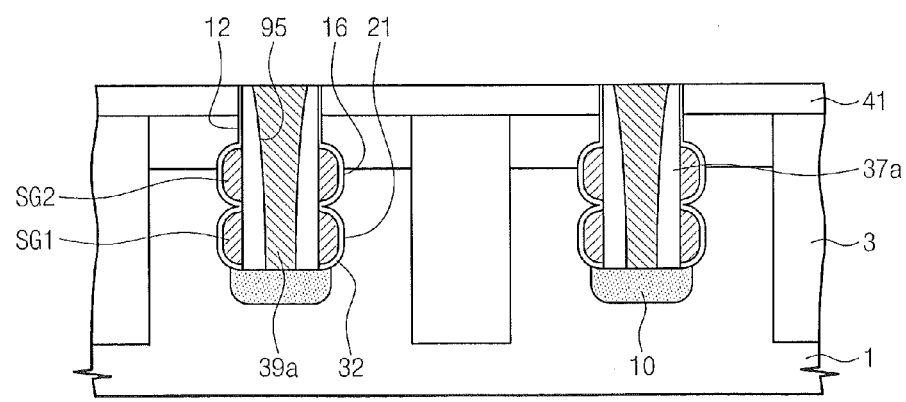

Referring to FIG. 71, a fourth capping layer is formed on the substrate 1 and then planarized to form a fourth capping pattern 41 at both sides of the bitline contact 39a and expose a top surface of the bitline contact 39a.

Referring to FIG. 52, in subsequent operations a bitline BL (80b) is formed on the fourth capping pattern 41 in contact with the bitline contact 39a in a same (or similar) manner as in first embodiments. A capacitor CA is formed in a same (or similar) manner as in first embodiments. As a result, a semiconductor device shown in FIG. 52 may be completed.

Other operations may be the same (or similar) as in first embodiments.

Embodiment 7

Figure 72:
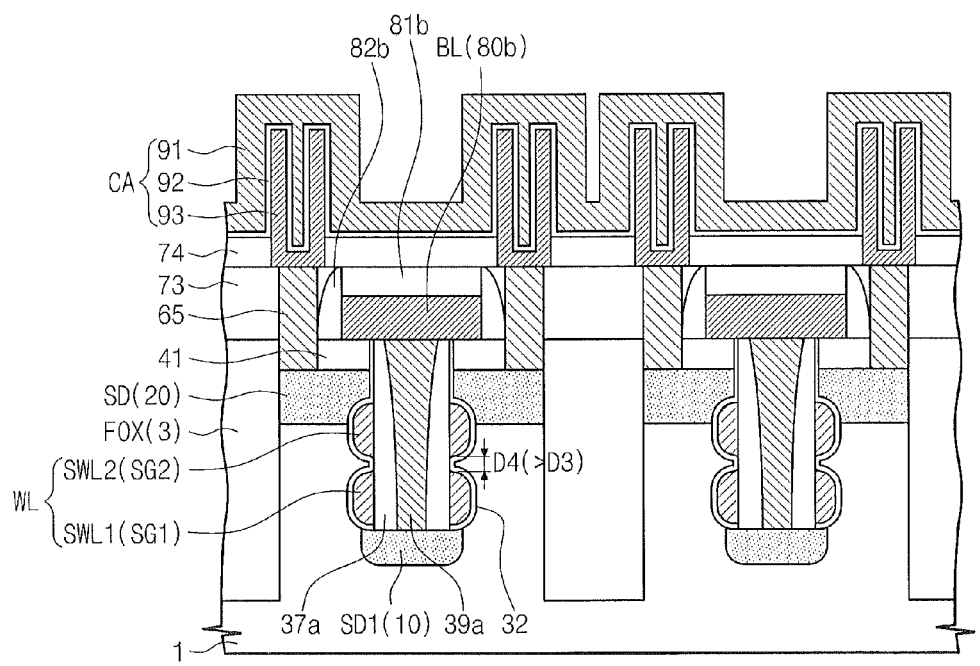
FIG. 72 is a cross-sectional view taken along a line A-A' in FIG. 51 according to seventh embodiments of inventive concepts.

FIG. 72 is a cross-sectional view taken along a line A-A' in FIG. 51 according to seventh embodiments of inventive concepts.

Referring to FIG. 72, in a semiconductor device according to the seventh embodiments of inventive concepts, a spaced distance D4 between a first sub-gate SG1 and a second sub-gate SG2 is longer than a spaced distance D3 between a first sub-gate SG1 and a second sub-gate SG2 in FIG. 52. A first gate insulator 32 has a greater surface area covering parallel outer sidewalls of a buried insulating spacer pattern 37a than those shown in FIG. 52. Other configurations are the same (or similar) as in sixth embodiments.

FIGS. 73 to 78 are cross-sectional views illustrating a procedure of fabricating a semiconductor device having a cross section shown in FIG. 72.

Figure 73:
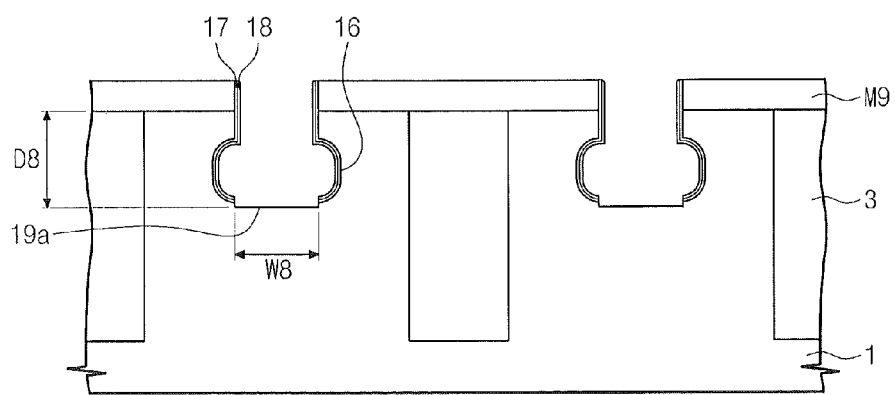
FIGS. 73 to 78 are cross-sectional views illustrating operations of fabricating a semiconductor device having a cross section shown in FIG. 72.

Referring to FIG. 73, after the step in FIG. 58, a bottom surface of the third groove 16 is partially etched using a ninth mask pattern M9 and etch protective spacers 17 and 18 as etch masks to form a fourth groove 19a having an eighth depth D8 and an eighth width W8. In this case, the eighth depth D8 is may be significantly less than the eighth depth D8 in FIG. 59.

Figure 74:
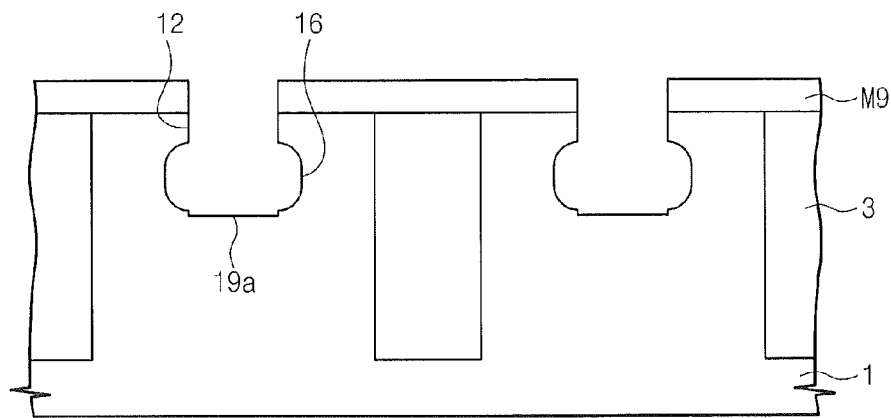

Referring to FIG. 74, the etch protective spacers 17 and 18 are sequentially removed to expose sidewalls of the first and third grooves 12 and 16 and a sidewall and a bottom of the fourth groove 19a.

Figure 75:
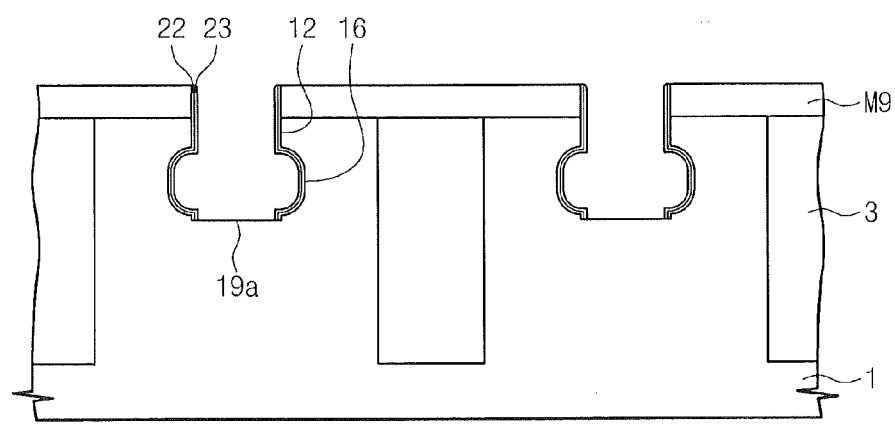

Referring to FIG. 75, a fifth etch protective spacer 22 and a sixth etch protective spacer 23 are formed to cover sidewalls of the first, third, and fourth grooves 12, 16, and 19a. The fifth etch protective spacer 22 and the sixth etch protective spacer 23 may be formed of the same materials as the third etch protective spacer 17 and the fourth etch protective spacer 18, respectively.

Figure 76:
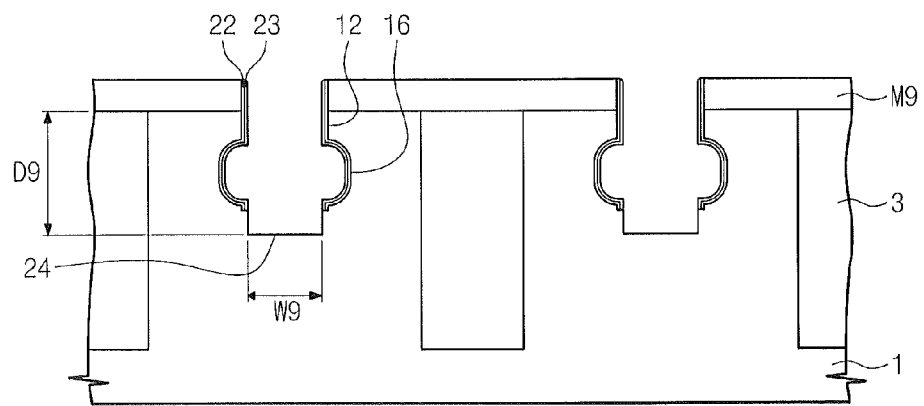

Referring to FIG. 76, a bottom surface of the fourth groove 19a is partially etched using the ninth mask pattern M9 and the etch protective spacers 22 and 23 as etch masks to form a fifth groove 24 having a ninth depth D9 and a ninth width W9. The ninth width W9 may be less than the eighth width W8 in FIG. 73. The ninth depth D9 is greater than the eighth depth D8.

Figure 77:
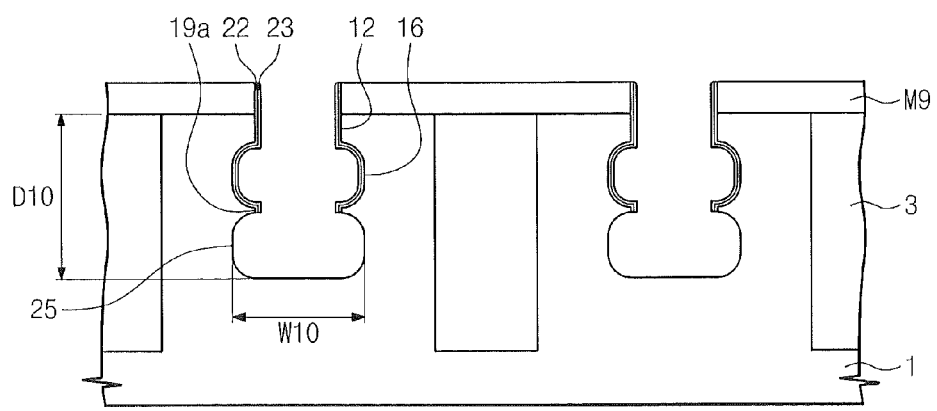

Referring to FIG. 77, portions of the substrate 1 exposed by the fifth groove 24 are isotropically etched using the ninth mask pattern M9 and the etch protective spacers 22 and 23 as etch masks to form a sixth groove 25 having a tenth depth D10 and a tenth width W10. The tenth depth D10 is greater than the ninth depth D9. The tenth width W10 may be substantially the same as the seventh width W7 in FIG. 56.

Figure 78:
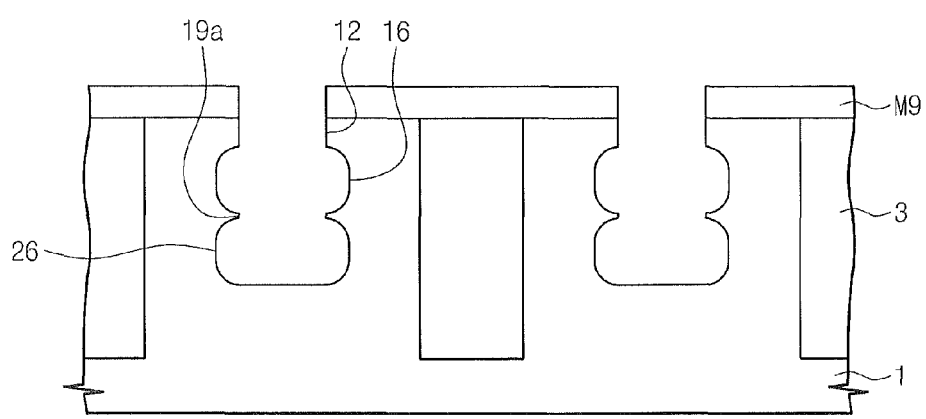

Referring to FIG. 78, the fifth and sixth etch protective spacers 22 and 23 are removed. Sub-gates SG1 and SG2, a bitline BL (85b), and a capacitor CA may be formed in substantially the same (or similar) the manner as in sixth embodiments. As a result, a semiconductor device shown in FIG. 72 may be completed.

Other operations may be the same (or similar) as in sixth embodiments.

Embodiment 8

Figure 79:
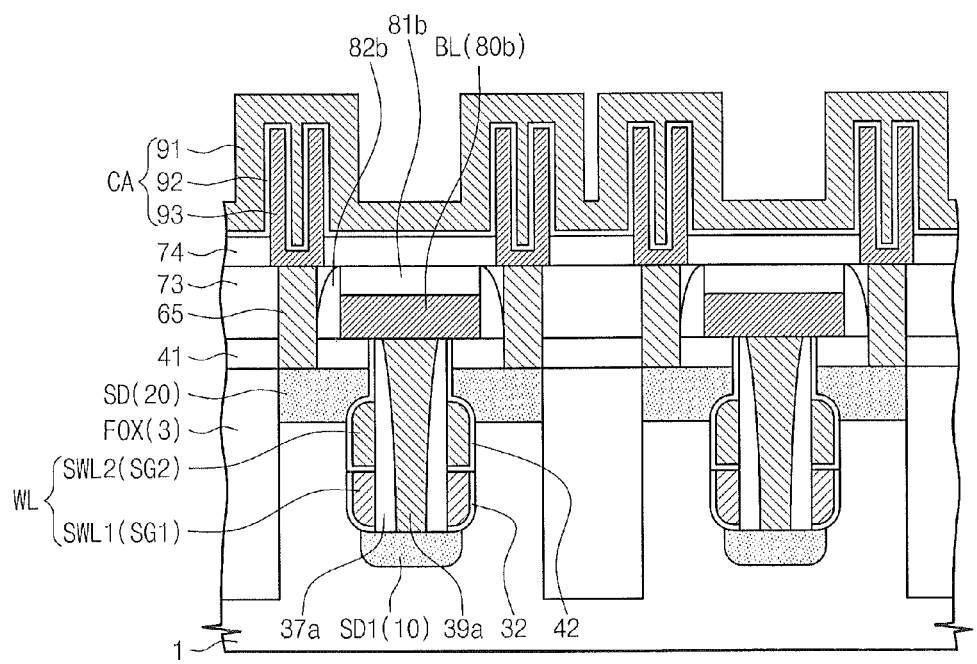
FIG. 79 is a cross-sectional view taken along a line A-A' in FIG. 51 according to eighth embodiments of inventive concepts.

FIG. 79 is a cross-sectional view taken along a line A-A' in FIG. 51 according to eighth embodiments of inventive concepts.

Referring to FIG. 79, in a semiconductor device according to eighth embodiments of inventive concepts, a first sub-gate SG1 and a second sub-gate SG2 are formed using different operations. In addition, a first gate insulator 32 and a second gate insulator 42 are formed using different operations. The first gate insulator 32 is between the first sub-gate SG1 and a substrate 1, and the second gate insulator 42 is between the second sub-gate SG2 and the substrate 1 and between the first sub-gate SG1 and the second sub-gate SG2. Other configurations and operations may be substantially the same (or similar) as in sixth embodiments.

FIGS. 80 to 87 are cross-sectional views illustrating operations of fabricating a semiconductor device having a cross section shown in FIG. 79.

Figure 80:
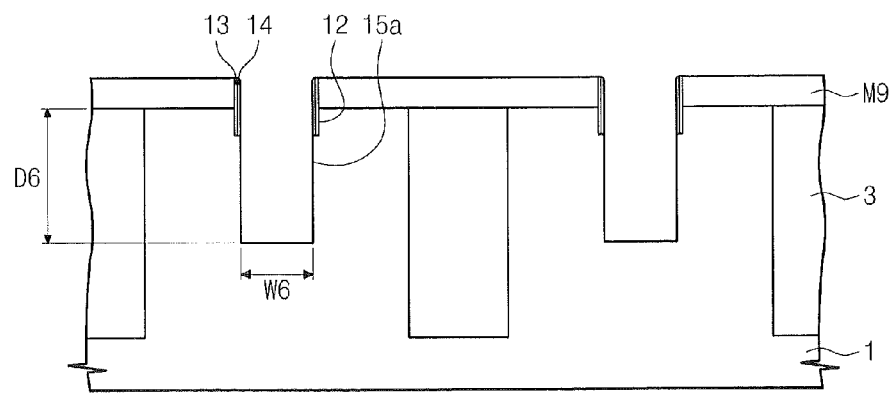
FIGS. 80 to 87 are cross-sectional views illustrating operations of fabricating a semiconductor device having a cross section shown in FIG. 79.

Referring to FIG. 80, starting from the structure of FIG. 54, a bottom surface of a first groove 12 is anisotropically etched using first and second etch protective spacers 13 and 14 and a ninth mask pattern M9 as etch masks to form a second groove 15a below the first groove 12. The second groove 15a has a sixth depth D6 and a sixth width W6. The sixth depth D6 is significantly greater than the sixth depth D6 in FIG. 55. In FIG. 80, the sixth depth D6 may be adjusted in consideration of a space occupied by two sub-wordlines.

Figure 81:
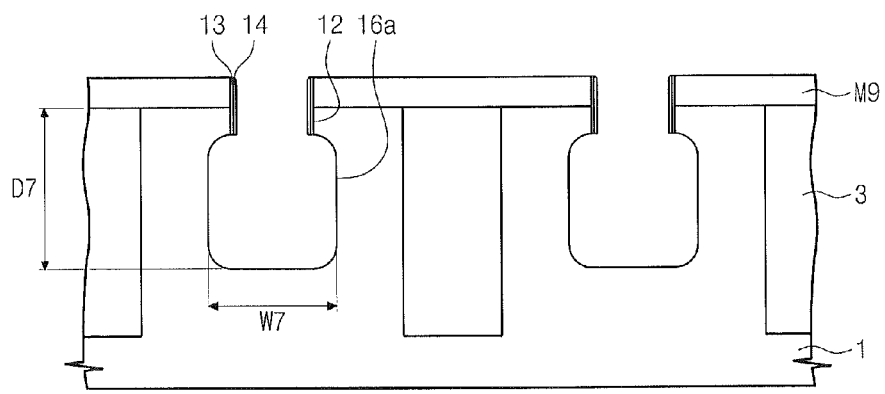

Referring to FIG. 81, portions of the substrate 1 exposed by the second groove 15a are isotropically etched using the ninth mask pattern M9 and the etch protective spacers 13 and 14 to form a third groove 16a having a seventh depth D7 and a seventh width W7. The seventh depth D7 is greater than the sixth depth D6, and the seventh width W7 is greater than the sixth width W6. The third groove 16a includes a first undercut region UC1 that is horizontally recessed.

Figure 82:
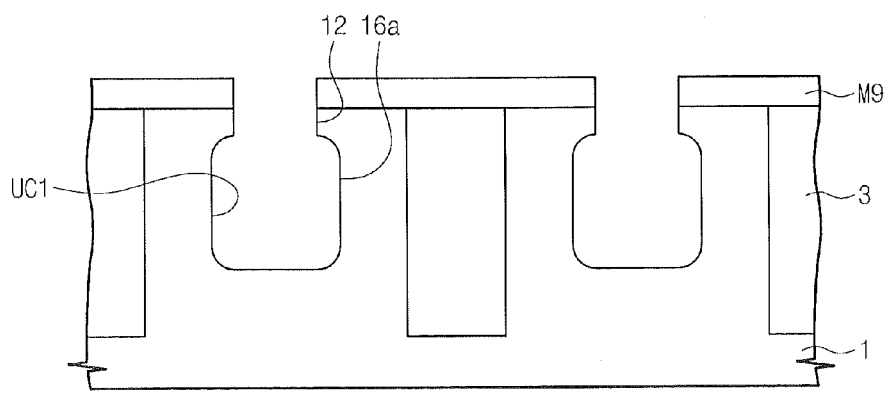

Referring to FIG. 82, the first and second etch protective spacers 13 and 14 are removed to expose the sidewall of the first groove 12.

Figure 83:
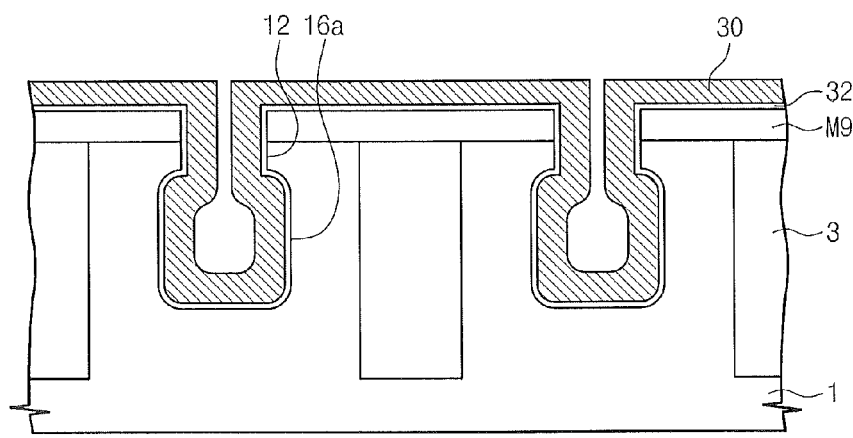

Referring to FIG. 83, a first gate insulator 32 and a first sub-gate layer 30 are conformally formed on the substrate 1. The first gate insulator 32 may be formed by means of thermal oxidation. The first sub-gate layer 30 may be formed to be thick enough to fill the first undercut region UC1.

Figure 84:
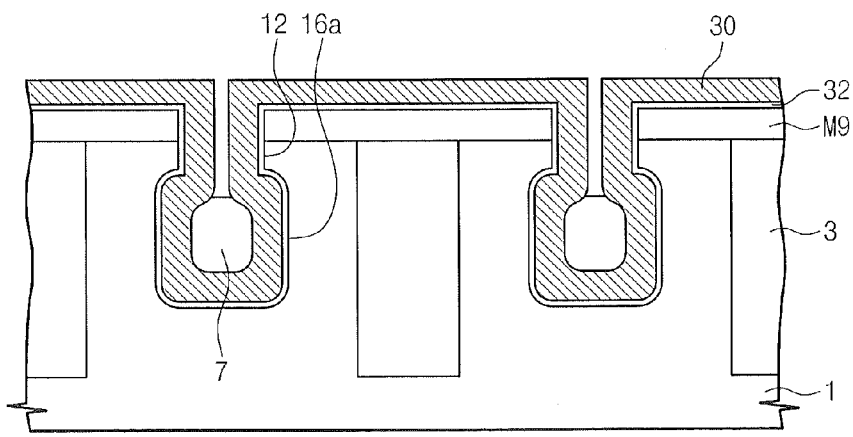

Referring to FIG. 84, a first sacrificial layer 7 is stacked on the first sub-gate layer 30 to fill the third groove 16a. A portion of the first sacrificial layer 7 remains within the third groove 16a by selectively recessing the first sacrificial layer 7 to protect a lower portion of the first sub-gate layer 30.

Figure 85:
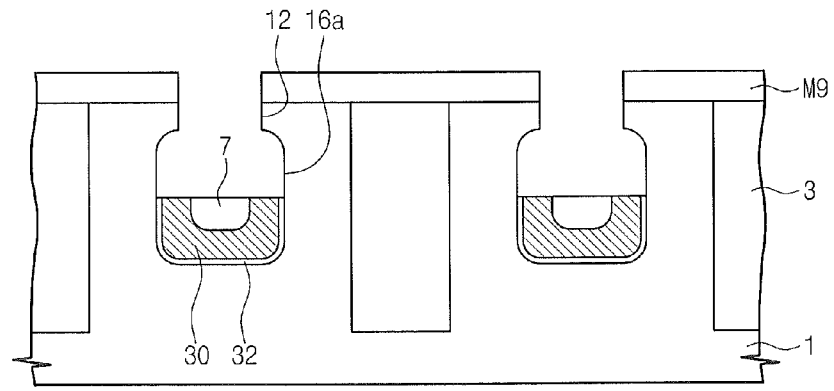

Referring to FIG. 85, the first sub-gate layer 30 is anisotropically etched to expose the sidewall of the first groove and the upper sidewall of the third groove 16a while maintaining the first sub-gate layer 30 below the third groove 16a.

Figure 86:
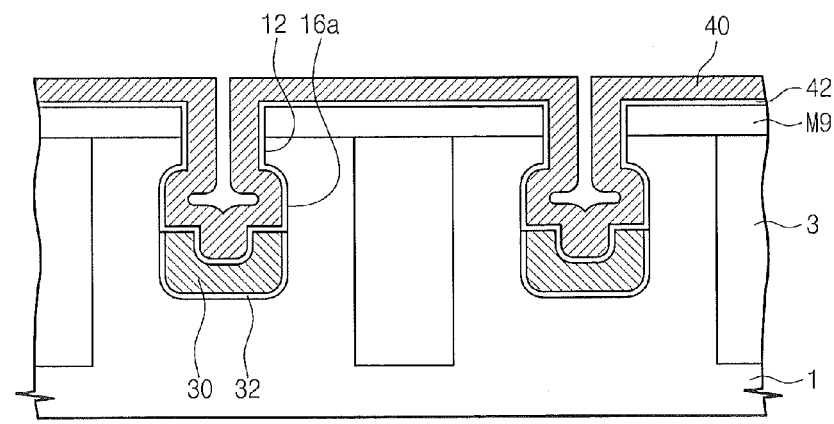

Referring to FIG. 86, the first sacrificial layer 7 is selectively removed. A second gate insulator 42 and a second sub-gate layer 40 are conformally formed on the substrate 1.

Figure 87:
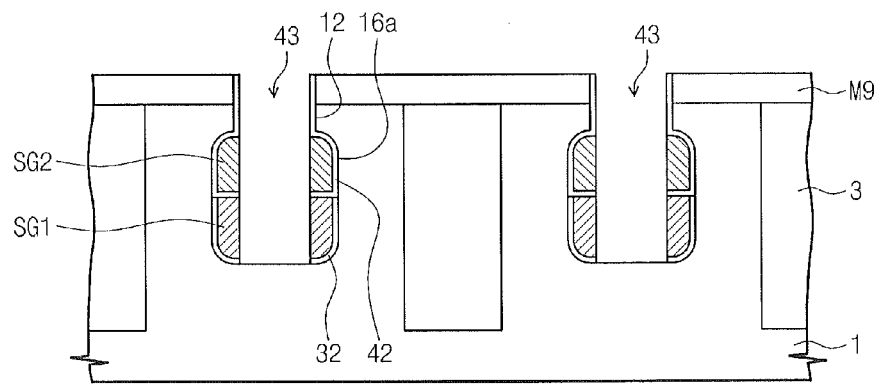

Referring to FIG. 87, a second sacrificial layer (not shown) is formed to fill the grooves 12 and 16a. A planarization process is performed to remove the second sub-gate layer 40 on the first mask pattern M9 and expose a top surface of the first mask pattern M9. The second sub-gate layer 40, the second gate insulator 42, the first sub-gate layer 30, and the first gate insulator 32 are anisotropically etched using the first mask pattern M9 as an etch mask to form a first sub-gate SG1 and a second sub-gate SG2 in the first undercut region UC1 of the third groove 16a and a fourth groove 43 to expose the substrate 1.

Other operations may be the same (or similar) as in seventh embodiments.

Embodiment 9

Figure 88:
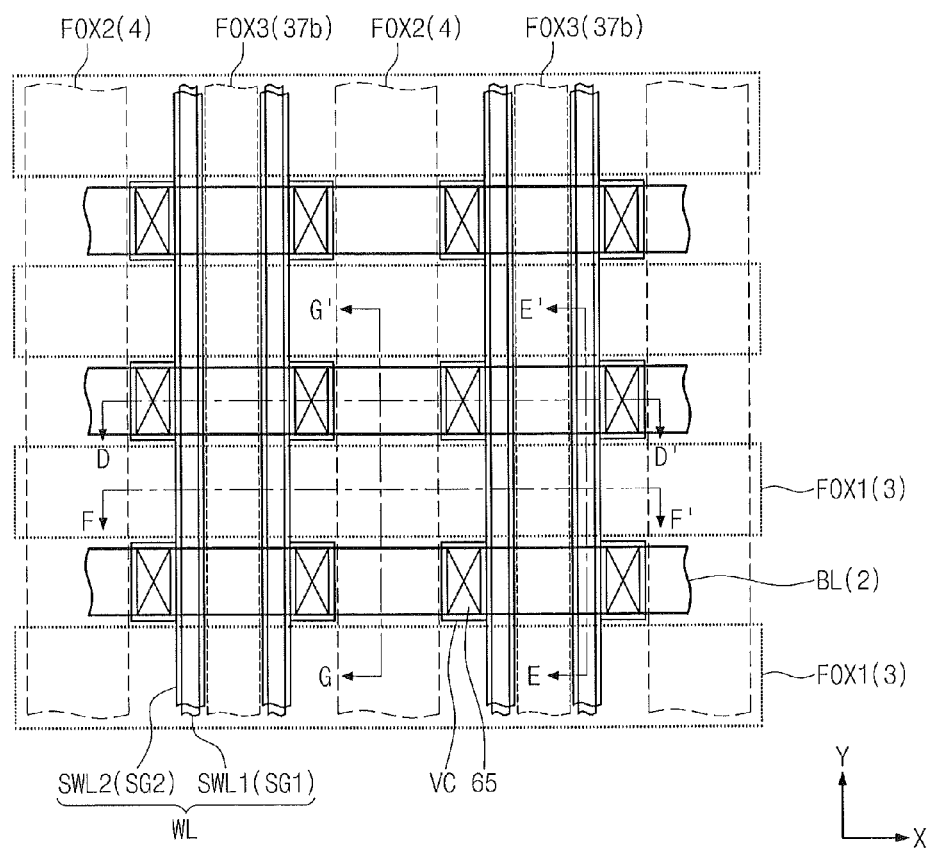
FIG. 88 is a top plan view of a semiconductor device according to ninth embodiments of inventive concepts.
Figure 89:
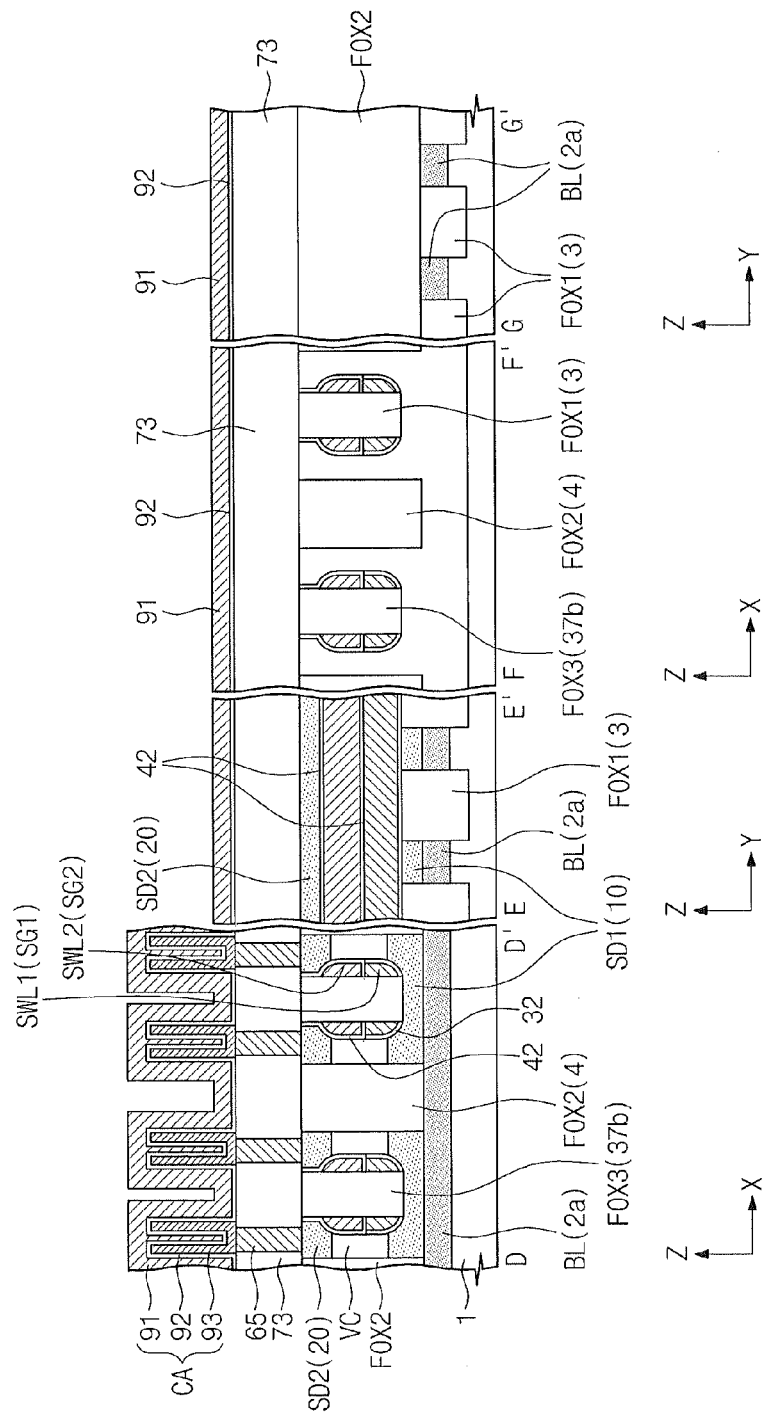
FIG. 89 is a cross-sectional view taken along lines D-D', E-E', and F-F' in FIG. 88.
Figure 90:
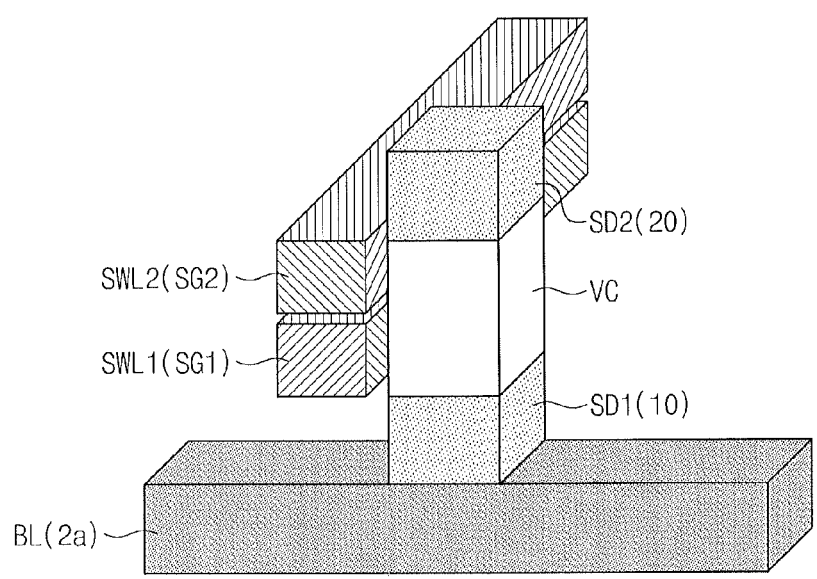
FIG. 90 is a perspective view of a unit cell transistor of a semiconductor device according to the ninth embodiments of inventive concepts.

FIG. 88 is a top plan view of a semiconductor device according to ninth embodiments of inventive concepts, and FIG. 89 is a cross-sectional view taken along lines D-D', E-E', and F-F' in FIG. 88. FIG. 90 is a perspective view of a unit cell transistor of a semiconductor device according to ninth embodiments of inventive concepts. Ninth embodiments of inventive concepts will now be described with respect to a DRAM device in which a channel is vertically formed and a bitline is buried in a substrate.

Referring to FIGS. 88 to 90, a first field isolation oxide layer (FOX1) 3, a second field isolation oxide layer (FOX2) 4, and a third field isolation oxide layer (FOX3) 37b are disposed on a substrate 1 to define vertical active channel regions VC. Only a cell array region is shown in FIGS. 88 to 90 while a peripheral circuit region is not shown. This is because the peripheral circuit region is the same (or similar) as in the first embodiment. A plurality of parallel bitlines BL (2) are arranged on the substrate 1 to extend in a first direction X when viewed in plane. A plurality of parallel wordlines WL are arranged on the substrate 1 to extend in a second direction Y orthogonal to the first direction X when viewed in plane. The vertical active channel regions AR are disposed at intersections of the wordlines WL and the bitlines BL. Each of the vertical active channel regions AR may have a protruding pillar shape. A third direction Z is a direction orthogonal to all the first and second directions X and Y. In FIG. 89, sections taken along the line D-D' and F-F' denote Z-X sections. In FIG. 89, sections taken along the line E-E' and G-G' denote Z-Y sections. Each of the wordlines WL includes a first sub-wordline SWL1 and a second sub-wordline SWL2 that vertically overlap each other.

A first sub-gate SG1 extends in the second direction Y to provide the first sub-wordline SWL1. A second sub-gate SG2 extends in the second direction Y to provide the second sub-wordline SWL2. The first sub-gate SG1 is disposed below the second sub-gate SG2. A first gate insulator 32 is interposed between the first sub-gate SG1 and the substrate 1, and a second gate insulator 42 is interposed between the second sub-gate SG2 and the substrate 1 and between the first sub-gate SG1 and the second sub-gate SG2.

A second impurity-implanted region SD2 (20) is formed on a surface of the substrate 1 adjacent to the second sub-gate SG2. A first impurity-implanted region SD1 (10) is formed on the substrate 1 below the first sub-gate SG1. A buried bitline BL (2) is disposed below the first impurity-implanted region SD1 (10). The buried bitline BL (2) may be an impurity-doped layer (or region) on the substrate 1. A bottom surface of the first isolation layer FOX1 (3) may be lower than that of the bitline BL (2). A bottom surface of the second isolation layer FOX2 (4) may be even with a top surface of the bitline BL (2). A bottom surface of the third isolation layer FOX3 (37b) may be even with or higher than a top surface of the bitline BL (2).

Adjacent wordlines WL are symmetrical with respect to each other. An interlayer dielectric 73 is provided on the substrate 1. A bottom electrode contact 65 is in contact with the second impurity-implanted region 20 through the interlayer dielectric 73.

Although not illustrated, a body contact connected to a bottom of the substrate 1 can be additionally provided adjacent the vertical active channel region VC for a passage of electron holes. A body floating phenomenon of the vertical active channel region VC can be reduced using by the body contact.

Other configurations and operations may be the same (or similar) as in first embodiments.

FIGS. 91 to 94 are cross-sectional views illustrating a procedure of fabricating a semiconductor device having a cross section shown in FIG. 89.

Figure 91:
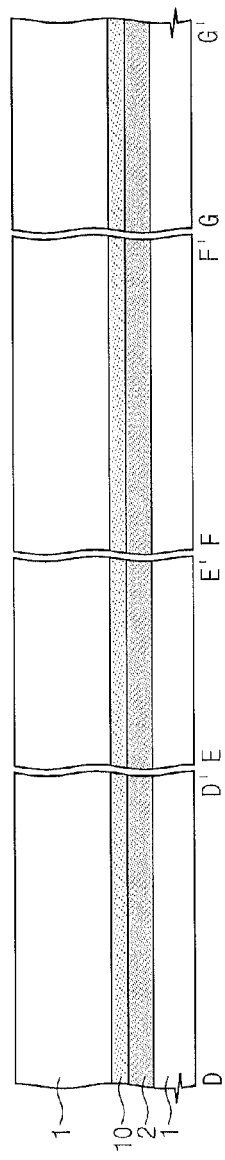
FIGS. 91 to 94 are cross-sectional views illustrating operations of fabricating a semiconductor device having a cross section shown in FIG. 89.

Referring to FIG. 91, an ion implantation may be is performed to form a bitline layer 2 at a predetermined depth in a substrate 1. The ion implantation may be performed with respect to the entire surface of a cell array region in the substrate 1. The bitline layer 2 may be formed by doping the substrate 1 with, for example, N-type dopants. The bitline layer 2 may be a conductive layer such as a metal-containing layer formed on the substrate 1. After formation of the bitline layer 2, another ion implantation is performed to form impurity-implanted region 10 at a predetermined depth in the substrate 1. A bottom surface of the impurity-implanted region 10 may be higher than that of the bitline layer 2.

Figure 92:
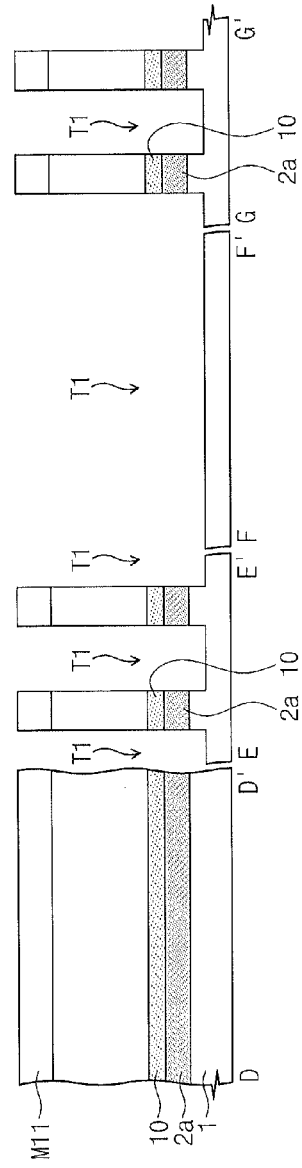

Referring to FIG. 92, an eleventh mask pattern 11 is formed on the substrate 1. The eleventh mask pattern 11 includes an opening to define a first isolation layer FOX1 (3). The substrate 1 is patterned using the eleventh mask pattern 11 as an etch mask to form first trenches T1 in the substrate 1. The first trenches T1 may be a plurality of line-type grooves extending in the first direction X. A bottom surface of the trench T1 is lower than that of the bitline layer 2. Due to the formation of the first trenches T1, the bitline layer 2 is divided into a plurality of parallel bitlines 2a extending in the first direction X.

Figure 93:
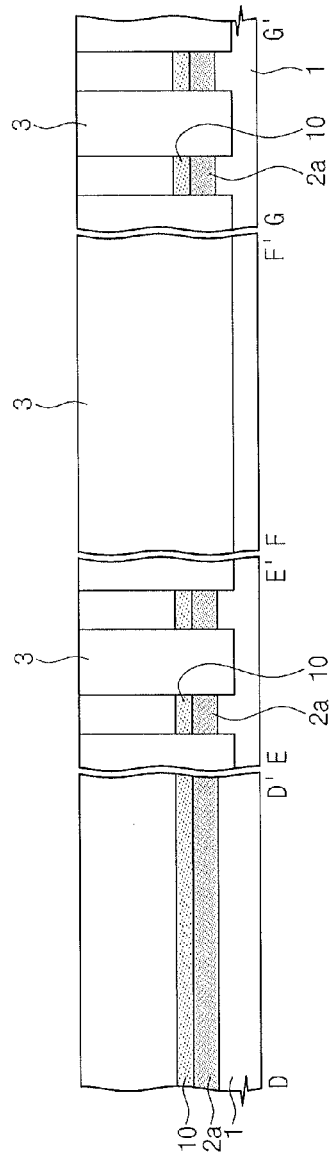

Referring to FIG. 93, the trenches T1 are filled with an insulating layer to form first isolation layers 3. The first isolation layers 3 may be in the form of lines extending between the bitlines 2a in the first direction X.

Figure 94:
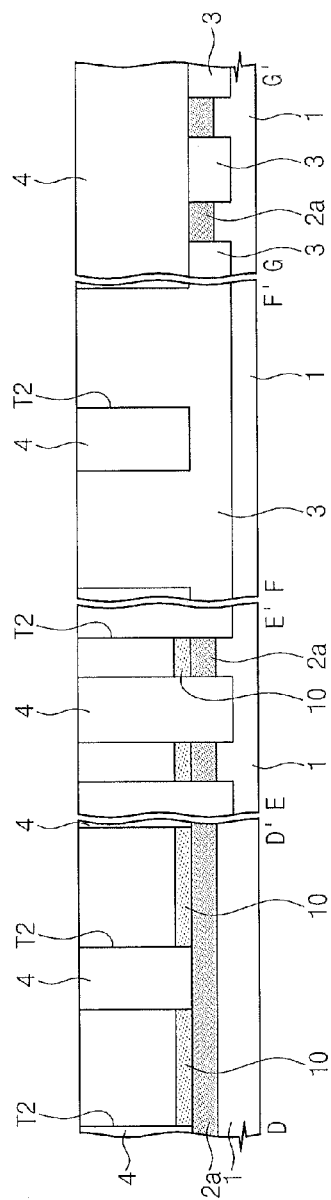

Referring to FIG. 94, the substrate 1 and the first device isolation layers 3 are patterned in the form of lines extending in a second direction Y to form second trenches T2. The second trench T2 may be formed to expose a top surface of the bitline 2a. The second trenches T2 are filled with an insulating layer to form second isolation layers 4. The second isolation layers 4 may be in the form of parallel lines extending in the second direction Y.

Referring to FIG. 89, as subsequent process, sub-gates SG1 and SG2 may be formed in the same (or similar) manner as in eighth embodiments. During the step in FIG. 87, the fourth groove 43 is filled with a third isolation layer 37b without forming a bitline contact 39a in the fourth groove 43. A semiconductor device shown in FIG. 89 may be formed by forming capacitors CA and other structures.

Other operations may be the same (or similar) as in eighth embodiments.

Embodiment 10

Figure 95:
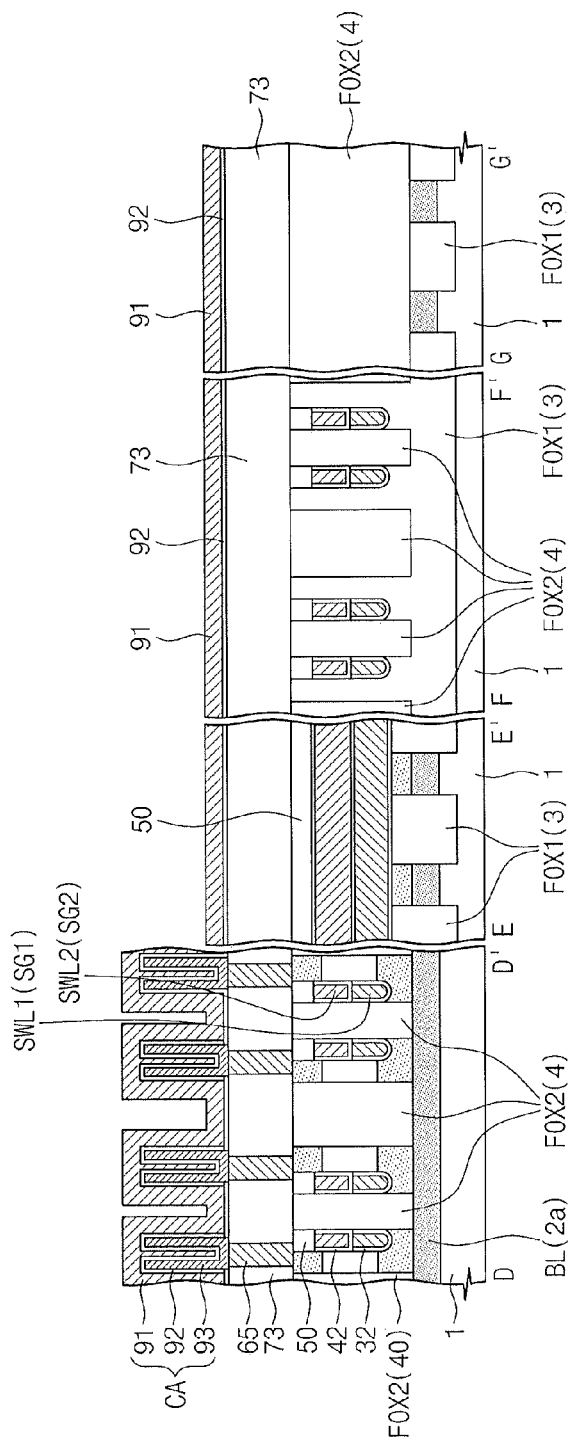
FIG. 95 is a cross-sectional view taken along lines D-D', E-E', F-F', and G-G' in FIG. 88 according to tenth embodiments of inventive concepts.

FIG. 95 is a cross-sectional view taken along lines D-D', E-E', F-F', and G-G' in FIG. 88 according to tenth embodiments of inventive concepts.

Referring to FIG. 95, a second isolation layer 4 is provided at a positions of the third isolation layer 37b in ninth embodiments. A first gate insulator 32 is provided between a first sub-gate SG1 and a substrate 1 and between the first sub-gate SG1 and the second isolation layer 4. A second gate insulator 42 is provided between a second sub-gate SG2 and the substrate 1, between the second sub-gate SG2 and the first sub-gate SG1, and between the second sub-gate SG2 and the second isolation layer 4. A first capping pattern 50 is disposed on the second sub-gate SG2. Other configurations and operations may be the same (or similar) as in ninth embodiments.

The semiconductor device shown in FIG. 95 may be formed by applying ninth embodiments and first embodiments. That is, similar to ninth embodiments, a first isolation layer 3 and a second isolation layer 4 are formed to define a vertical active channel region VC and, similar to first embodiments, sub-gates SG1 and SG2 are formed.

Other forming operations may be the same (or similar) as in first and ninth embodiments.

Embodiment 11

Figure 96:
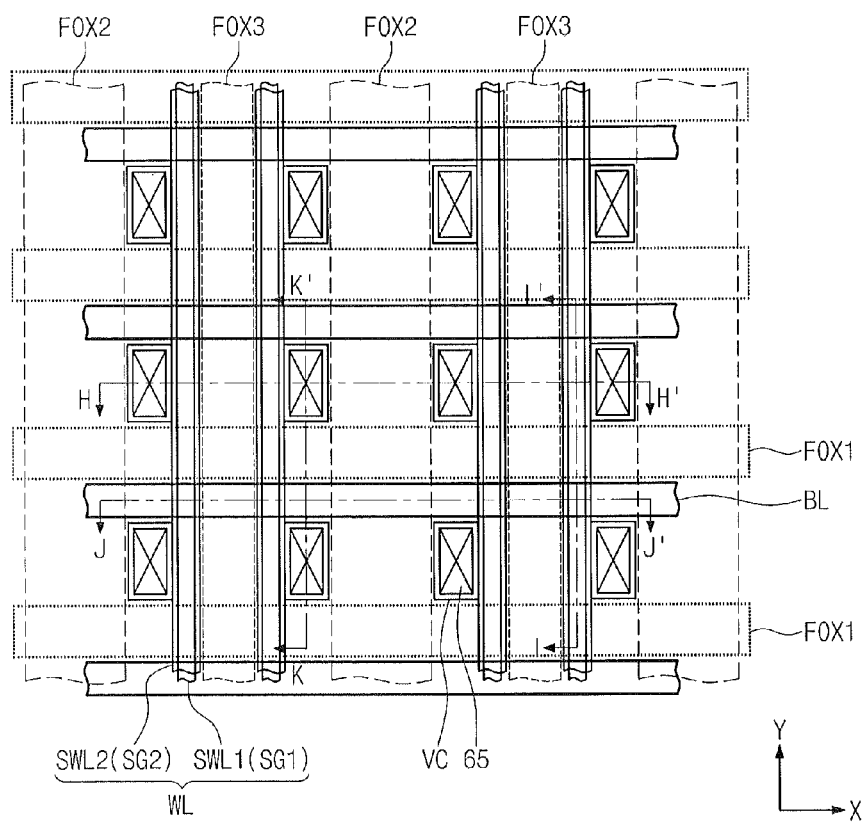
FIG. 96 is a top plan view of a semiconductor device according to eleventh embodiments of inventive concepts.
Figure 97:
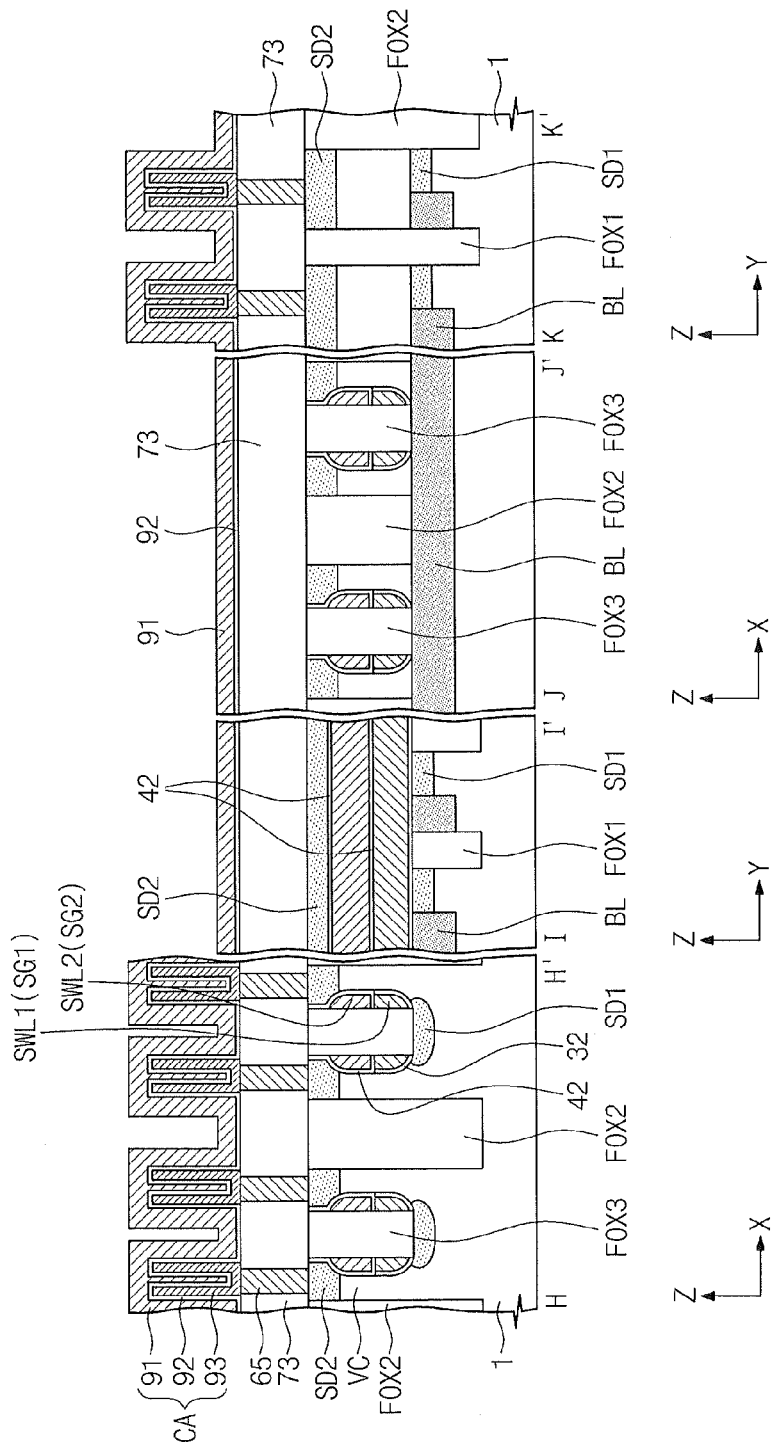
FIG. 97 shows cross-sectional views taken along lines H-H', I-I', J-J', and K-K' in FIG. 96.
Figure 98:
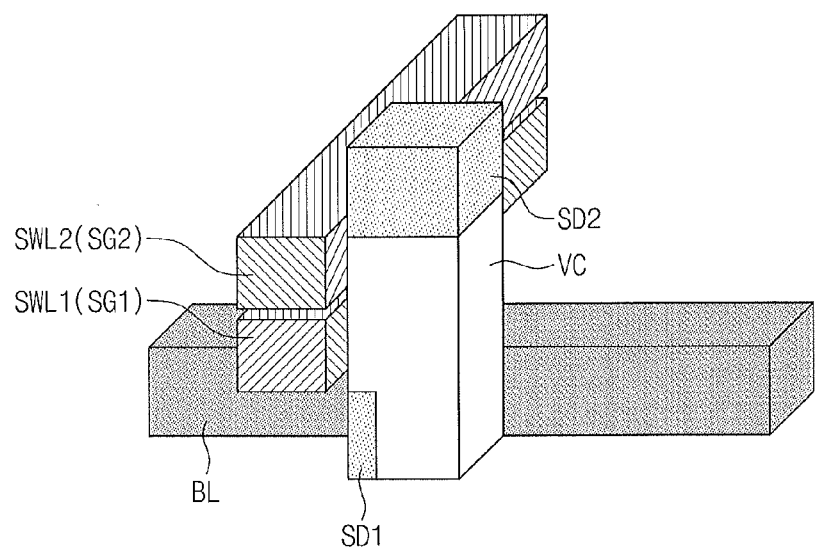
FIG. 98 is a perspective view of a unit cell transistor in a semiconductor device according to the eleventh embodiments of inventive concepts.

FIG. 96 is a top plan view of a semiconductor device according to eleventh embodiments of inventive concepts, and FIG. 97 shows cross-sectional views taken along lines H-H', I-I', J-J', and K-K' in FIG. 96. FIG. 98 is a perspective view of a unit cell transistor in a semiconductor device according to eleventh embodiments of inventive concepts.

Referring to FIGS. 96 to 98, lower end of a vertical active channel region VC is connected to substrate 1 to reduce a body floating phenomena and/or emission of electron holes. A bitline BL may run in a first direction X while coming in contact with a side surface of a first impurity-implanted region SD1. A bottom surface of the first impurity-implanted region SD1 is in contact with the substrate 1. Other configurations and operations may be the same (or similar) as in ninth embodiment.

Semiconductor devices described in the foregoing embodiments may be packaged as one of various types to be subsequently embedded. For example, the semiconductor devices may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack Package (TQFP), System In Package (SIP), Multi Chip Package (MCP), Wafer-level Fabricated Package (WFP), and/or Wafer-Level Processed Stack Package (WSP).

A package, on which a semiconductor device according to embodiments of inventive concepts is mounted may further include a controller configured to control the semiconductor device and/or a logic element thereof.

Figure 99:
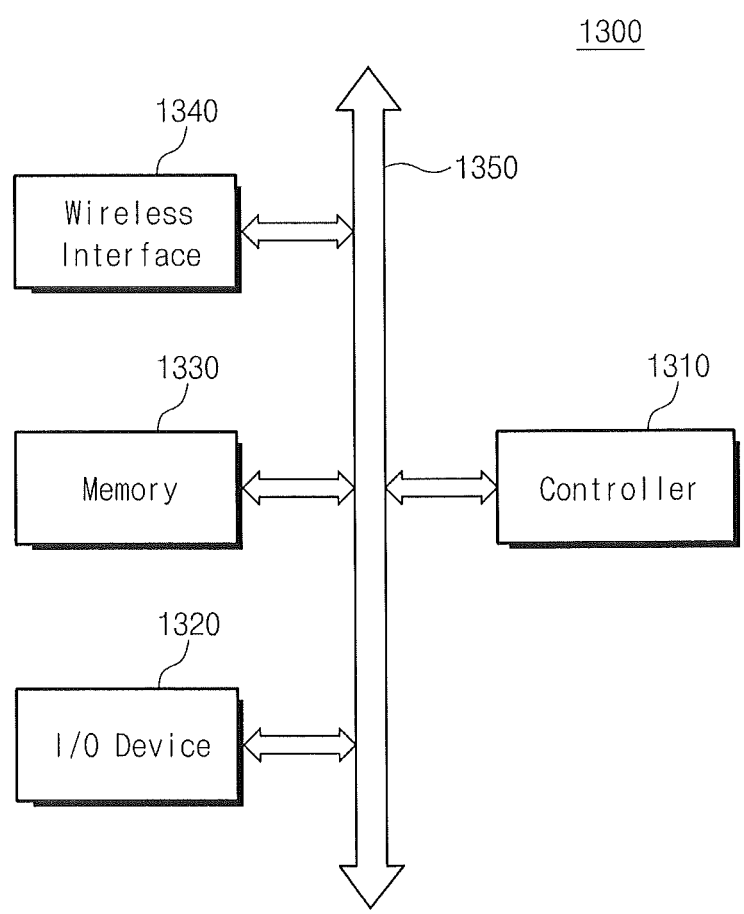
FIG. 99 is a block diagram of an electronic device including a semiconductor device according to some inventive concepts.

FIG. 99 is a block diagram of an electronic device/system including a semiconductor device according to embodiments of inventive concepts.

Referring to FIG. 99, an electronic device 1300 according to embodiments of inventive concepts may be a personal digital assistant (PDA), a laptop computer, a portable computer, a web tablet, a wireless phone, a mobile phone, a digital music player, and/or a wireless/wired electronic device, and/or a complex electronic device/system including at least two thereof. The electronic device/system 1300 may include a controller 1310, an input/output device (I/O device) 1320 (e.g., including) a keypad, a keyboard, and/or a display), a memory 1330, and/or a wireless interface 1340, which may be connected to each other through a bus 1350. The controller 1310 may include, for example, at least one of a microprocessor, a digital signal processor, a microcontroller, etc. For example, the memory 1330 may be used to store commands executed by the controller 1310. The memory 1330 may also be used to store user data. The memory 1330 may include semiconductor devices including at least one of vertical channel transistors according to embodiments of inventive concepts. The electronic device 1300 may use the wireless interface 1340 to transmit and/or receive messages to and/or from a wireless communication network with a wireless radio frequency (RF) signal. The wireless interface 1340 may include, for example, an antenna and/or a wireless transceiver. The electronic device 300 may be used for example, in a communication interface protocol such as third generation communication system, e.g., CDMA, GSM, NADC, E-TDMA, WCDMA, and/or CDMA2000.

Figure 100:
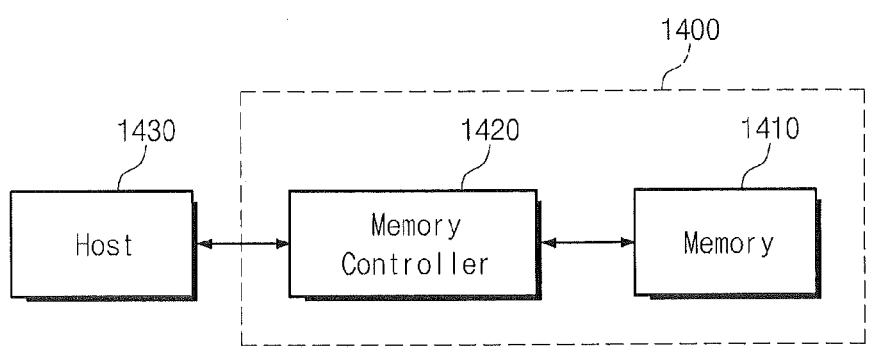
FIG. 100 is a block diagram of a memory system including a semiconductor device according to inventive concepts.

FIG. 100 is a block diagram of a memory system including a semiconductor device according to embodiments inventive concepts.

Referring to FIG. 100, semiconductor devices according to embodiments of inventive concepts may be used to implement a memory system 1400. The memory system 1400 may include a memory 1410 configured to store mass data and a memory controller 1420. The memory controller 1420 controls the memory device 1410 to read and/or write stored data from/to the memory device 1410. The memory controller 1420 may constitute an address to map table for mapping an address provided from the host 1430 (e.g., a mobile device or a computer system) into a physical address of the memory device 1410. The memory 1410 includes at least one semiconductor device according to embodiments of inventive concepts.

According to semiconductor devices described above, a gate electrode may include a first sub-gate electrode and a second sub-gate electrode to independently control a channel region. The first and second sub-gate electrodes are applied with different voltages to reduce generation of leakage current due to the GIDL phenomenon and to increase on-current. In addition, a width of an impurity-implanted region may be is reduced to relatively increase a width of a sub-gate pattern. Thus, subthreshold characteristics can be improved and a threshold voltage distribution can be reduced. Moreover, a relatively wide pad may be formed on the impurity-implanted region to more easily from contacts and to reduce contact resistance.

While inventive concepts have been particularly shown and described with reference to exemplary embodiments thereof, it will be apparent to those of ordinary skill in the art that various changes in form and detail may be made therein without departing from the spirit and scope of inventive concepts as defined by the following claims.

That which is claimed is:

1. A semiconductor device comprising:
    a semiconductor substrate including first and second spaced apart source/drain regions defining a channel region therebetween;
    a control gate structure on the channel region between the first and second spaced apart source/drain regions, wherein the control gate structure includes a first gate electrode on the channel region adjacent the first source/drain region, and a second gate electrode on the channel region adjacent the second source/drain region, wherein the first and second gate electrodes are electrically isolated;
    a bit line coupled to the first source/drain region; and
    a memory storage element coupled to the second source/drain region.

2. The semiconductor device of claim 1 wherein at least a portion of the first gate electrode on the channel region is spaced apart from the second source/drain region, and wherein at least a portion of the second gate electrode on the channel region is spaced apart from the first source/drain region.

3. The semiconductor device of claim 1 wherein the control gate structure further includes a gate insulator structure between the first gate electrode and the channel region and between the second gate electrode and the channel region.

4. The semiconductor device of claim 3 wherein the gate insulator structure further includes,
    a first gate insulator between the first gate electrode and the channel region, and
    a second gate insulator between the second gate electrode and the channel region,
    wherein at least one of the first and second gate insulators extends between the first and second gate electrodes.

5. The semiconductor device of claim 1 wherein the semiconductor substrate further includes third and fourth spaced apart source/drain regions defining a second channel therebetween and an isolation layer separating the first and second channel regions, and wherein the first and second gate electrodes extend from the first channel region across the isolation layer to the second channel region.

6. A semiconductor device comprising:
    a semiconductor substrate including first and second spaced apart source/drain regions defining a first channel region therebetween, wherein the semiconductor substrate further includes a third source/drain region spaced apart from the first source/drain region and defining a second channel region between the first and third source/drain regions;
    a first control gate structure on the first channel region between the first and second spaced apart source/drain regions, wherein the first control gate structure includes a first gate electrode on the first channel region adjacent the first source/drain region, and a second gate electrode on the first channel region adjacent the second source/drain region, wherein the first and second gate electrodes are electrically isolated; and
    a second control gate structure on the second channel region between the first and third spaced apart source/drain regions, wherein the second control gate structure includes a third gate electrode on the second channel region adjacent the first source/drain region, and a fourth gate electrode on the second channel region adjacent the third source/drain region, wherein the third and fourth gate electrodes are electrically isolated.

7. The semiconductor device of claim 6 further comprising:
    a bit line coupled to the first source/drain region; and
    a memory storage element coupled to the second source/drain region.

8. The semiconductor device of claim 1 wherein the first and second source/drain regions and the channel region are provided on a planar surface of the semiconductor substrate.

9. The semiconductor device of claim 1 wherein the semiconductor substrate includes a trench in a surface thereof, wherein the first and second gate electrodes are provided adjacent a sidewall of the trench, and wherein the second gate electrode is between the first gate electrode and the surface of the semiconductor substrate.

10. A semiconductor device comprising:
    a semiconductor substrate including first and second spaced apart source/drain regions defining a channel region therebetween, wherein the semiconductor substrate includes a trench in a surface thereof, and wherein the first and second source/drain regions are provided at the surface of the semiconductor substrate on opposite sides of the trench; and
    a control gate structure on the channel region between the first and second spaced apart source/drain regions, wherein the control gate structure includes a first gate electrode on the channel region adjacent the first source/drain region, and a second gate electrode on the channel region adjacent the second source/drain region, wherein the first and second gate electrodes are electrically isolated, wherein the first and second gate electrodes are provided adjacent a sidewall of the trench, and wherein the second gate electrode is between the first gate electrode and the surface of the semiconductor substrate;
    wherein the second gate electrode is between portions of the first and second source/drain regions, wherein the first gate electrode is adjacent portions of the first source/drain region, and wherein the first gate electrode is spaced apart from the second source/drain region.

11. The semiconductor device of claim 10 wherein a depth that the first source/drain region extends into the semiconductor substrate is greater than a depth that the second source/drain region extends into the substrate.

12. The semiconductor device of claim 9 wherein the trench includes first and second sidewalls and a bottom surface between the first and second sidewalls, wherein the first source/drain region is adjacent the bottom surface of the trench, wherein the second source/drain region is adjacent the first sidewall, and wherein portions of each of the first and second gate electrodes are provided in the trench along the first sidewall between the first and second source/drain electrodes.

13. A semiconductor device comprising:
- a semiconductor substrate including first and second spaced apart source/drain regions defining a first channel region therebetween, wherein the semiconductor substrate includes a trench in a surface thereof, wherein the trench includes first and second sidewalls and a bottom surface between the first and second sidewalls, wherein the first source/drain region is adjacent the bottom surface of the trench, wherein the second source/drain region is adjacent the first sidewall, wherein the semiconductor substrate further includes a third source/drain region adjacent the second sidewall of the trench and spaced apart from the first source/drain region, and wherein the first and third source/drain regions define a second channel region therebetween;
- a first control gate structure on the first channel region between the first and second spaced apart source/drain regions, wherein the first control gate structure includes a first gate electrode on the first channel region adjacent the first source/drain region, and a second gate electrode on the first channel region adjacent the second source/drain region, wherein the first and second gate electrodes are electrically isolated, wherein the first and second gate electrodes are provided adjacent the first sidewall of the trench, wherein the second gate electrode is between the first gate electrode and the surface of the semiconductor substrate, and wherein portions of each of the first and second gate electrodes are provided in the trench along the first sidewall between the first and second source/drain electrodes; and
- a second control gate structure in the trench on the second channel region between the first and third spaced apart source/drain regions, wherein the second control gate structure includes a third gate electrode on the second channel region adjacent the first source/drain region, and a fourth gate electrode on the second channel region adjacent the third source/drain region, wherein the third and fourth gate electrodes are electrically isolated.

14. The semiconductor device of claim 13 further comprising:
- a bit line contact coupled to the first source/drain region, wherein the bit line contact extends through the trench between the first and third gate electrodes and between the second and fourth gate electrodes;
- a bit line electrically coupled to the first source/drain region through the bit line contact;
- a first memory storage element coupled to the second source/drain region; and
- a second memory storage element coupled to the third source/drain region.

15. The semiconductor device of claim 9 wherein at least one of the first and/or second source/drain regions has a width in a direction parallel to the surface of the substrate that is in the range of about 5 nanometers to about 20 nanometers.

16. The semiconductor device of claim 9 wherein the second source/drain region has a first width in a direction parallel to the surface of the substrate, the semiconductor device further comprising:
- a conductive pad on the second source/drain region and electrically coupled thereto, wherein the conductive pad has a second width in the direction parallel to the surface of the substrate, wherein the second width is greater than the first width.

17. The semiconductor device of claim 1 further comprising:
- a controller electrically coupled to the first and second gate electrodes, wherein the controller is configured to apply different first and second voltages to the first and second gate electrodes to block electrical current flow through the channel region between the first and second source/drain regions.

18. The semiconductor device of claim 17 wherein the second voltage is greater than the first voltage.

19. The semiconductor device of claim 17 wherein the first voltage is less than a ground voltage of the semiconductor device and wherein the second voltage is greater than the ground voltage of the semiconductor device.

* * * * *